United States Patent
Matsuda et al.

(10) Patent No.: US 11,469,735 B2
(45) Date of Patent: Oct. 11, 2022

(54) ACOUSTIC WAVE DEVICE, FILTER, AND MULTIPLEXER

(71) Applicant: TAIYO YUDEN CO., LTD., Tokyo (JP)

(72) Inventors: Takashi Matsuda, Tokyo (JP); Yoshio Satoh, Tokyo (JP); Mamoru Ishida, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 307 days.

(21) Appl. No.: 16/688,446

(22) Filed: Nov. 19, 2019

(65) Prior Publication Data
US 2020/0169245 A1 May 28, 2020

(30) Foreign Application Priority Data

Nov. 28, 2018 (JP) .............................. JP2018-222055
Jun. 17, 2019 (JP) .............................. JP2019-112221

(51) Int. Cl.
*H03H 9/13* (2006.01)
*H03H 9/02* (2006.01)
(Continued)

(52) U.S. Cl.
CPC ........ *H03H 9/132* (2013.01); *H03H 9/02039* (2013.01); *H03H 9/177* (2013.01); *H03H 9/568* (2013.01)

(58) Field of Classification Search
CPC ........... H03H 9/02015; H03H 9/02031; H03H 9/02039; H03H 9/02062; H03H 9/02118;
(Continued)

(56) References Cited

U.S. PATENT DOCUMENTS 3,582,839 A * 6/1971 Pim .......................... H03H 9/56
  333/191
5,422,532 A * 6/1995 Inoue ................... H03H 9/0211
  310/312
(Continued)

FOREIGN PATENT DOCUMENTS

JP 61-79316 A 4/1986
JP 62-109419 A 5/1987
(Continued)

OTHER PUBLICATIONS

Tomoyoshi Tai et al., "Single Crystal FBAR with $LiNbO_3$ and $LiTaO_3$". Nov. 14-16, 2007, pp. 151-152.

*Primary Examiner* — Rakesh B Patel
(74) *Attorney, Agent, or Firm* — Stein IP, LLC

(57) ABSTRACT

An acoustic wave device includes: a piezoelectric substrate; electrodes sandwiching the piezoelectric substrate and exciting a thickness shear vibration in the piezoelectric substrate; and an edge region that is a region surrounding a center region of a resonance region, wherein a first region of the edge region is located on both sides of the center region in a first direction substantially parallel to a displacement direction of a thickness shear vibration, a second region of the edge region is located on both sides of the center region in a second direction substantially perpendicular to the first direction, a width of the second region is different from a width of the first region, and acoustic velocities of acoustic waves in the piezoelectric substrate in the first and second regions are less than that in the piezoelectric substrate in the center region.

19 Claims, 30 Drawing Sheets

(51) Int. Cl.
*H03H 9/17* (2006.01)
*H03H 9/56* (2006.01)

(58) Field of Classification Search
CPC ........ H03H 9/132; H03H 9/173; H03H 9/174; H03H 9/175; H03H 9/176; H03H 9/177; H03H 9/568; H03H 9/605
USPC .................................. 333/187, 189; 310/312
See application file for complete search history.

(56) References Cited

U.S. PATENT DOCUMENTS

| | | | | |
|---|---|---|---|---|
| 5,903,087 A | * | 5/1999 | Mattson | H03H 9/132 |
| | | | | 310/365 |
| 6,750,593 B2 | | 6/2004 | Iwata | 310/321 |
| 6,812,619 B1 | * | 11/2004 | Kaitila | H03H 9/132 |
| | | | | 310/320 |
| 7,276,994 B2 | * | 10/2007 | Takeuchi | H03H 9/0095 |
| | | | | 310/346 |
| 7,301,258 B2 | * | 11/2007 | Tanaka | H03H 9/02086 |
| | | | | 310/320 |
| 7,327,209 B2 | * | 2/2008 | Fujii | H03H 9/02133 |
| | | | | 333/133 |
| 7,902,721 B2 | * | 3/2011 | Maeda | H03H 9/132 |
| | | | | 310/320 |
| 9,356,573 B2 | * | 5/2016 | Yokoyama | H03H 9/02118 |
| 9,450,565 B2 | * | 9/2016 | Tajic | H03H 9/175 |
| 2002/0014808 A1 | * | 2/2002 | Misu | H03H 9/564 |
| | | | | 310/312 |
| 2004/0124953 A1 | | 7/2004 | Nakatani et al. | 333/193 |
| 2006/0071736 A1 | | 4/2006 | Ruby et al. | 333/187 |
| 2007/0210878 A1 | | 9/2007 | Yamaguchi et al. | 333/187 |
| 2008/0042780 A1 | * | 2/2008 | Lee | H03H 9/02118 |
| | | | | 333/187 |
| 2010/0134210 A1 | * | 6/2010 | Umeda | H03H 3/04 |
| | | | | 333/189 |
| 2012/0194034 A1 | * | 8/2012 | Miyake | H03H 9/564 |
| | | | | 310/320 |
| 2014/0203686 A1 | * | 7/2014 | Song | H03H 9/175 |
| | | | | 310/326 |
| 2016/0118958 A1 | * | 4/2016 | Burak | H03H 9/177 |
| | | | | 333/187 |
| 2018/0175275 A1 | * | 6/2018 | Nishihara | H03H 9/175 |

FOREIGN PATENT DOCUMENTS

| | | |
|---|---|---|
| JP | 2004-146861 A | 5/2004 |
| JP | 2007-6501 A | 1/2007 |
| JP | 2008-42871 A | 2/2008 |
| JP | 2016-174202 A | 9/2016 |

\* cited by examiner

MODE-A MODEL

MODE-A MODEL

MODE-B MODEL

ACOUSTIC WAVE DEVICE, FILTER, AND MULTIPLEXER

CROSS-REFERENCE TO RELATED APPLICATION

This application is based upon and claims the benefits of priorities of the prior Japanese Patent Application No. 2018-222055, filed on Nov. 28, 2018, and the prior Japanese Patent Application No. 2019-112221, filed on Jun. 17, 2019, the entire contents of which are incorporated herein by reference.

FIELD

A certain aspect of the present disclosure relates to an acoustic wave device, a filter, and a multiplexer.

BACKGROUND

Bulk acoustic wave (BAW) resonators such as film bulk acoustic resonators (FBARs) and solid mounted resonators (SMRs) have been used as filters and duplexers for high-frequency circuits of wireless terminals such as, but not limited to, mobile phones. The BAW resonator is called a piezoelectric thin film resonator. The piezoelectric thin film resonator has a structure in which a pair of electrodes is provided while a piezoelectric film is interposed between the electrodes. The resonance region where a pair of the electrodes faces each other across at least a part of the piezoelectric film is the region where the acoustic wave resonates.

There have been known ladder-type filters in which piezoelectric thin film resonators are connected in series and piezoelectric thin film resonators are connected in parallel between an input terminal and an output terminal as disclosed in, for example, Japanese Patent Application Publication No. 2004-146861 (hereinafter, referred to as Patent Document 1). In the piezoelectric thin film resonator, when the acoustic wave is reflected in the periphery of the resonance region and a standing wave is thereby formed in the resonance region, unnecessary spurious is formed. Thus, it has been known to reduce spurious by adding an additional structure to the edge region within the resonance region to control the acoustic velocity as disclosed in, for example, Japanese Patent Application Publication Nos. 2007-6501 and 2008-42871 (hereinafter, referred to as Patent Documents 2 and 3, respectively).

A polycrystalline aluminum nitride (AlN) film formed by, for example, sputtering is used for the piezoelectric film of the piezoelectric thin film resonator. In this case, the vibration in the resonance region becomes the vibration in the thickness direction of the piezoelectric film (thickness longitudinal vibration). It has been known to use a monocrystalline piezoelectric substance such as, but not limited to, lithium tantalite ($LiTaO_3$) or lithium niobate ($NbLiO_3$) for the piezoelectric film of the piezoelectric thin film resonator as disclosed in, for example, Proceedings of Symposium on Ultrasonic Electronics, Vol. 28, (2007), pp 151-152 (hereinafter, referred to as Non-Patent Document 1).

SUMMARY OF THE INVENTION

According to a first aspect of the present disclosure, there is provided an acoustic wave device including: a piezoelectric substrate; a pair of electrodes sandwiching the piezoelectric substrate and exciting a thickness shear vibration in the piezoelectric substrate; an edge region that is a region surrounding a center region of a resonance region and is in an edge portion of the resonance region, the resonance region being a region where the pair of electrodes faces each other across at least a part of the piezoelectric substrate; a first region that is a part of the edge region and is located on both sides of the center region in a first direction that is substantially parallel to a displacement direction of a thickness shear vibration that is a primary mode in the piezoelectric substrate, an acoustic velocity of an acoustic wave in the piezoelectric substrate in the first region being less than an acoustic velocity of an acoustic wave in the piezoelectric substrate in the center region; and a second region that is a part of the edge region and is located on both sides of the center region in a second direction substantially perpendicular to the first direction, a width in the second direction of the second region being different from a width in the first direction of the first region, an acoustic velocity of an acoustic wave in the piezoelectric substrate in the second region being less than the acoustic velocity of the acoustic wave in the piezoelectric substrate in the center region.

According to a second aspect of the present disclosure, there is provided an acoustic wave device including: a piezoelectric substrate; a pair of electrodes sandwiching the piezoelectric substrate and exciting a thickness shear vibration in the piezoelectric substrate; an edge region that is a region surrounding a center region of a resonance region and is in an edge portion of the resonance region, the resonance region being a region where the pair of electrodes faces each other across at least a part of the piezoelectric substrate; a first region that is a part of the edge region and is located on both sides of the center region in a first direction that is substantially parallel to a displacement direction of a thickness shear vibration that is a primary mode in the piezoelectric substrate, an acoustic velocity of an acoustic wave in the piezoelectric substrate in the first region being less than an acoustic velocity of an acoustic wave in the piezoelectric substrate in the center region; and a second region that is a part of the edge region and is located on both sides of the center region in a second direction substantially perpendicular to the first direction, an acoustic velocity of an acoustic wave in the piezoelectric substrate in the second region being less than the acoustic velocity of the acoustic wave in the piezoelectric substrate in the center region and being different from the acoustic velocity of the acoustic wave in the piezoelectric substrate in the first region.

According to a third aspect of the present disclosure, there is provided an acoustic wave device including: a piezoelectric substrate that is an X-cut lithium tantalite substrate; a pair of electrodes sandwiching the piezoelectric substrate and exciting a thickness shear vibration in the piezoelectric substrate; an additional film that surrounds a center region of a resonance region and is located in an edge portion of the resonance region, the resonance region being a region where the pair of electrodes faces each other across at least a part of the piezoelectric substrate; a first region that is a part of the additional film and is located on both sides of the center region in a first direction that is an X direction that is obtained when Euler angles are (90°±5°, 90°±5°, 132°±5°); and a second region that is a part of the additional film and is located on both sides of the center region in a second direction that is an X direction that is obtained when Euler angles are (90°±5°, 90°±5°, 42°±5°), a width in the second direction of the second region being less than a width in the first direction of the first region.

According to a fourth aspect of the present disclosure, there is provided an acoustic wave device including: a piezoelectric substrate that is a rotated Y-cut lithium niobate substrate; a pair of electrodes sandwiching the piezoelectric substrate and exciting a thickness shear vibration in the piezoelectric substrate; an additional film that surrounds a center region of a resonance region and is located in an edge portion of the resonance region, the resonance region being a region where the pair of electrodes faces each other across at least a part of the piezoelectric substrate; a first region that is a part of the additional film and is located on both sides of the center region in a first direction that is an X direction that is obtained when Euler angles are (0°±5°, 75°±5°, 0°±5°); and a second region that is located on both sides of the center region in a second direction that is an X direction that is obtained when Euler angles are (90°±5°, 75°±5°, 0°±5°), a width in the second direction of the second region being less than a width in the first direction of the first region.

According to a fifth aspect of the present disclosure, there is provided a filter including the above acoustic wave device.

According to a sixth aspect of the present disclosure, there is provided a multiplexer including the above filter.

According to a seventh aspect of the present disclosure, there is provided an acoustic wave device including: a piezoelectric substrate; a pair of electrodes sandwiching the piezoelectric substrate and exciting a thickness shear vibration in the piezoelectric substrate; and an additional film that is not provided in a center region of a resonance region and is provided from at least a part of an edge region surrounding the center region to an outside of the resonance region, the resonance region being a region where the pair of electrodes overlaps in plan view while sandwiching at least a part of the piezoelectric substrate.

DETAILED DESCRIPTION

When a monocrystalline piezoelectric substance such as, but not limited to, lithium tantalate or lithium niobate is used for the piezoelectric film, the vibration in the resonance region is the thickness shear vibration. In the acoustic wave device using the thickness shear vibration, even when the additional structure is added in the edge region of the resonance region, spurious due to the standing wave generated in the resonance region is not sufficiently reduced.

In the acoustic wave device using the thickness shear vibration, when an additional film is added in the edge region of the resonance region, the width of the additional film decreases as the resonant frequency increases. As the width of the additional film is reduced, formation of the additional film becomes difficult.

A piezoelectric thin film resonator will be described as an example of the acoustic wave device.

Simulation 1

Figure 1A:
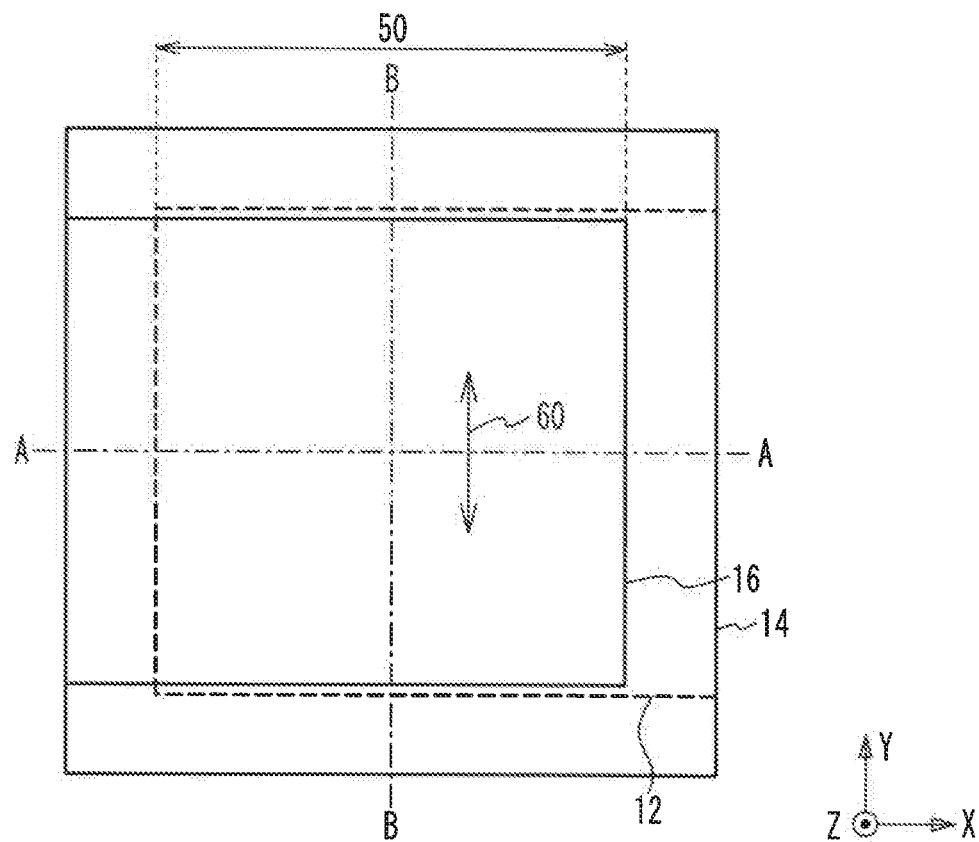
FIG. 1A is a plan view of a piezoelectric thin film resonator in accordance with a first comparative example.
Figure 1B:
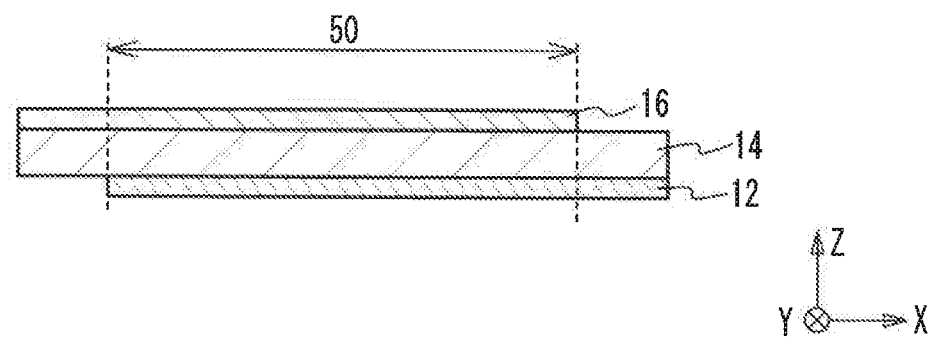
FIG. 1B is a cross-sectional view taken along line A-A in FIG. 1A.
Figure 1C:
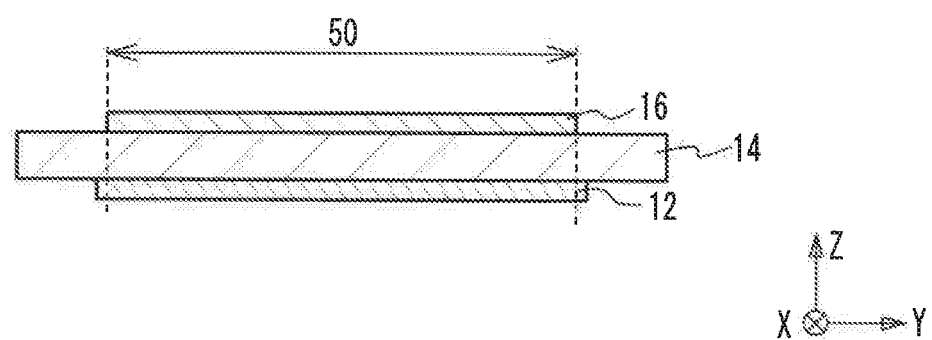
FIG. 1C is a cross-sectional view taken along line B-B in FIG. 1A.

A first comparative example was subjected to simulation. FIG. 1A is a plan view of a piezoelectric thin film resonator in accordance with the first comparative example, FIG. 1B is a cross-sectional view taken along line A-A in FIG. 1A, and FIG. 1C is a cross-sectional view taken along line B-B in FIG. 1A. The direction normal to the piezoelectric substrate 14 (the normal direction of the piezoelectric substrate 14) is defined as a Z direction, the direction of the thickness shear vibration is defined as a Y direction, and the direction that is the plane direction of the piezoelectric substrate 14 and is perpendicular to the Y direction is defined as an X direction. The X direction, the Y direction, and the Z direction do not necessarily correspond to the X-axis, the Y-axis, and the Z-axis of the crystal orientations of the piezoelectric substrate 14. The crystal orientations will be described as the "X-axis orientation", the "Y-axis orientation" and the "Z-axis orientation" to be distinguished from the "X direction", the "Y direction", and the "Z direction".

As illustrated in FIG. 1A through FIG. 1C, an upper electrode 16 is located on a piezoelectric substrate 14, and a lower electrode 12 is located under the piezoelectric substrate 14. The region where the lower electrode 12 and the upper electrode 16 face each other across at least a part of the piezoelectric substrate 14 is a resonance region 50. The lower electrode 12 and the upper electrode 16 are drive electrodes. When high frequency power applied between the lower electrode 12 and the upper electrode 16, the acoustic wave of which the displacement vibrates in the direction substantially perpendicular to the Z direction (i.e., in the shear direction with respect to the thickness) is excited in the piezoelectric substrate 14 within the resonance region 50. This vibration is called a thickness shear vibration. The direction in which the displacement of the thickness shear vibration is the greatest (the displacement direction of the thickness shear vibration) is defined as a direction 60 of the thickness shear vibration. The wavelength of the acoustic wave is approximately twice the thickness of the piezoelectric substrate 14.

The planar shape of the resonance region 50 is substantially rectangular. The rectangle has four substantially straight sides. A pair of sides facing each other among the four sides is substantially parallel to the direction 60 of the thickness shear vibration (i.e., the Y direction). The remaining pair of sides among the four sides of the rectangle is parallel to the direction substantially perpendicular to the direction 60 of the thickness shear vibration (i.e., in the X direction).

A simulation was conducted under the assumption that the piezoelectric substrate of the first comparative example was an X-cut monocrystalline tantalate substrate. The Z direction of the X-cut monocrystalline tantalate substrate is the X-axis orientation. The X-Y plane is a plane having the Y-axis and the Z-axis of the crystal orientations. The direction obtained by rotating the Y-axis orientation to the Z-axis orientation by approximately 42° is the negative X direction, and the direction perpendicular to the X direction is the Y direction. The Y direction corresponds to the direction 60 of the thickness shear vibration.

When the simulation is conducted under the assumption that the planar shape of the resonance region 50 is rectangular, large-scale computation is necessary. Thus, the simulation was conducted for a mode-A model and a mode-B model.

Figure 2A:
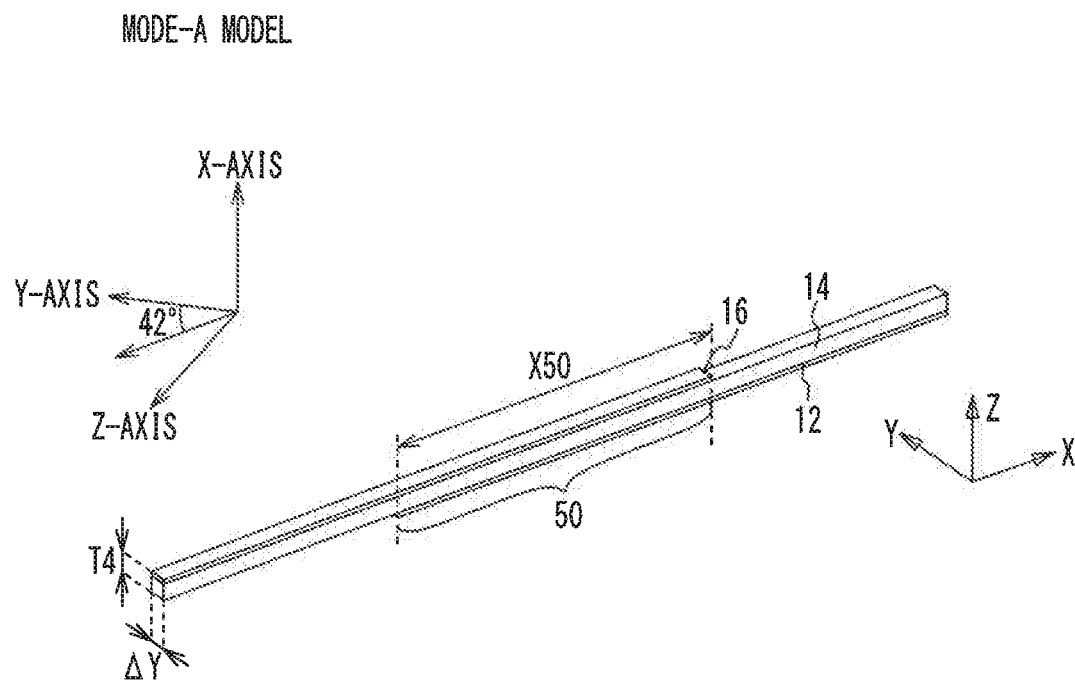
FIG. 2A is a perspective view illustrating a mode-A model in a simulation 1.
Figure 2B:
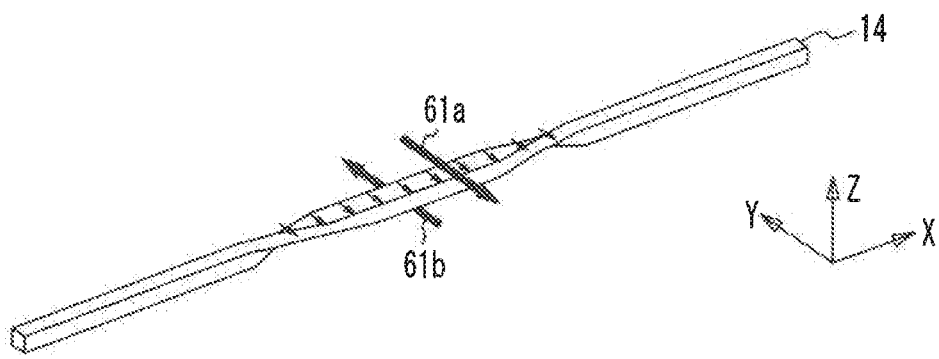
FIG. 2B is a perspective view illustrating a thickness shear vibration.
Figure 2C:
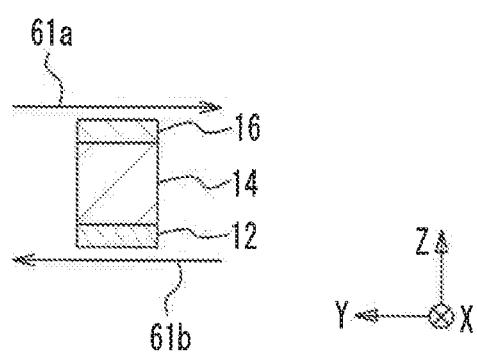
FIG. 2C is a Y-Z cross-sectional view.

FIG. 2A is a perspective view illustrating the mode-A model in the simulation 1. As illustrated in FIG. 2A, in the mode-A model, the simulation was conducted with use of the finite element method under the assumption that the piezoelectric substrate 14 had a rod shape extending in the X direction, FIG. 2B is a perspective view illustrating the thickness shear vibration, and exaggeratedly illustrates the displacement of the piezoelectric substrate 14. FIG. 2C is a Y-Z cross-sectional view. As illustrated in FIG. 2B and FIG. 2C, due to the thickness shear vibration, at a certain moment, the part closer to the upper electrode 16 of the piezoelectric substrate 14 is displaced in the negative Y direction as indicated by an arrow 61a. The part closer to the lower electrode 12 of the piezoelectric substrate 14 is displaced in the positive Y direction as indicated by an arrow 61b. After a half cycle, the piezoelectric substrate 14 is displaced in the directions opposite to the directions indicated by the arrows 61a and 61b.

Figure 3A:
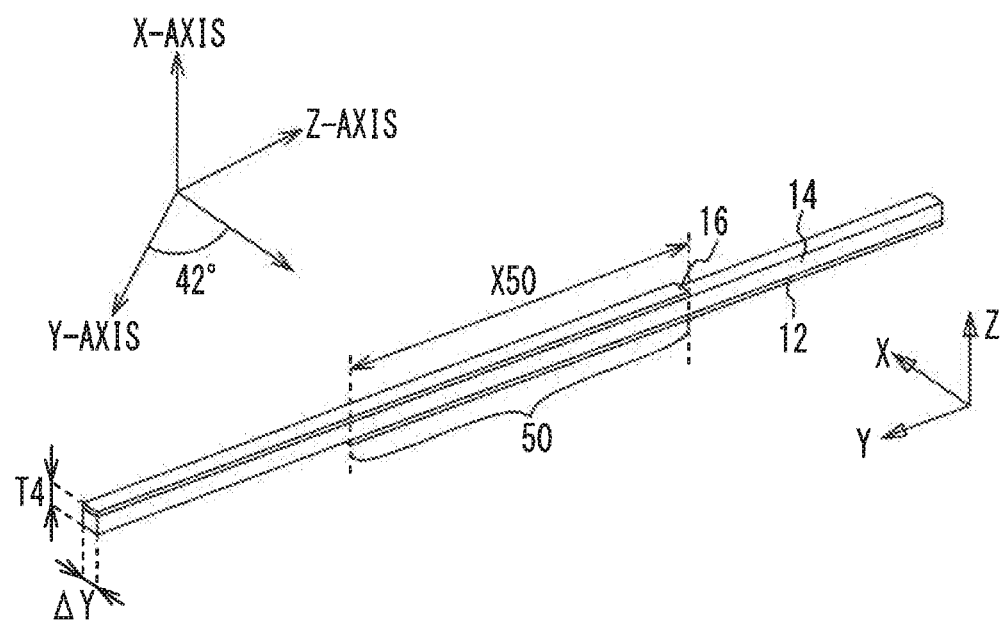
FIG. 3A is a perspective view illustrating a mode-B model in the simulation 1.

FIG. 3A is a perspective view illustrating the mode-B model in the simulation 1. As illustrated in FIG. 3A, in the mode-B model, the simulation was conducted with use of the finite element method under the assumption that the piezoelectric substrate 14 had a rod shape extending in the Y direction.

Figure 3B:
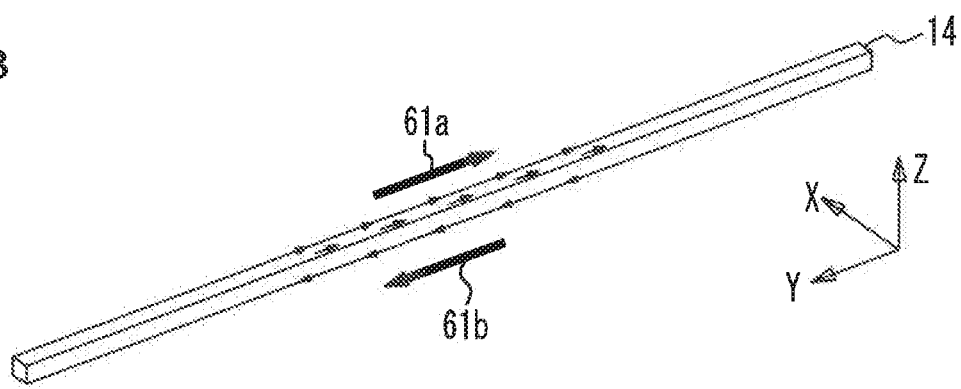
FIG. 3B is a perspective view illustrating a thickness shear vibration.

FIG. 3B is a perspective view illustrating the thickness shear vibration. As illustrated in FIG. 3B, due to the thickness shear vibration, at a certain moment, the part closer to the upper electrode 16 of the piezoelectric substrate 14 is displaced in the negative Y direction as indicated by the arrow 61a. The part closer to the lower electrode 12 of the piezoelectric substrate 14 is displaced in the positive Y direction as indicated by the arrow 61b, After a half cycle, the piezoelectric substrate 14 is displaced in the directions opposite to the directions indicated by the arrows 61a and 61b.

Simulation conditions are as follows.
Wavelength $\Delta$ of the acoustic wave: 1640 nm
Piezoelectric substrate 14: X-cut lithium tantalate substrate with a thickness T4 of $0.5\lambda=820$ nm
Lower electrode 12: Ruthenium (Ru) film with a thickness of 100 nm Upper electrode 16: Ruthenium film with a thickness of 100 nm Width X50 of the resonance region 50: 30λ=49.2 μm Width ΔY in the Y direction of the piezoelectric substrate 14: 0.5λ=820 nm It is assumed that the boundaries in the Y direction infinitely continue. The crystal orientations of the piezoelectric substrate 14 are the X-axis, the Y-axis, and the Z-axis illustrated in FIG. 2A and FIG. 3A. The negative X direction is the direction obtained by rotating the Y-axis orientation to the Z-axis orientation by 42°.

Figure 4A:
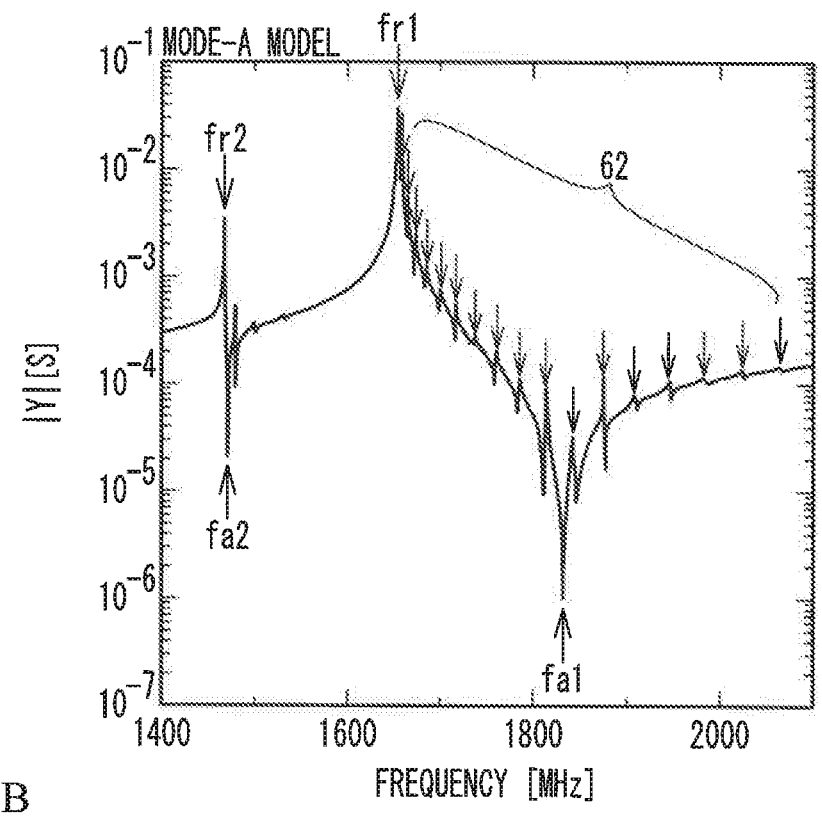
FIG. 4A and FIG. 4B illustrate admittance characteristics in the mode-A model and the mode-B model in the simulation 1, respectively.
Figure 4B:
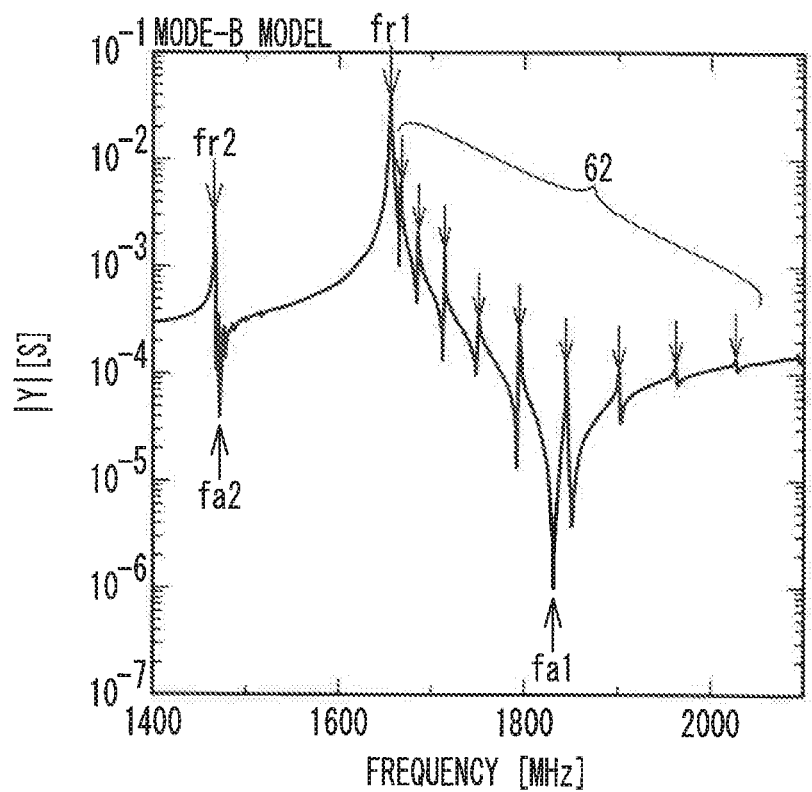

FIG. 4A and FIG. 4B illustrate admittance characteristics in the mode-A model and the mode-B model in the simulation 1, respectively. As illustrated in FIG. 4A and FIG. 4B, the resonance due to two lateral waves is observed. The resonant frequency and the antiresonant frequency of a fast lateral wave are respectively represented by fr1 and fa1. The resonant frequency and the antiresonant frequency of a slow lateral wave are respectively represented by fr2 and fa2. The difference between the resonant frequency and the antiresonant frequency corresponds to the electromechanical coupling coefficient. The slow lateral wave has a small electromechanical coupling coefficient. Thus, the fast lateral wave of which the electromechanical coupling coefficient is large will be examined.

Spuriouses 62 (indicated by vertical arrows) due to the standing wave generated in the resonance region 50 are generated between the resonant frequency fr1 and the antiresonant frequency fa1 of the fast lateral wave and at frequencies higher than the antiresonant frequency fa1. The frequency interval between the spuriouses 62 and the magnitude of the spurious 62 differ between the mode A and the mode B. As described above, the behavior of the spurious 62 differs between the mode A and the mode B.

Simulation 2

A simulation was conducted under the assumption that an additional film was provided in the edge region of the resonance region 50. When the additional film is provided in the edge region of the resonance region to make the acoustic velocity in the edge region less than the acoustic velocity in the center region, a piston mode is achieved. Thus, spurious due to the standing wave is expected to be reduced.

Figure 5A:
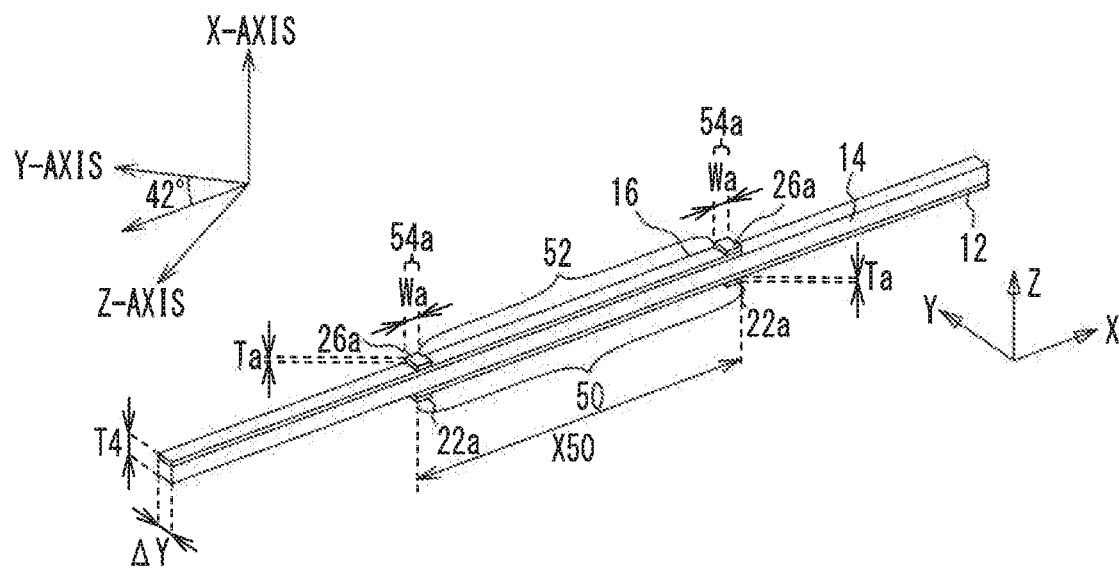
FIG. 5A and FIG. 5B are perspective views illustrating the mode-A model and the mode-B model in a simulation 2, respectively.
Figure 5B:
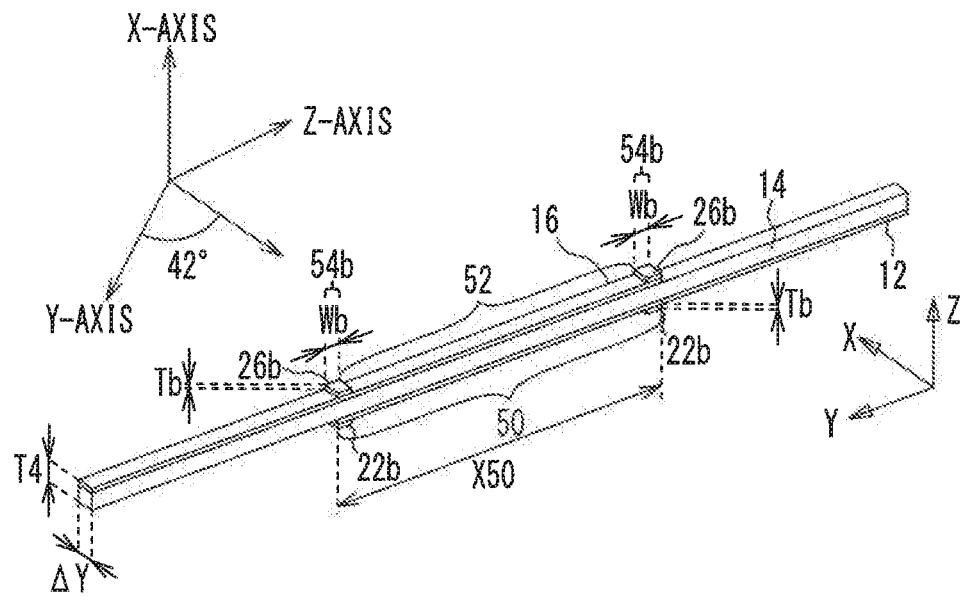

FIG. 5A and FIG. 5B are perspective views illustrating the mode-A model and the mode-B model in the simulation 2, respectively. As illustrated in FIG. 5A, in the mode-A model, it is assumed that the piezoelectric substrate 14 has a rod shape extending in the X direction. The resonance region 50 has a center region 52 and edge regions 54a located on both sides of the center region 52. In the edge region 54a, an additional film 22a is located under the lower electrode 12, and an additional film 26a is located on the upper electrode 16. The width in the X direction of the edge region 54a is represented by Wa, and the thicknesses of the additional films 22a and 26a are represented by Ta.

As illustrated in FIG. 5B, in the mode-B model, it is assumed that the piezoelectric substrate 14 has a rod shape extending in the Y direction. The resonance region 50 has the center region 52 and edge regions 54b located on both sides of the center region 52. In the edge region 54b, an additional film 22b is located under the lower electrode 12, and an additional film 26b is located on the upper electrode 16. The width in the Y direction of the edge region 54b is represented by Wb, and the thicknesses of the additional films 22b and 26b are represented by Tb.

In the mode-A model and the mode-B model, it was assumed that the additional films 22a, 22b, 26a, and 26b were ruthenium films. Other simulation conditions are the same as those of the simulation 1, and the description thereof is thus omitted.

In the mode-A model, the admittance characteristics were simulated by varying the width Wa of the edge region 54a under the assumption that the additional film had a thickness Ta of 40 nm. FIG. 6A through FIG. 6F illustrate the admittance characteristics in the mode-A model of the simulation 2. In FIG. 6A through FIG. 6F, dotted lines indicate the frequency characteristic of the magnitude |Y| of the admittance, and solid lines indicate the frequency characteristic of the real part Real(Y) of the admittance. Peaks of the resonant frequency and the antiresonant frequency of the lateral wave are observed in |Y|. In Real(Y)/|Y|, spurious is observed more clearly than that in |Y|.

Figure 6A:
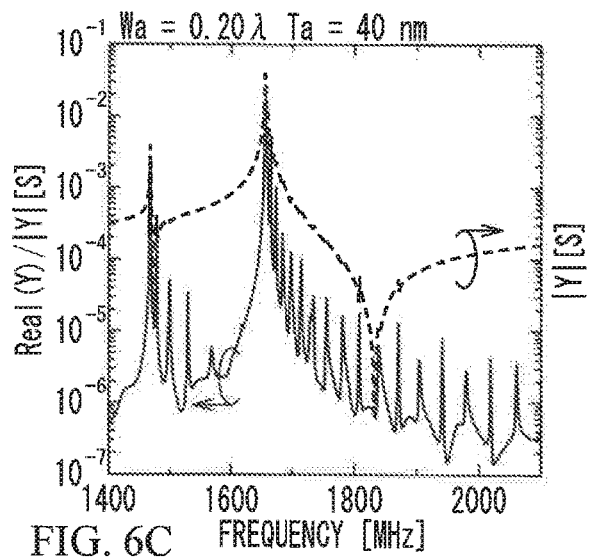
FIG. 6A through FIG. 6F illustrate admittance characteristics in the mode-A model in the simulation 2.
Figure 6B:
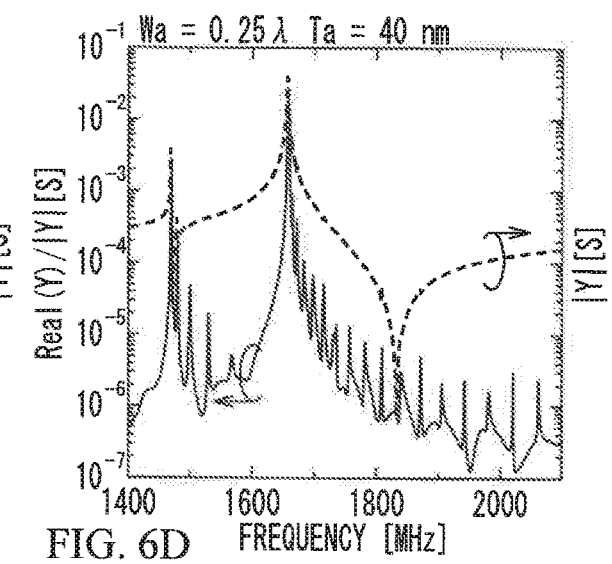
Figure 6C:
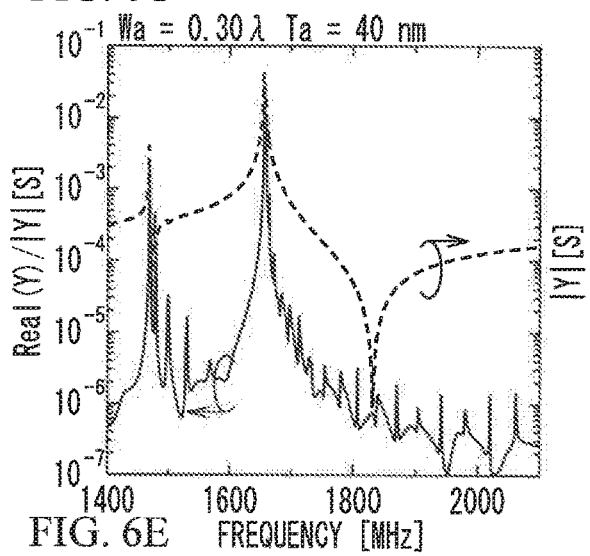
Figure 6D:
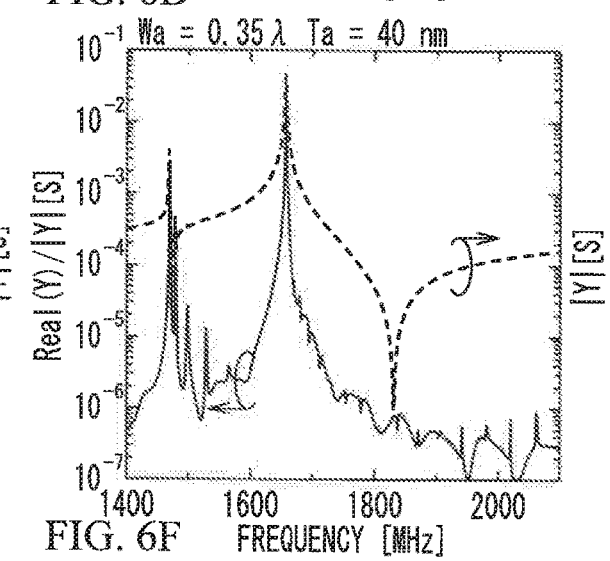
Figure 6E:
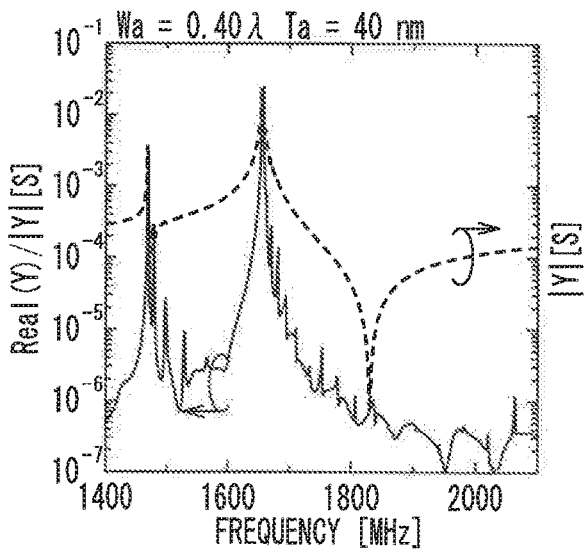
Figure 6F:
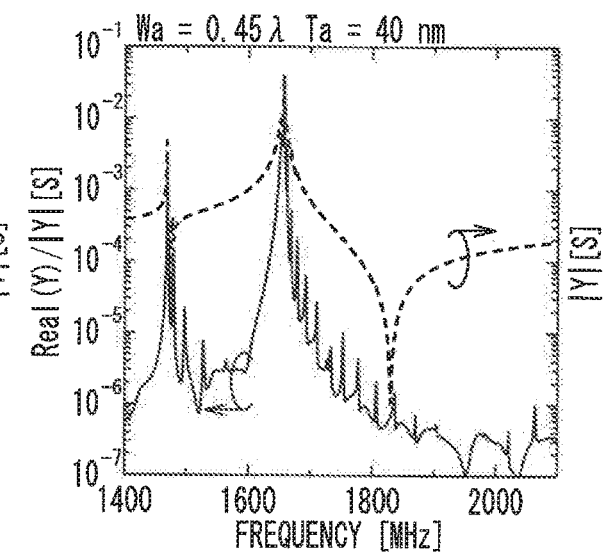

In FIG. 6A through FIG. 6F, the width Wa of the edge region 54a was set at 0.20λ, 0.25λ, 0.30λ, 0.35λ, 0.40λ, and 0.45λ, respectively. As illustrated in FIG. 6D, when Wa=0.35λ, spuriouses are most reduced.

Figure 7A:
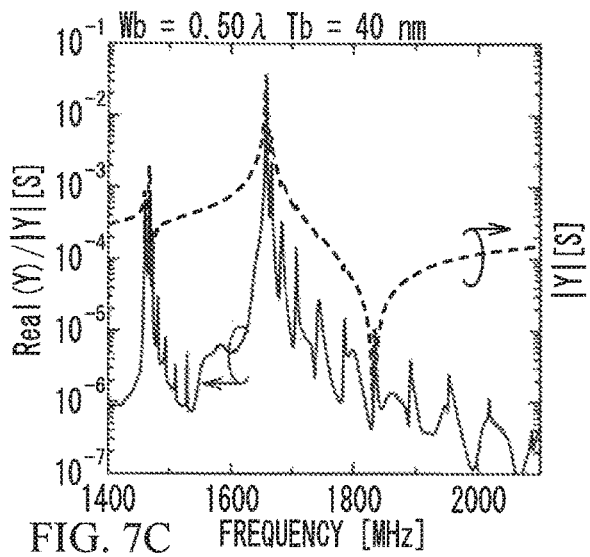
FIG. 7A through FIG. 7F illustrate admittance characteristics in the mode-B model in the simulation 2.
Figure 7B:
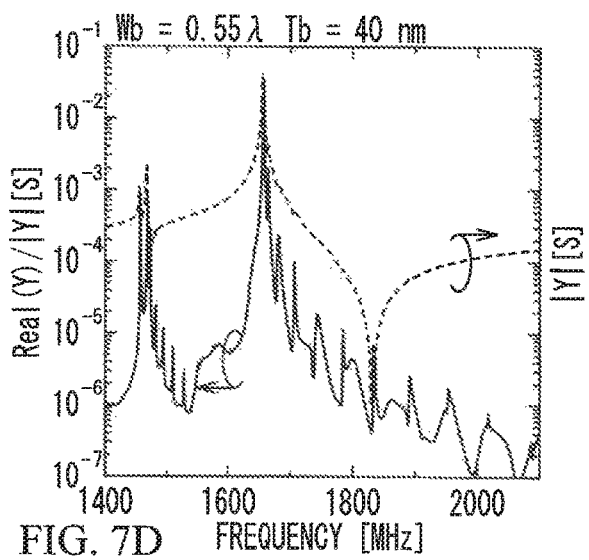
Figure 7C:
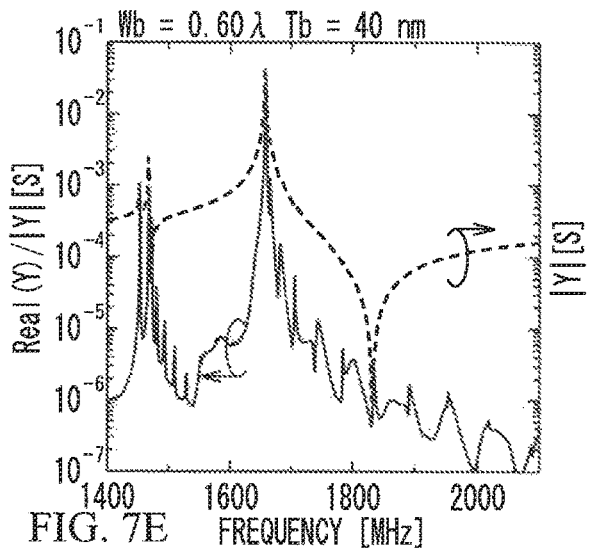
Figure 7D:
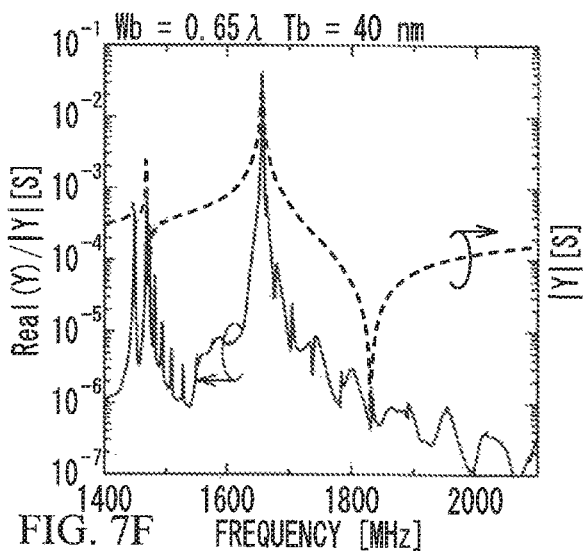
Figure 7E:
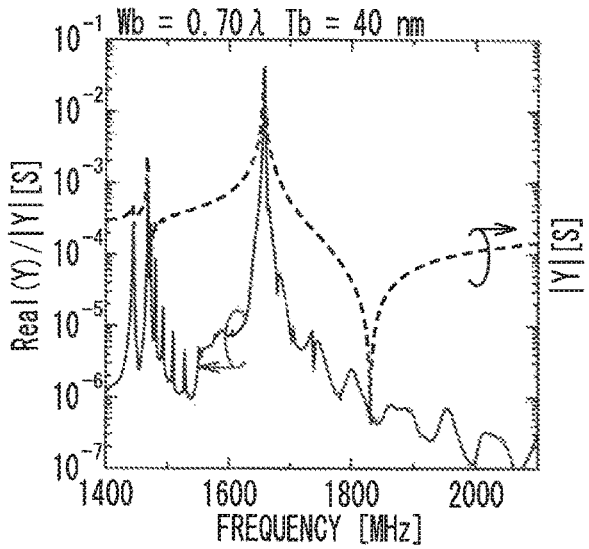
Figure 7F:
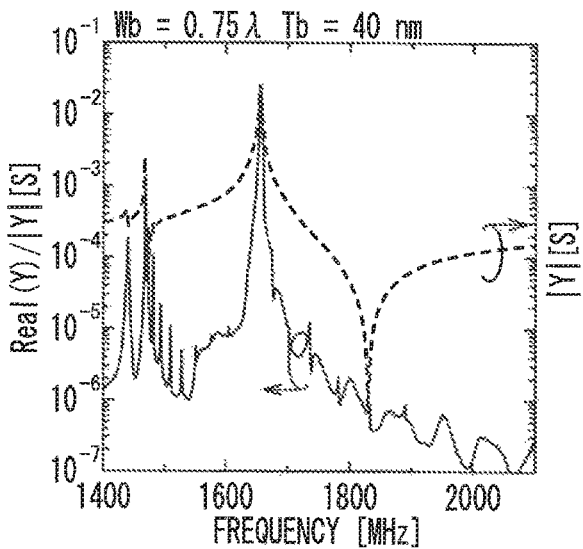

In the mode-B model, admittance characteristics were simulated by varying the width Wb of the edge region under the assumption that the additional film had a thickness Tb of 40 nm. FIG. 7A through FIG. 7F illustrate the admittance characteristics in the mode-B model of the simulation 2. In FIG. 7A through FIG. 7F, the width Wb of the edge region 54b was set at 0.50λ, 0.55λ, 0.60λ, 0.65λ, 0.70λ, and 0.75λ, respectively. As illustrated in FIG. 7E, when Wb=0.70λ, spuriouses are most reduced.

As illustrated in FIG. 6A through FIG. 7F, the width Wa of the edge region 54a with which spuriouses are reduced in the mode-A model differs from the width Wb of the edge region 54b with which spuriouses are reduced in the mode-B model.

Figure 8A:
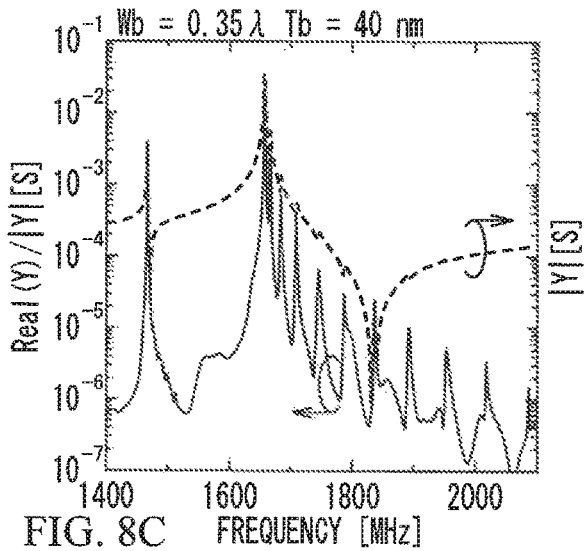
FIG. 8A through FIG. 8F illustrate admittance characteristics in the mode-B model in the simulation 2.
Figure 8B:
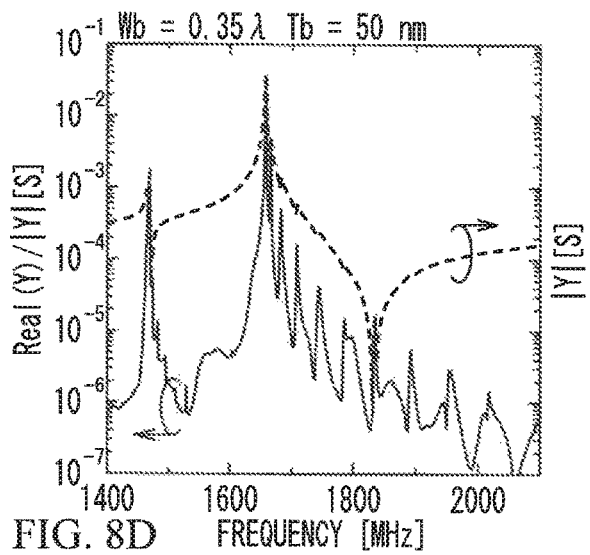
Figure 8C:
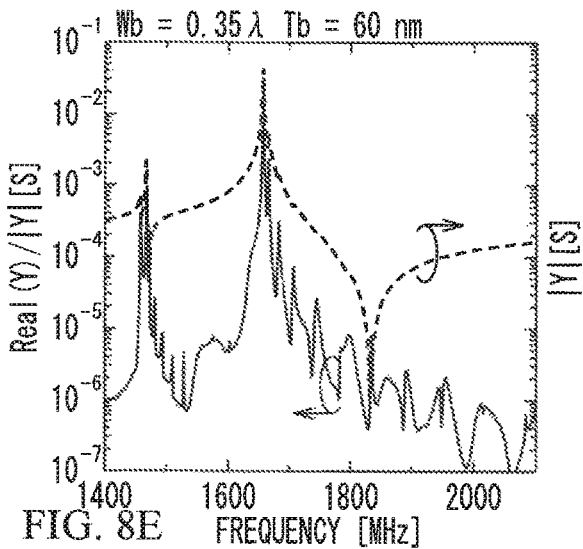
Figure 8D:
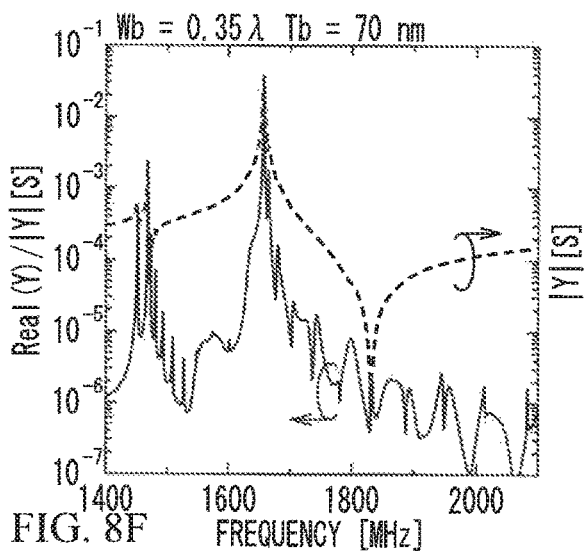
Figure 8E:
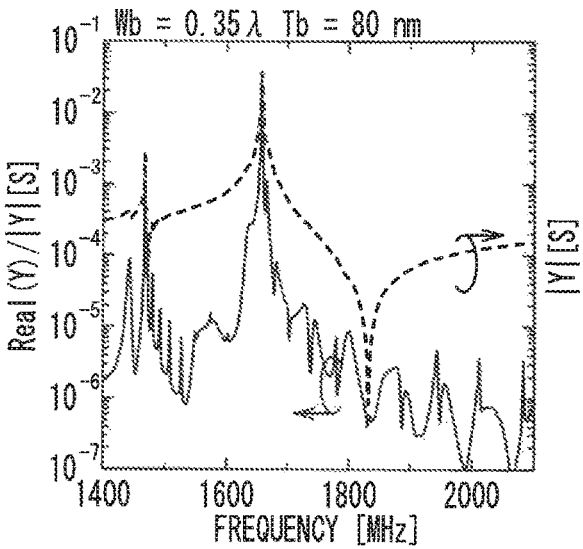
Figure 8F:
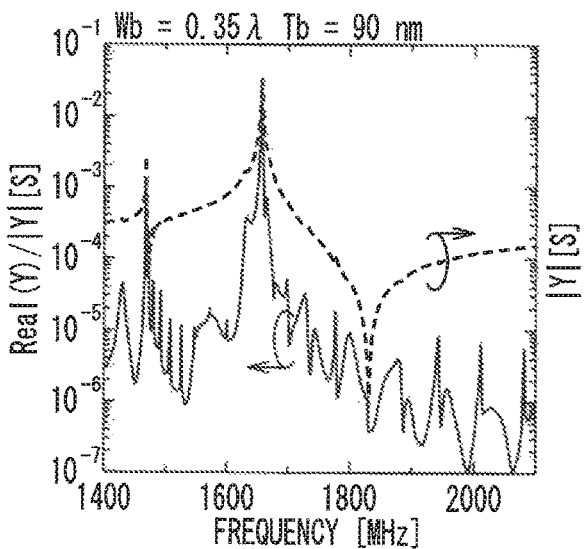

In the mode-B model, admittance characteristics were simulated by varying the thickness Tb of the additional film under the assumption that the edge region 54b had a width Wb of 0.35λ. FIG. 8A through FIG. 8F illustrate the admittance characteristics in the mode-B model of the simulation 2. In FIG. 8A through FIG. 8F, the thickness Tb of the additional film was set at 40 nm, 50 nm, 60 nm, 70 nm, 80 nm, and 90 nm, respectively. As illustrated in FIG. 8D, when Tb=70 nm, spuriouses are most reduced.

In the mode-A model, as illustrated in FIG. 6D, the optimal thickness Ta of the additional film is 40 nm when the width Wa of the edge region 54a is 0.35λ. The thickness Ta of the additional film with which spuriouses are reduced in the mode-A model differs from the thickness Tb of the additional film with which spuriouses are reduced in the mode-B model. In the simulation 2, the thicknesses Ta and Tb of the additional film are made to be different, and increasing the thickness of the additional film corresponds to reducing the acoustic velocity of the acoustic wave. Thus, it is sufficient if the acoustic velocity of the acoustic wave is made to be different between the edge regions 54a and 54b.

According to the simulation 2, in the piezoelectric thin film resonator using the thickness shear vibration, provision of the same additional structure in the edge regions 54a and 54b does not reduce spurious sufficiently. Thus, the additional structures in the edge regions 54a and 54b are made to be different. This configuration reduces spurious. Based on the above finding, an embodiment will be described.

First Embodiment

Figure 9A:
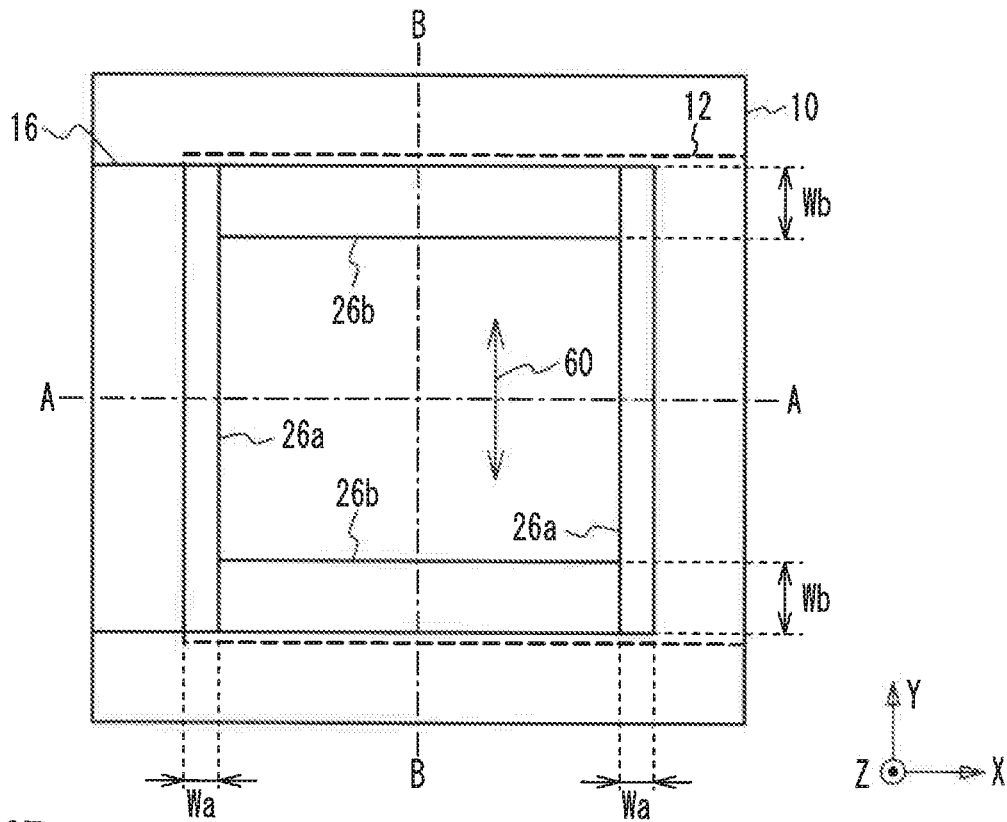
FIG. 9A is a plan view of a piezoelectric thin film resonator in accordance with a first embodiment.
Figure 9B:
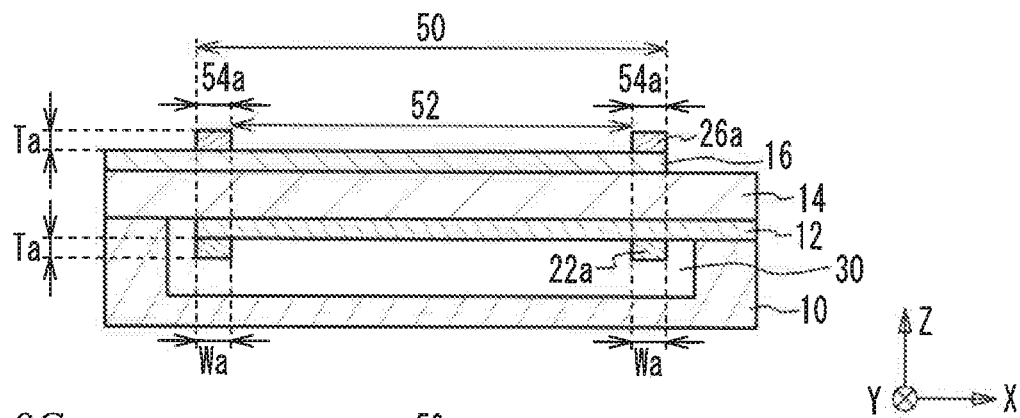
FIG. 9B is a cross-sectional view taken along line A-A in FIG. 9A.
Figure 9C:
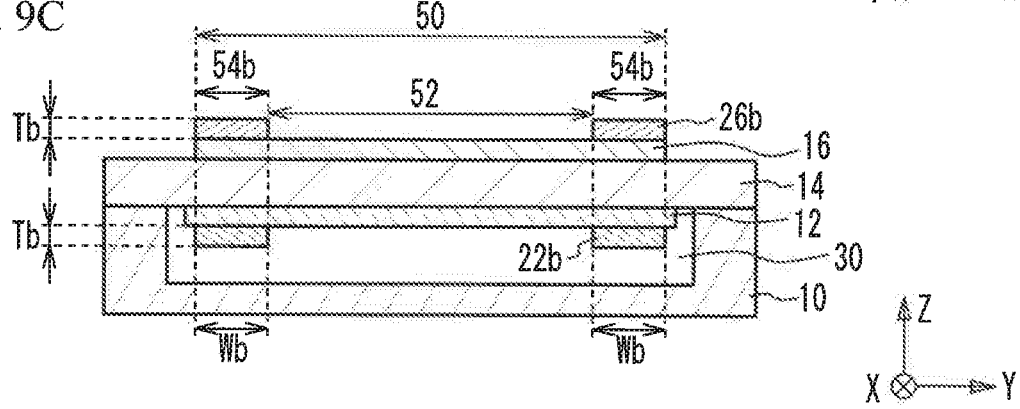
FIG. 9C is a cross-sectional view taken along line B-B in FIG. 9A.

FIG. 9A is a plan view of a piezoelectric thin film resonator in accordance with a first embodiment, FIG. 9B is a cross-sectional view taken along line A-A in FIG. 9A, and FIG. 9C is a cross-sectional view taken along line B-B in FIG. 9A. As illustrated in FIG. 9A through FIG. 9C, an air gap 30 is formed in the upper surface of a substrate 10, and the lower electrode 12 is located on the substrate 10. The piezoelectric substrate 14 is located on the lower electrode 12. The upper electrode 16 is located on the piezoelectric substrate 14. The resonance region 50 overlaps with the air gap 30 in plan view, and the air gap 30 is the same as the resonance region 50 in size or is larger than the resonance region 50.

The planar shape of the resonance region 50 is rectangular, a pair of sides among the four sides of the rectangle extends substantially in the Y direction (the displacement direction of the thickness shear vibration), and another pair of sides extends in the X direction (the direction substantially perpendicular to the displacement direction of the thickness shear vibration). The edge regions 54a are located on both sides in the X direction of the center region 52 of the resonance region 50, and the edge regions 54b are located on both sides in the Y direction of the center region 52 of the resonance region 50. The edge region 54a extends substantially in the Y direction, and the edge region 54b extends substantially in the X direction. The width in the X direction of the edge region 54a is represented by Wa, and the width in the Y direction of the edge region 54b is represented by Wb. The width Wa is substantially constant in the Y direction, and the width Wb is substantially constant in the X direction.

The additional film 22a is located under the lower electrode 12 in the edge regions 54a, and the additional film 26a is located on the upper electrode 16 in the edge regions 54a. The additional films 22a and 26a have thicknesses of Ta. The additional film 22b is located under the lower electrode 12 in the edge regions 54b, and the additional film 26b is located on the upper electrode 16 in the edge regions 54b. The additional films 22b and 26b have thicknesses of Tb. In the first embodiment, the width Wb is greater than the width We, and the thicknesses Ta and Tb are substantially identical to each other.

The substrate 10 is, for example, a silicon substrate, a sapphire substrate, an alumina substrate, a spinel substrate, a quartz substrate, a crystal substrate, a glass substrate, a ceramic substrate, or a GaAs substrate. The piezoelectric substrate 14 is, for example, a monocrystalline lithium tantalate substrate or a monocrystalline lithium niobate substrate. The lower electrode 12 and the upper electrode 16 are formed of a single-layer film of, for example, ruthenium, chrome (Cr), aluminum (Al), Ti, copper (Cu), molybdenum (Mo), tungsten (W), tantalum (Ta), platinum (Pt), rhodium (Rh), or iridium (Ir), or a multilayered film in which at least two of them are stacked. The additional films 22a, 22b, 26a, and 26b are, for example, metal films that are listed as an example of the film forming the lower electrode 12 and the upper electrode 16 or insulating films such as, but not limited to, a silicon oxide film, a silicon nitride film, or an aluminum oxide film. The materials of the additional films 22a, 22b, 26a, and 26b may be identical to the materials of the lower electrode 12 and the upper electrode 16, or may differ from the materials of the lower electrode 12 and the upper electrode 16.

An exemplary configuration of the first embodiment is as follows. The piezoelectric substrate 14 is an X-cut lithium tantalate substrate with a thickness of 820 nm, and the negative X direction is the direction obtained by rotating the Y-axis orientation to the Z-axis orientation by approximately 42°. In this case, the wavelength A of the acoustic wave is 1640 nm. The lower electrode 12 and the upper electrode 16 are formed of a ruthenium film with a thickness of 100 nm. The additional films 22a, 22b, 26a, and 26b are ruthenium films. The width of the resonance region 50 is 30λ. As in the simulation 2, Ta=Tb=40 nm, Wa=0.35λ, and Wb 0.70λ. The above configuration reduces spurious in both the mode A and the mode B.

In the first embodiment, the acoustic velocities in the edge regions 54a and 54b are made to be less than the acoustic velocity in the center region 52, and the width Wa of the edge region 54a and the width Wb of the edge region 54b are made to be different. This configuration reduces spurious in both the X direction and the Y direction. In particular, the width Wa of the edge region 54a is made to be less than the width Wb of the edge region 54b. This configuration reduces spurious in both the X direction and the Y direction.

First Variation of the First Embodiment

Figure 10A:
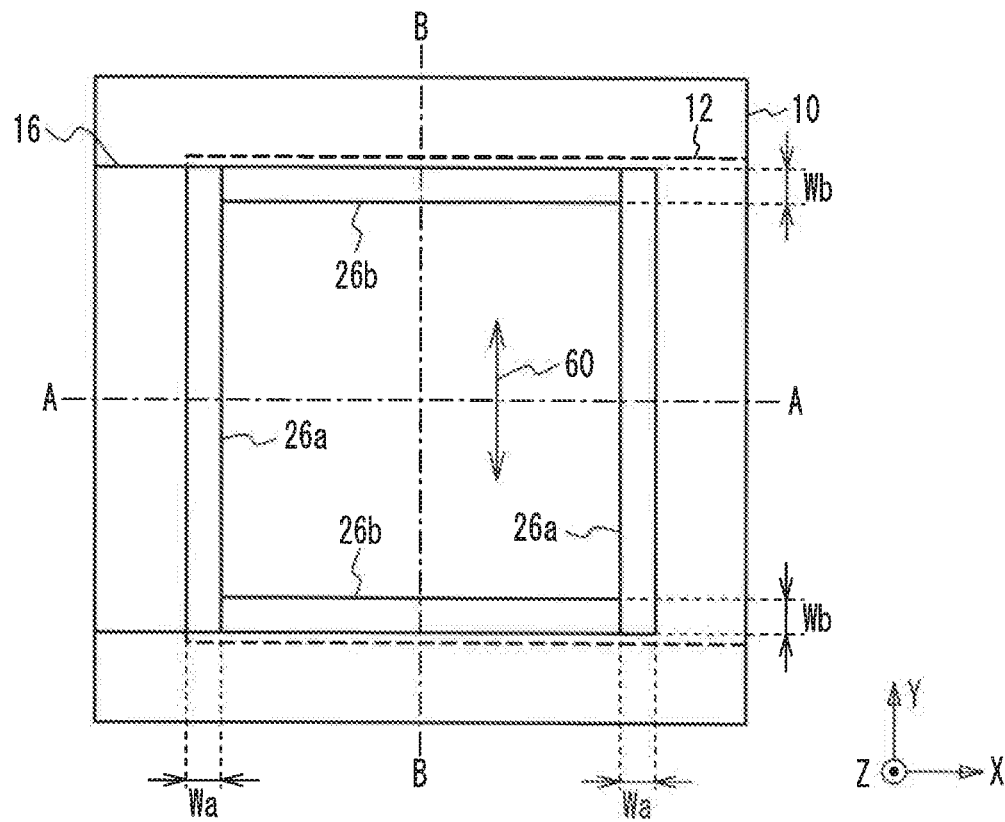
FIG. 10A is a plan view of a piezoelectric thin film resonator in accordance with a first variation of the first embodiment.
Figure 10B:
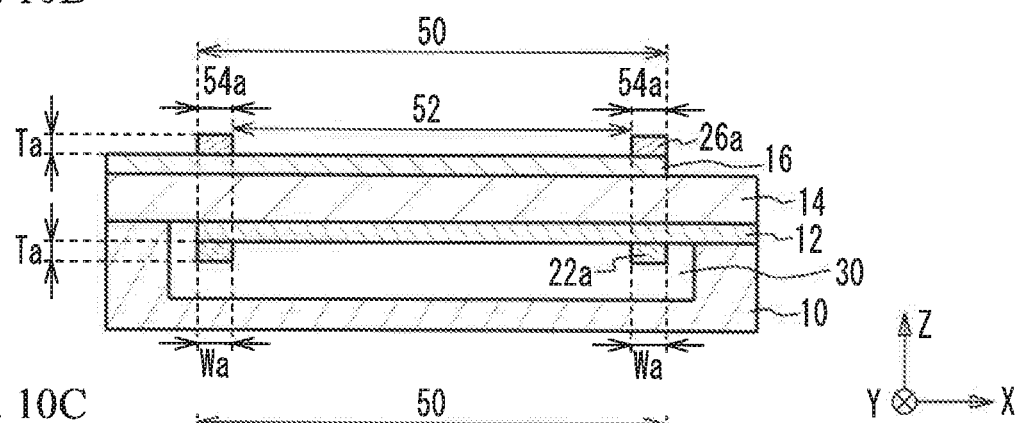
FIG. 10B is a cross-sectional view taken along line A-A in FIG. 10A.
Figure 10C:
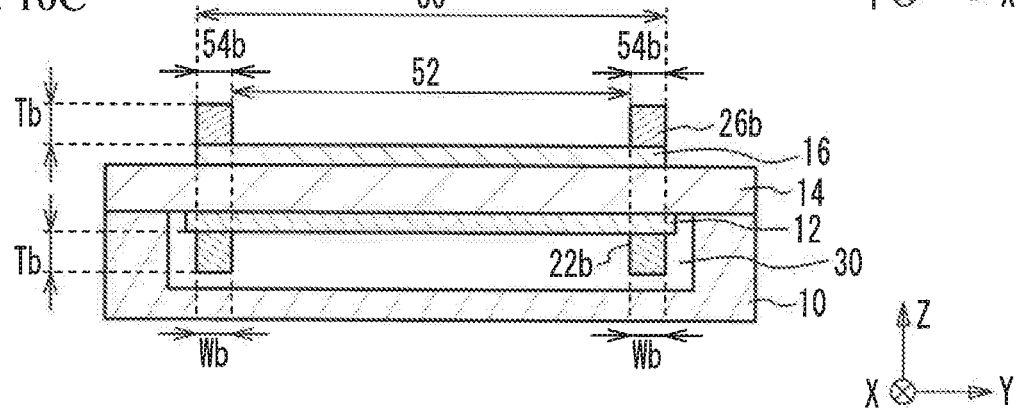
FIG. 10C is a cross-sectional view taken along line B-B in FIG. 10A.

FIG. 10A is a plan view of a piezoelectric thin film resonator in accordance with a first variation of the first embodiment, FIG. 10B is a cross-sectional view taken along line A-A in FIG. 10A, and FIG. 10C is a cross-sectional view taken along line B-B in FIG. 10A. As illustrated in FIG. 10A through FIG. 10C, in the first variation of the first embodiment, the width Wa of the edge region 54a is approximately equal to the width Wb of the edge region 54b. The thicknesses Tb of the additional films 22b and 26b are greater than the thicknesses Ta of the additional films 22a and 26a. Other structures are the same as those of the first embodiment, and the description thereof is thus omitted.

An exemplary configuration of the first variation of the first embodiment is as follows. The piezoelectric substrate 14 is an X-cut lithium tantalate substrate with a thickness of 820 nm, and the negative X direction is the direction obtained by rotating the Y-axis orientation to the Z-axis orientation by approximately 42°. In this case, the wavelength A of the acoustic wave is 1640 nm. The lower electrode 12 and the upper electrode 16 are formed of a ruthenium film with a thickness of 100 nm. The additional films 22a, 22b, 26a, and 26b are ruthenium films. The width of the resonance region 50 is 30λ. As in the simulation 2, Ta=40 nm, Tb=70 nm, and Wa=Wb=0.35λ. The above configuration reduces spurious in both the mode A and the mode B.

In the first variation of the first embodiment, the acoustic velocities in the edge regions 54a and 54b are made to be less than the acoustic velocity in the center region 52, and the thicknesses Ta of the additional films 22a and 26a in the edge region 54a are made to be different from the thicknesses Tb of the additional films 22b and 26b in the edge region 54b. This configuration reduces spurious in both the X direction and the Y direction. In particular, the thicknesses Ta of the additional films 22a and 26a are made to be less than the thicknesses Tb of the additional films 22b and 26b. This configuration makes the acoustic velocity in the edge region 54a greater than the acoustic velocity in the edge region 54b. Thus, spurious is reduced in both the X direction and the Y direction.

Second Variation of the First Embodiment

Figure 11A:
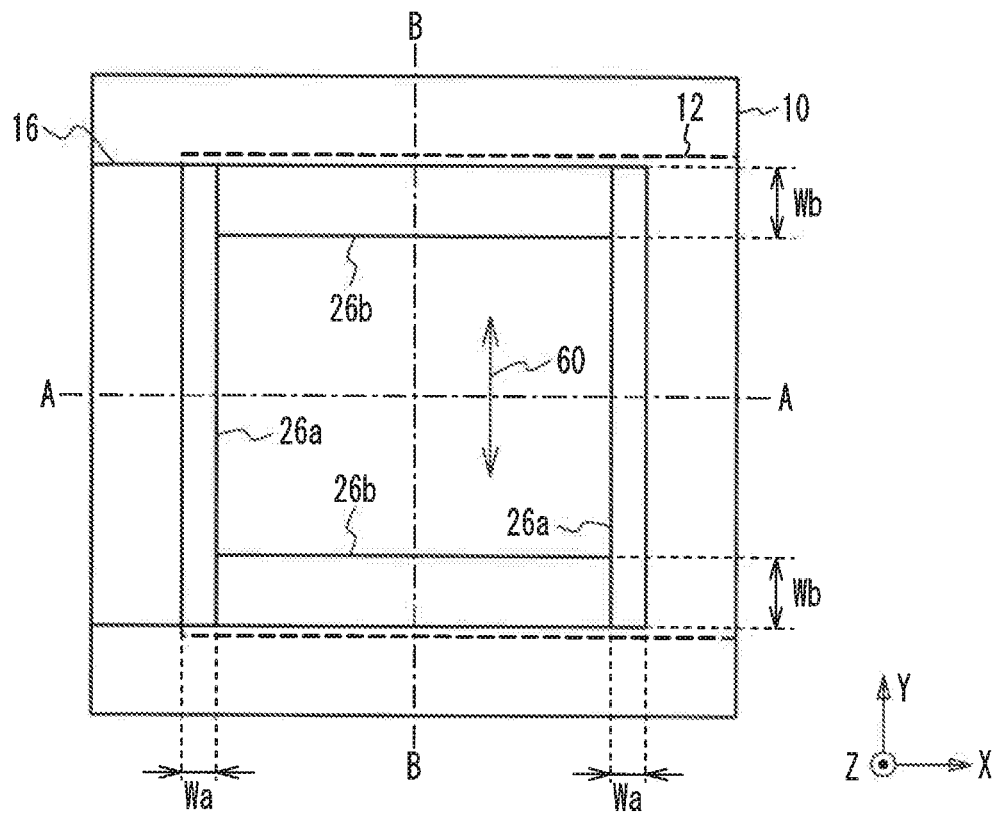
FIG. 11A is a plan view of a piezoelectric thin film resonator in accordance with a second variation of the first embodiment.
Figure 11B:
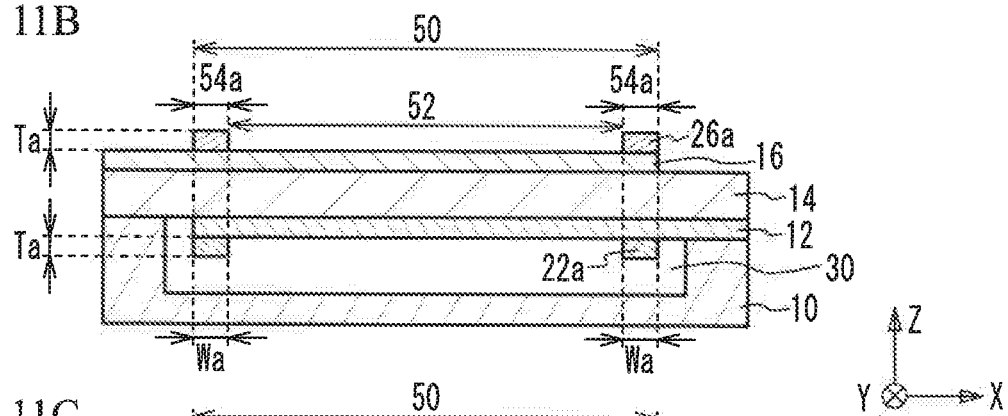
FIG. 11B is a cross-sectional view taken along line A-A in FIG. 11A.
Figure 11C:
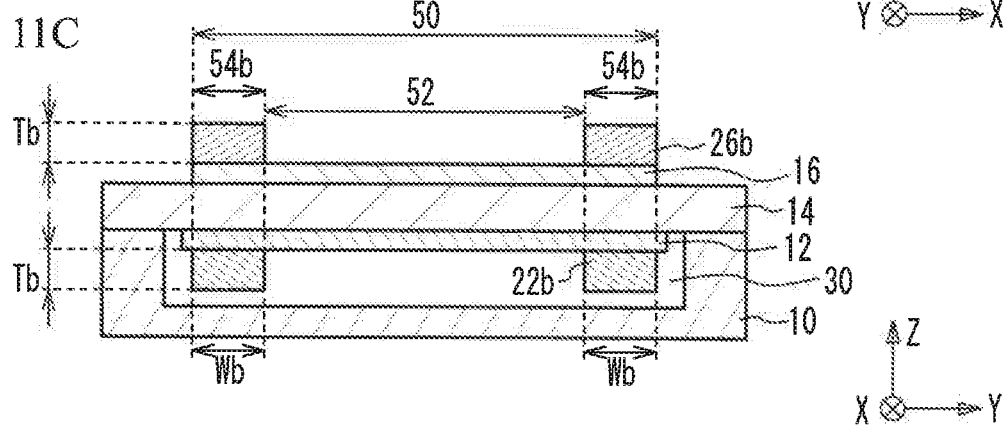
FIG. 11C is a cross-sectional view taken along line B-B in FIG. 11A.

FIG. 11A is a plan view of a piezoelectric thin film resonator in accordance with a second variation of the first embodiment, FIG. 11B is a cross-sectional view taken along line A-A in FIG. 11A, and FIG. 11C is a cross-sectional view taken along line B-B in FIG. 11A. As illustrated in FIG. 11A through FIG. 11C, in the second variation of the first embodiment, the width Wb of the edge region 54b is greater than the width Wa of the edge region 54a. The thicknesses Tb of the additional films 22b and 26b are greater than the thicknesses Ta of the additional films 22a and 26a. Other structures are the same as those of the first embodiment, and the description thereof is thus omitted.

In the second variation of the first embodiment, the width Wa of the edge region 54a is made to be different from the width Wb of the edge region 54b, and the acoustic velocity in the edge region 54a is made to be different from the acoustic velocity in the edge region 54b. This configuration reduces spurious in both the X direction and the Y direction. In particular, the width Wa of the edge region 54a is made to be less than the width Wb of the edge region 54b, and the acoustic velocity in the edge region 54a is made to be greater than the acoustic velocity in the edge region 54b. This configuration reduces spurious in both the X direction and the Y direction.

Third Variation of the First Embodiment

Figure 12A:
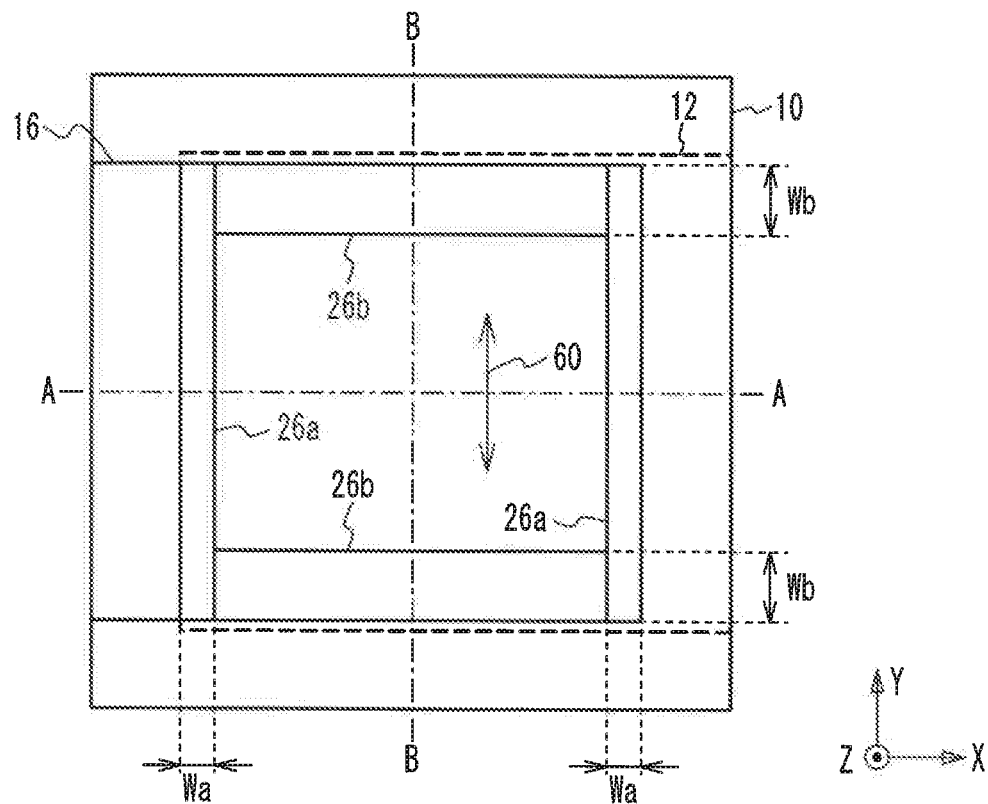
FIG. 12A is a plan view of a piezoelectric thin film resonator n accordance with a third variation of the first embodiment.
Figure 12B:
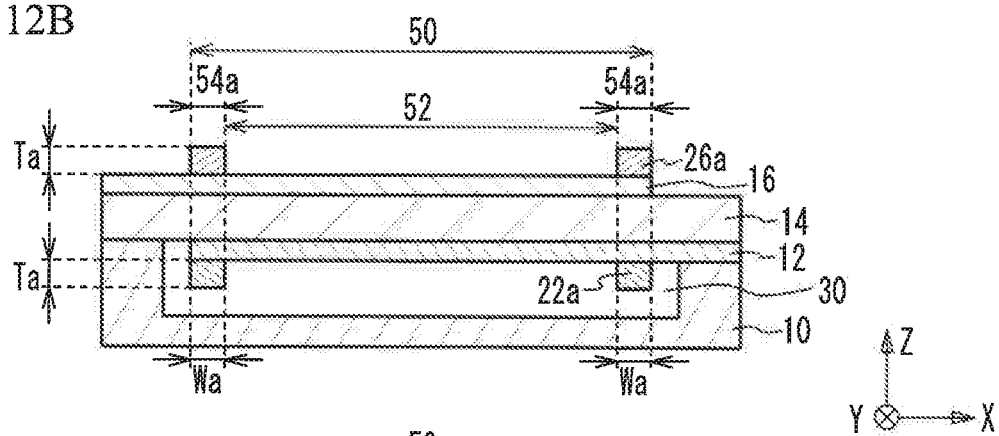
FIG. 12B is a cross-sectional view taken along line A-A in FIG. 12A.
Figure 12C:
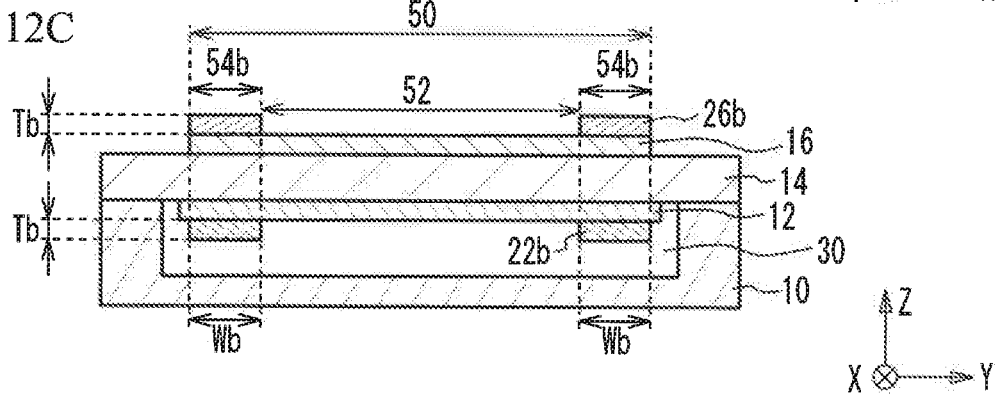
FIG. 12C is a cross-sectional view taken along line B-B in FIG. 12A.

FIG. 12A is a plan view of a piezoelectric thin film resonator in accordance with a third variation of the first embodiment, FIG. 12B is a cross-sectional view taken along line A-A in FIG. 12A, and FIG. 12C is a cross-sectional view taken along line B-B in FIG. 12A. As illustrated in FIG. 12A through FIG. 12C, in the third variation of the first embodiment, the width Wb of the edge region 54b is greater than the width Wa of the edge region 54a. The thicknesses Ta of the additional films 22a and 26a are greater than the thicknesses Tb of the additional films 22b and 26b. Other structures are the same as those of the first embodiment, and the description thereof is thus omitted.

In the third variation of the first embodiment, the width Wa of the edge region 54a is made to be different from the width Wb of the edge region 54b, and the acoustic velocity in the edge region 54a is made to be different from the acoustic velocity in the edge region 54b. This configuration reduces spurious in both the X direction and the Y direction. Even when the width Wa of the edge region 54a is made to be less than the width Wb of the edge region 54b, and the acoustic velocity in the edge region 54a is made to be less than the acoustic velocity in the edge region 54b, spurious is reduced in both the X direction and the Y direction by appropriately setting the widths Wa and Wb and the thicknesses Ta and Tb.

Fourth Variation of the First Embodiment

Figure 13A:
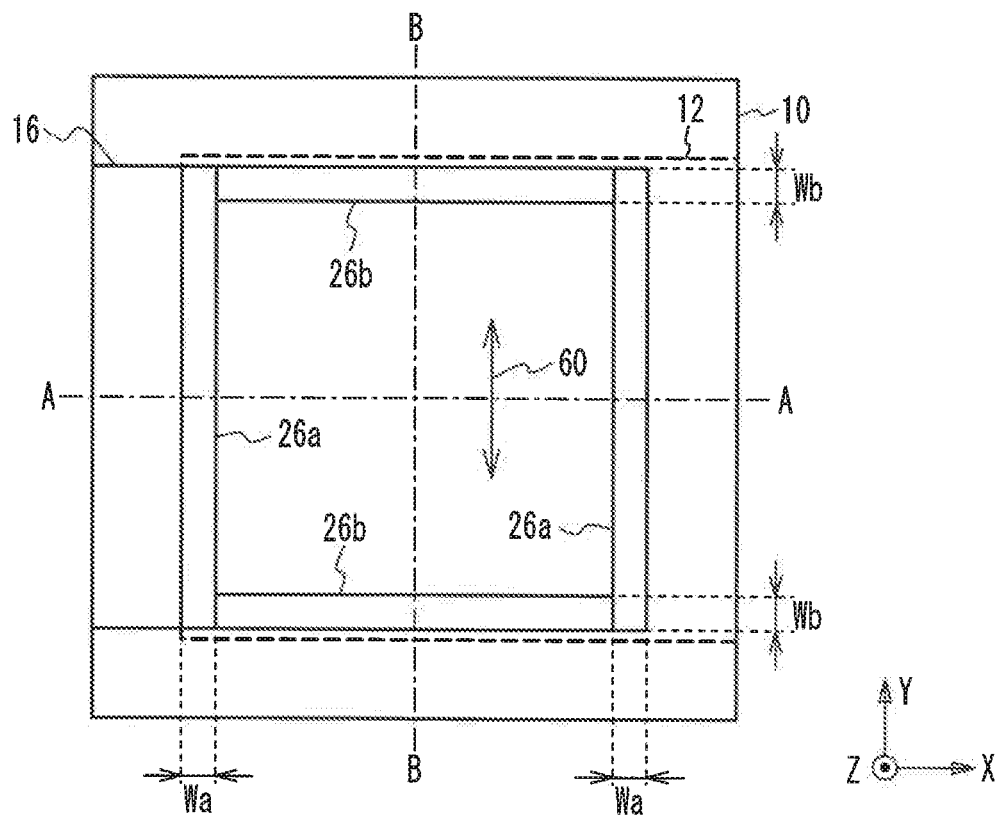
FIG. 13A is a plan view of a piezoelectric thin film resonator in accordance with a fourth variation of the first embodiment.
Figure 13B:
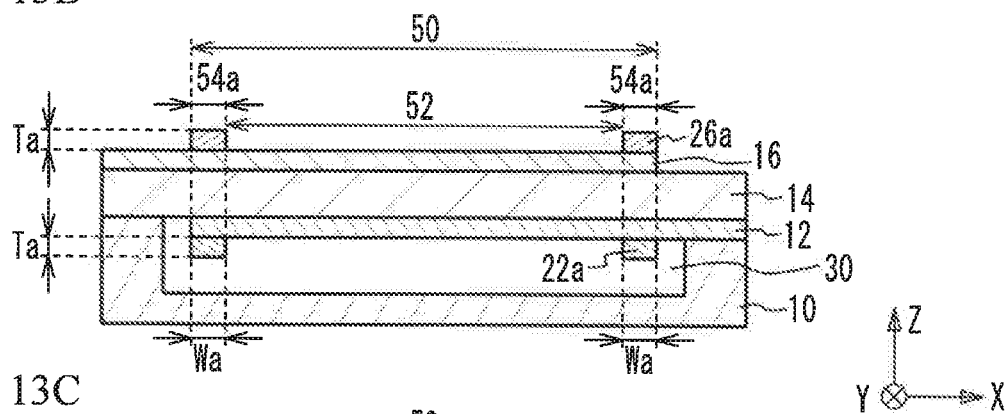
FIG. 13B is a cross-sectional view taken along line A-A in FIG. 13A.
Figure 13C:
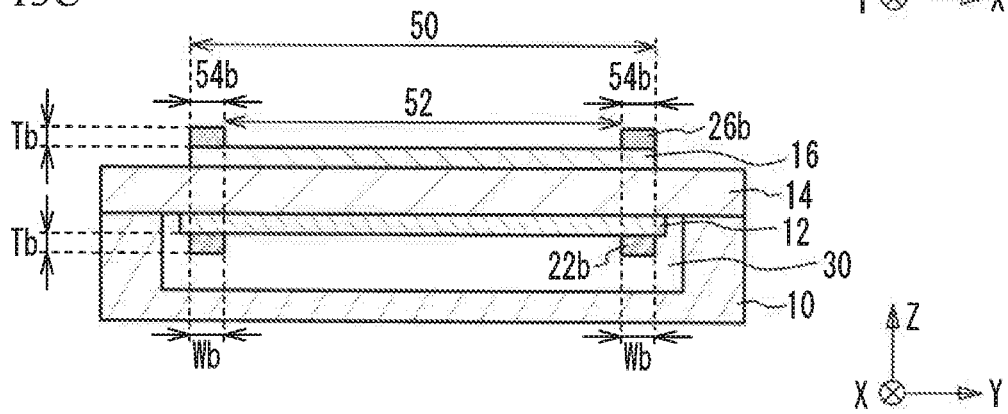
FIG. 13C is a cross-sectional view taken along line B-B in FIG. 13A.

FIG. 13A is a plan view of a piezoelectric thin film resonator in accordance with a fourth variation of the first embodiment, FIG. 13B is a cross-sectional view taken along line A-A in FIG. 13A, and FIG. 13C is a cross-sectional view taken along line B-B in FIG. 13A. As illustrated in FIG. 13A through FIG. 13C, in the fourth variation of the first embodiment, the width Wa of the edge region 54a is substantially equal to the width Wb of the edge region 54b. The thicknesses Ta of the additional films 22a and 26a are substantially equal to the thicknesses Tb of the additional films 22b and 26b. The materials of the additional films 22a and 26a differ from the materials of the additional films 22b and 26b. Other structures are the same as those of the first embodiment, and the description thereof is thus omitted.

In the fourth variation of the first embodiment, the densities of the additional films 22b and 26b are greater than the densities of the additional films 22a and 26a. This configuration makes the acoustic velocity in the edge region 54b less than the acoustic velocity in the edge region 54a even when the thicknesses Ta and Tb are the same. Thus, spurious is reduced in both the X direction and the Y direction.

Fifth Variation of the First Embodiment

Figure 14A:
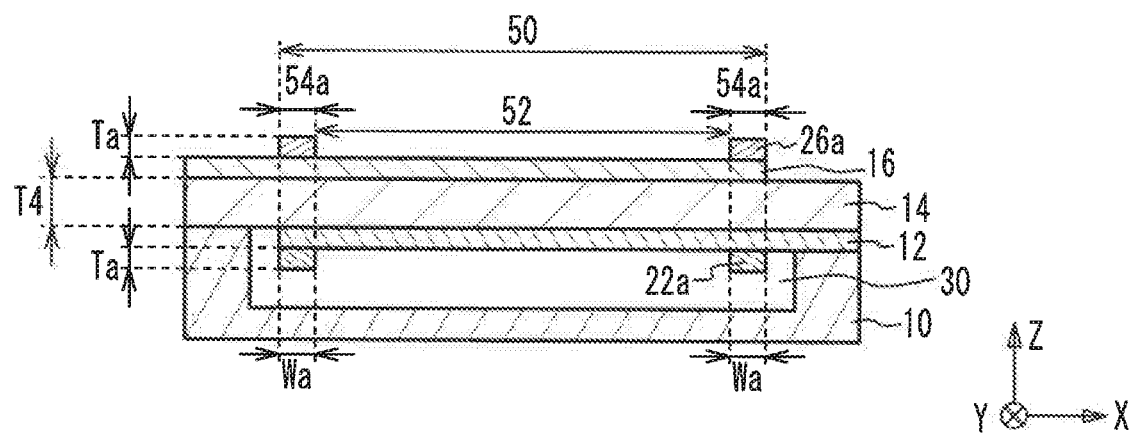
FIG. 14A and FIG. 14B are cross-sectional views of a piezoelectric thin film resonator in accordance with a fifth variation of the first embodiment.
Figure 14B:
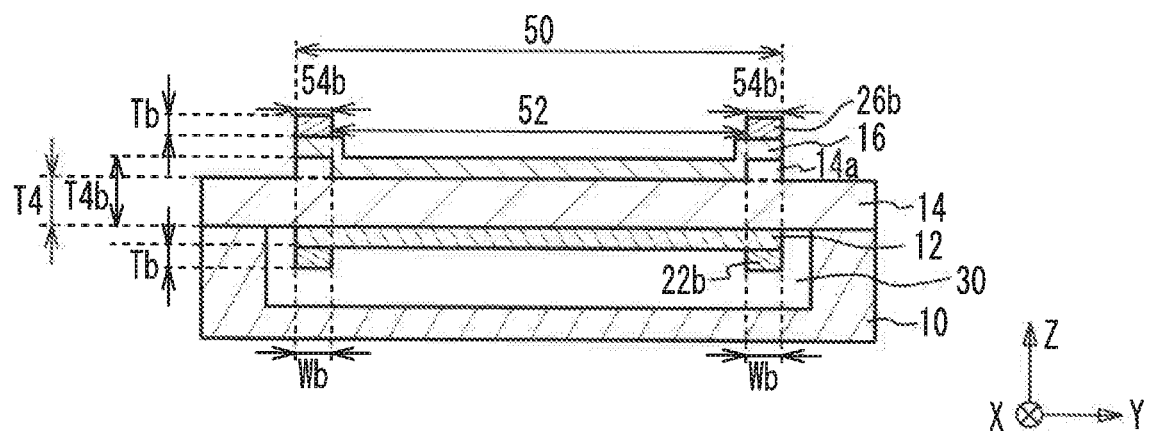

FIG. 14A and FIG. 14B are cross-sectional views of a piezoelectric thin film resonator in accordance with a fifth variation of the first embodiment. As illustrated in FIG. 14A and FIG. 14B, the widths Wa and Wb are substantially the same, and the thicknesses Ta and Tb are substantially the same. The thickness T4 of the piezoelectric substrate 14 in the edge region 54a is substantially the same as the thickness of the piezoelectric substrate 14 in the center region 52. Protrusion portions 14a are provided to the upper surface of the piezoelectric substrate 14 in the edge regions 54b. Thus, the thickness T4b of the piezoelectric substrate 14 in the edge region 54b is greater than the thickness T4 of the piezoelectric substrate 14 in the edge region 54a. Other structures are the same as those of the first embodiment, and the description thereof is thus omitted.

In the fifth variation of the first embodiment, even when the thicknesses Ta of the additional films 22a and 26a are the same as the thicknesses Tb of the additional films 22b and 26b, the acoustic velocities in the edge regions 54a and 54b can be made to be different by making the thickness of the piezoelectric substrate 14 in the edge region 54a different from the thickness of the piezoelectric substrate 14 in the edge region 54b. The acoustic velocity in the edge region 54b can be made to be less than the acoustic velocity in the edge region 54a by making the piezoelectric substrate 14 in the edge region 54b thicker than the piezoelectric substrate 14 in the edge region 54a. Thus, spurious is reduced in both the X direction and the Y direction.

Sixth Variation of the First Embodiment

Figure 15A:
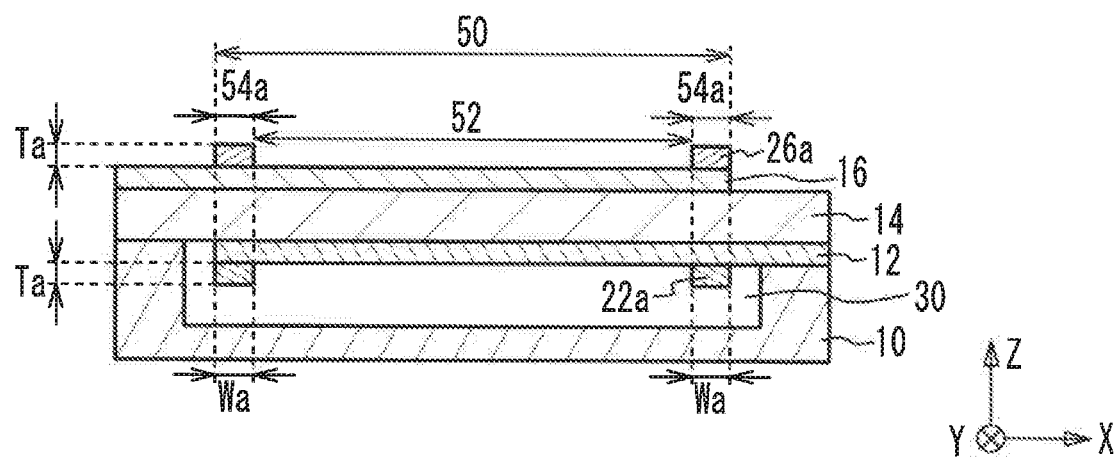
FIG. 15A and FIG. 15B are cross-sectional views of a piezoelectric thin film resonator in accordance with a sixth variation of the first embodiment.
Figure 15B:
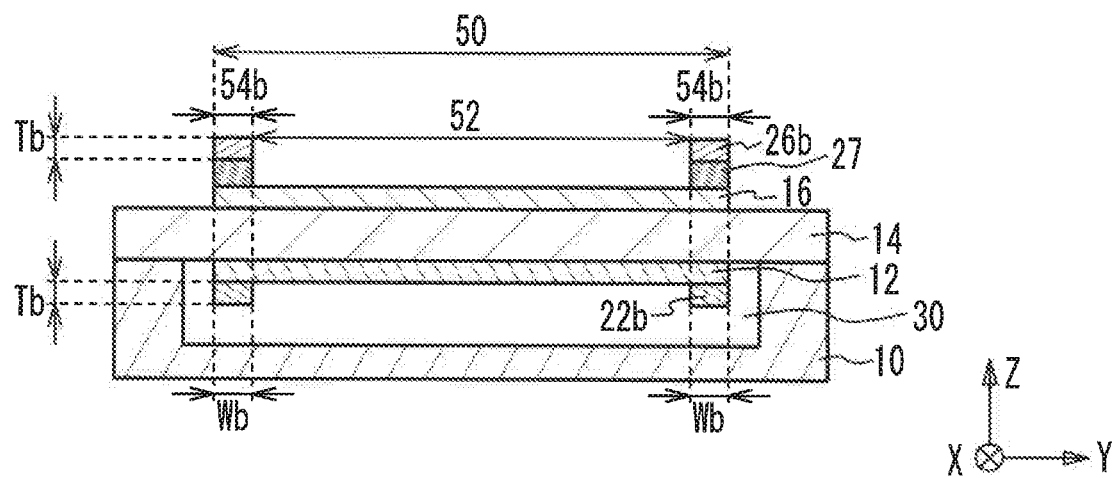

FIG. 15A and FIG. 15B are cross-sectional views of a piezoelectric thin film resonator in accordance with a sixth variation of the first embodiment. As illustrated in FIG. 15A and FIG. 15B, the widths Wa and Wb are substantially the same, and the thicknesses Ta and Tb are substantially the same. Another additional film 27 is provided between the upper electrode 16 and the additional film 26b in the edge regions 54b. No other additional film 27 is provided in the edge regions 54a. Other structures are the same as those of the first embodiment, and the description thereof is thus omitted.

In the sixth variation of the first embodiment, another additional film 27 is provided in the edge region 54b. Even when the thicknesses Ta of the additional films 22a and 26a and the thicknesses Tb of the additional films 22b and 26b are the same, provision of another additional film 27 in the edge region 54 makes the acoustic velocity in the edge region 54b less than the acoustic velocity in the edge region 54a. Thus, spurious is reduced in both the X direction and the Y direction. It is sufficient if the additional film 27 is provided in one of the following locations: under the additional film 22b, between the additional film 22b and the lower electrode 12, between the upper electrode 16 and the additional film 26b, and on the additional film 26b. Another additional film 27 may be provided in two or more of the above locations.

Seventh Variation of the First Embodiment

Figure 16:
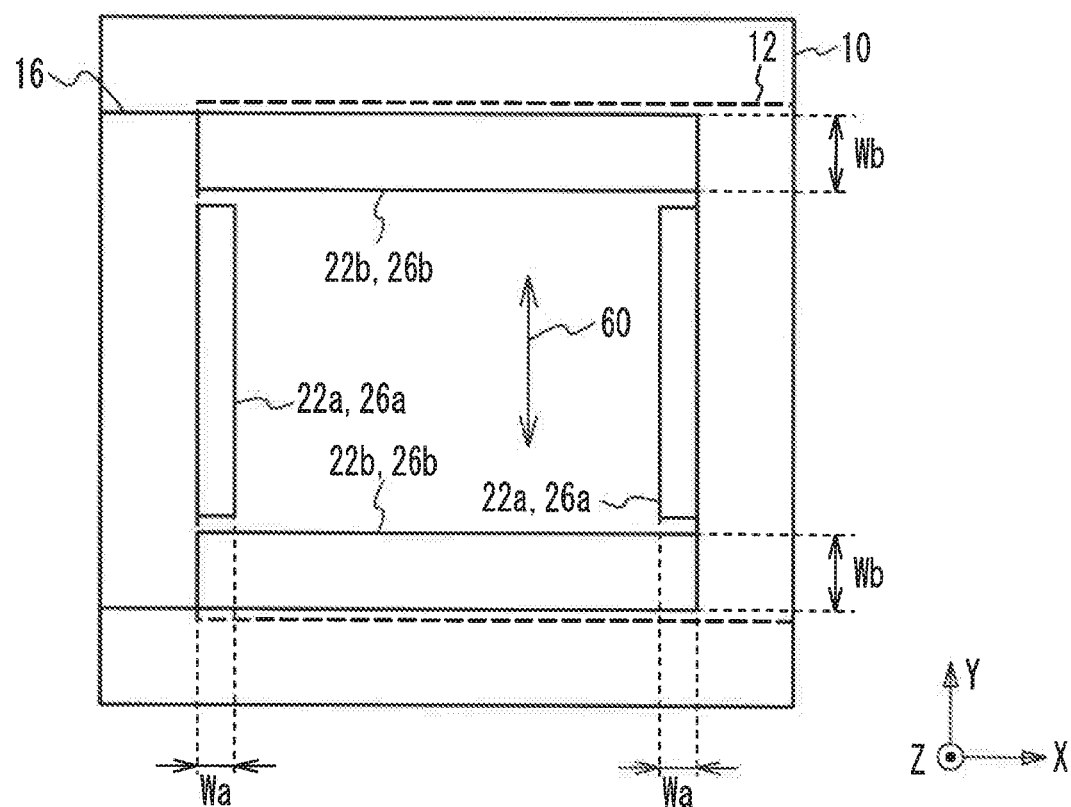
FIG. 16 is a plan view of a piezoelectric thin film resonator in accordance with a seventh variation of the first embodiment.

FIG. 16 is a plan view of a piezoelectric thin film resonator in accordance with a seventh variation of the first embodiment. As illustrated in FIG. 16, the additional films 22a and 22b are separated from each other, and the additional films 26a and 26b are separated from each other. Other structures are the same as those of the first embodiment, and the description thereof is thus omitted.

Also in the first through sixth variations of the first embodiment, the additional films 22a and 22b may be separated from each other, and the additional films 26a and 26b may be separated from each other.

Eighth Variation of the First Embodiment

Figure 17A:
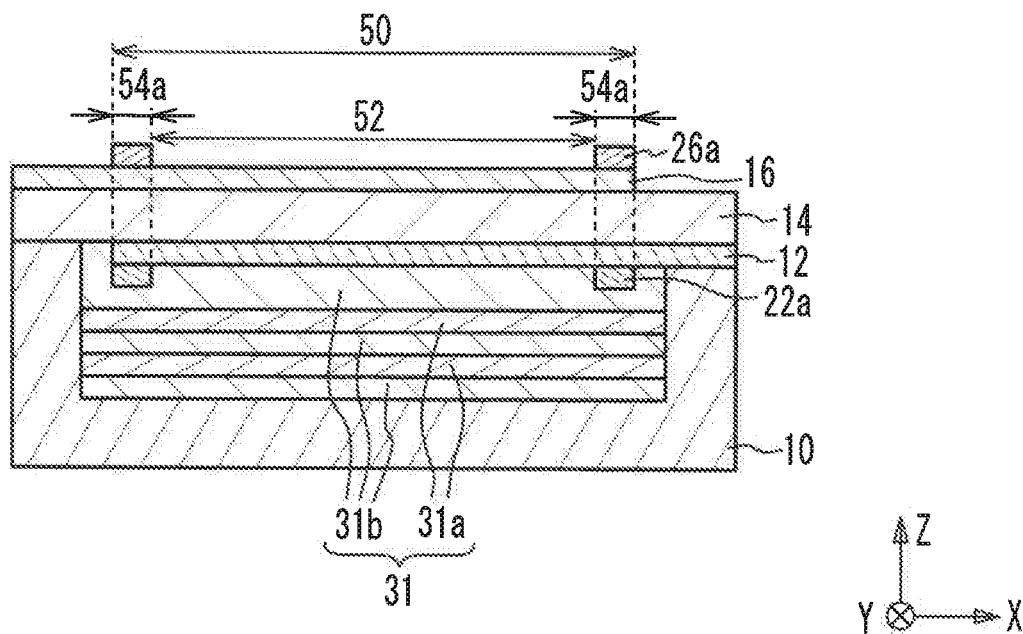
FIG. 17A and FIG. 17B are cross-sectional views of a piezoelectric thin film resonator in accordance with an eighth variation of the first embodiment.
Figure 17B:
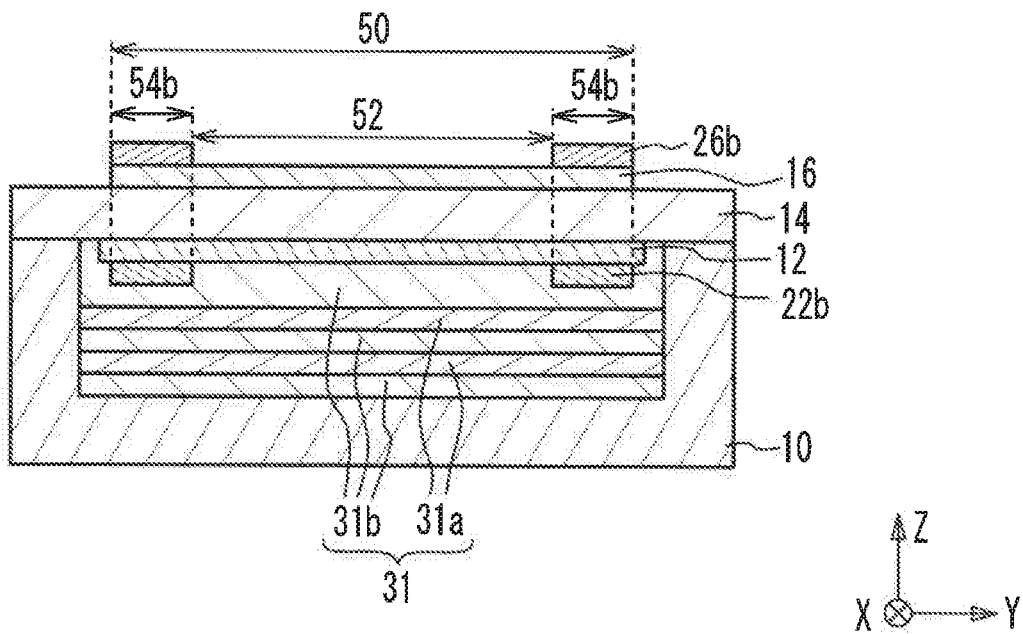

FIG. 17A and FIG. 17B are cross-sectional views of a piezoelectric thin film resonator in accordance with an eighth variation of the first embodiment. As illustrated in FIG. 17A and FIG. 17B, an acoustic mirror 31 is formed under the lower electrode 12 in the resonance region 50. The acoustic mirror 31 includes films 31a having low acoustic impedance and films 31b having high acoustic impedance that are alternately stacked. The film thickness of each of the films 31a and 31b is, for example, λ/4 (λ represents the wavelength of the acoustic wave). The number of the films 31a and the films 31b that are stacked is freely selected. For example, the acoustic mirror 31 may have a structure in which a single film having acoustic impedance different from that of the substrate 10 is located in the substrate 10. Other structures are the same as those of the first embodiment, and the description thereof is thus omitted.

In the first through seventh variations of the first embodiment, the acoustic mirror 31 may be formed instead of the air gap 30 as in the eighth variation of the first embodiment. It is sufficient if the acoustic reflection layer that reflects the acoustic wave in the resonance region 50 includes the air gap 30 or the acoustic mirror 31. As described above, the piezoelectric thin film resonator may be an FBAR including the air gap 30, or an SMR including the acoustic mirror 31.

In the first embodiment and the variations thereof, the additional films 22a and 22b are located under the lower electrode 12, and the additional films 26a and 26b are located on the upper electrode 16. However, only one of the additional films 22a and 26a may be provided. Only one of the additional films 22b and 26b may be provided. When the additional films 22a and 22b are metal films, and are in contact with the lower electrode 12, the additional films 22a and 22b practically form a part of the lower electrode 12. When the additional films 26a and 26b are metal films, and are in contact with the upper electrode 16, the additional films 26a and 26b practically form a part of the upper electrode 16.

In the first embodiment and the variations thereof, the lower electrode 12 and the upper electrode 16 (a pair of electrodes) sandwich the piezoelectric substrate 14, and excites the thickness shear vibration in the piezoelectric substrate 14. The edge regions 54a and 54b surround the center region 52 of the resonance region 50, and are located in the edge portion of the resonance region 50. The edge regions 54b (first regions) are located on both sides of the center region 52 in the Y direction (a first direction) substantially parallel to the displacement direction of the thickness shear vibration that is a primary mode in the piezoelectric substrate 14. The edge regions 54a (second regions) are located on both sides of the center region 52 in the X direction (a second direction) substantially perpendicular to the Y direction. The acoustic velocities of the acoustic waves in the piezoelectric substrate 14 in the edge regions 54a and 54b are less than the acoustic velocity of the acoustic wave in the piezoelectric substrate 14 in the center region 52.

In the above-described structure, in the first embodiment and the second, third, seventh, and eighth variations thereof, the width Wb in the Y direction (the first direction) of the edge region 54b (the first regions) and the width Wa in the X direction (the second direction) of the edge region 54a (the second region) differ from each other. Thus, spurious in both the X direction and the Y direction is reduced.

The thickness shear vibration that is a primary mode is a vibration using resonance characteristics among a plurality of thickness shear vibrations, and corresponds to the fast lateral wave in, for example, FIG. 4A and FIG. 4B. In addition, the first direction substantially parallel to the displacement direction of the thickness shear vibration may be inclined from the displacement direction of the thickness shear vibration as long as spurious can be reduced. The angle between the first direction and the displacement direction of the thickness shear vibration is within a range of, for example, ±20°, is within a range of, for example, ±10', or is within a range of, for example, ±5°. When the first direction and the second direction are perpendicular to each other, the first direction and the second direction may be inclined as long as spurious can be reduced. The angle between the first direction and the second direction is, for example, 70° to 110°, for example, 80° to 100°, for example, 85° to 95°.

To achieve the piston mode, the widths Wa and Wb are preferably 0.1λ or greater and 3λ or less, more preferably 0.2λ or greater and 2λ or less.

The width Wa in the X direction of the edge region 54a is less than the width Wb in the Y direction of the edge region 54b Thus, as in the simulation 2, spurious is further reduced.

In the first embodiment and the seventh and eighth variations thereof, the acoustic velocity of the acoustic wave in the piezoelectric substrate 14 in the edge region 54b is substantially the same as the acoustic velocity of the acoustic wave in the piezoelectric substrate 14 in the edge region 54a in consideration of a manufacturing error. Thus, as in the simulation 2, spurious is further reduced.

In the first through sixth variations of the first embodiment, the acoustic velocity of the acoustic wave in the piezoelectric substrate 14 in the edge region 54b differs from the acoustic velocity of the acoustic wave in the piezoelectric substrate 14 in the edge region 54a. This configuration reduces spurious in both the X direction and the Y direction.

The acoustic velocity of the acoustic wave in the piezoelectric substrate 14 in the edge region 54a is greater than the acoustic velocity of the acoustic wave in the piezoelectric substrate 14 in the edge region 54b. This configuration further reduces spurious as in the simulation 2.

Since the acoustic velocity in the edge region 54b is less than the acoustic velocity in the edge region 54a, as in the first variation of the first embodiment, the thicknesses Tb of the additional films 22b and 26b may be made to be greater than the thicknesses Ta of the additional films 22a and 26a. It is sufficient if the sum of the thicknesses of the additional films 22b and 26b is greater than the sum of the thicknesses of the additional films 22a and 26a.

As in the fourth variation of the first embodiment, the densities of the additional films 22b and 26b may be made to be greater than the densities of the additional films 22a and 26a. It is sufficient if the density of at least one of the additional films 22b and 26b is made to be greater than the densities of the additional films 22a and 26a.

As in the fifth variation of the first embodiment, the thickness T4b of the piezoelectric substrate 14 in the edge region 54b may be made to be greater than the thickness T4 of the piezoelectric substrate 14 in the edge region 54a. As in the sixth variation of the first embodiment, another additional film 27 may be provided in the edge region 54b. These methods may be combined.

In the first and fourth through sixth variations of the first embodiment, the width in the Y direction of the edge region 54b is substantially the same as the width in the X direction of the edge region 54a in consideration of a manufacturing error. Thus, as in the simulation 2, spurious is further reduced.

In the first variation of the first embodiment, the additional films 22b and 26b (a first additional film) provided in the edge region 54b and the additional films 22a and 26a (a second additional film) provided in the edge region 54a are provided. This configuration allows the acoustic velocities in the edge regions 54b and 54a to be different from each other by making the thicknesses Ta and Tb different.

As in the first embodiment and the first through sixth and eighth variations of the first embodiment, the additional films 22a and 22b may be one additional film, and the additional films 26a and 26b may be one additional film. As in the seventh variation of the first embodiment, the additional films 22a and 22b may be individual additional films separated from each other, and the additional films 26a and 26b may be individual additional films separated from each other.

When the piezoelectric substrate 14 is a monocrystalline lithium tantalate substrate, the piezoelectric substrate 14 is an X-cut lithium tantalate substrate. In this case, the normal direction of the upper surface of the piezoelectric substrate 14 (the Z direction) is the X-axis orientation. Thus, the thickness shear vibration is generated in the piezoelectric substrate 14. When the negative X direction is made to be the direction obtained by rotating the Y-axis orientation to the Z-axis orientation by 42°, the Y direction corresponds to the displacement direction of the thickness shear vibration. The normal direction of the upper surface of the piezoelectric substrate 14 may be inclined from the X-axis orientation at an angle within a range of ±5°. The angle between the normal direction of the upper surface of the piezoelectric substrate 14 and the X-axis orientation is preferably within a range of ±1°, more preferably within a range of ±0.3°. The rotation angle from the Y-axis orientation to the Z-axis orientation may be within a range of 42°±5°. The rotation angle from the Y-axis orientation to the Z-axis orientation is preferably within a range of 42°±1°, more preferably within a range of 42°±0.3°.

Expressed by Euler angles, when the negative X direction is rotated from the Y-axis orientation to the Z-axis orientation by 42°, the negative X direction is the X direction that is obtained when Euler angles are (90°, 90°, 42°). The negative Y direction is the X direction that is obtained when Euler angles are (90°, 90°, 132°). The negative X direction is preferably the negative X direction that is obtained when Euler angles are (90°±5°, 90°±5°, 42°±5°), more preferably the negative X direction that is obtained when Euler angles are (90°±1°, 90°±1°, 42°±1°), further preferably the negative X direction that is obtained when Euler angles are (90°±0.3°, 90°±0.3°, 42°±0.3°). The negative X direction is preferably the negative X direction that is obtained when Euler angles are (90°±5°, 90°±5°, 132°±5°), more preferably the negative X direction that is obtained when Euler angles are (90°±1°, 90°±1°, 132°±1°), and further preferably the negative X direction that is obtained when Euler angles are (90°±0.3°, 90°±0.3°, 132°±0.3°).

When the piezoelectric substrate 14 is a monocrystalline lithium niobate substrate, the piezoelectric substrate 14 is a rotated Y-cut lithium niobate substrate. In this case, the normal direction of the upper surface of the piezoelectric substrate 14 (the Z direction) is the direction in the Y-axis Z-axis plane. Thus, the thickness shear vibration is generated in the piezoelectric substrate 14. The positive Z direction is made to be the direction obtained by rotating the positive Y-axis orientation to the negative Z-axis orientation by 15° (i.e., the direction obtained by rotating the positive Y-axis orientation to the positive Z-axis orientation by −15°), and the X direction is made to be the X-axis orientation. This configuration makes the Y direction correspond to the displacement direction of the thickness shear vibration.

Expressed by Euler angles, the negative X direction is the negative direction that is obtained when Euler angles are (0°, 90°+165°, 0°), i.e., the negative X direction that is obtained when Euler angles are (0°, 75°, 0°). The negative Y direction is the negative X direction that is obtained when Euler angles are (90°, 75°, 0°). The negative X direction is preferably the negative X direction that is obtained when Euler angles are (0°±5°, 75°±5°, 0°±5°), more preferably the negative X direction that is obtained when Euler angles are (0°±1°, 75°±1°, 0°±1°), further preferably the negative X direction that is obtained when Euler angles are (0°±0.3°, 75±0.3°, 0°±0.3°). The negative Y direction is preferably the negative X direction that is obtained when Euler angles are (90°±5°, 75°±5°, 0°±5°), more preferably the negative X direction that is obtained when Euler angles are (90°±1°, 75°±1°, 0°±1°, further preferably the negative X direction that is obtained when Euler angles are (90°±0.3°, 75°±0.3°, 0°±0.3°).

Simulation 3

Figure 18A:
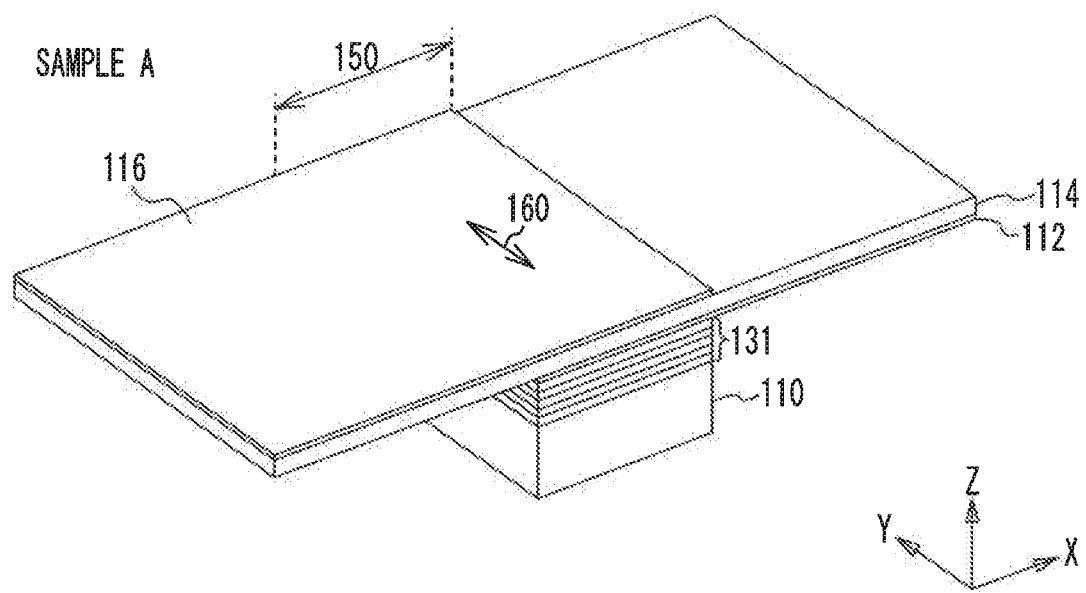
FIG. 18A and FIG. 18B are a perspective view and a cross-sectional view of a piezoelectric thin film resonator in accordance with a sample A, respectively.
Figure 18B:
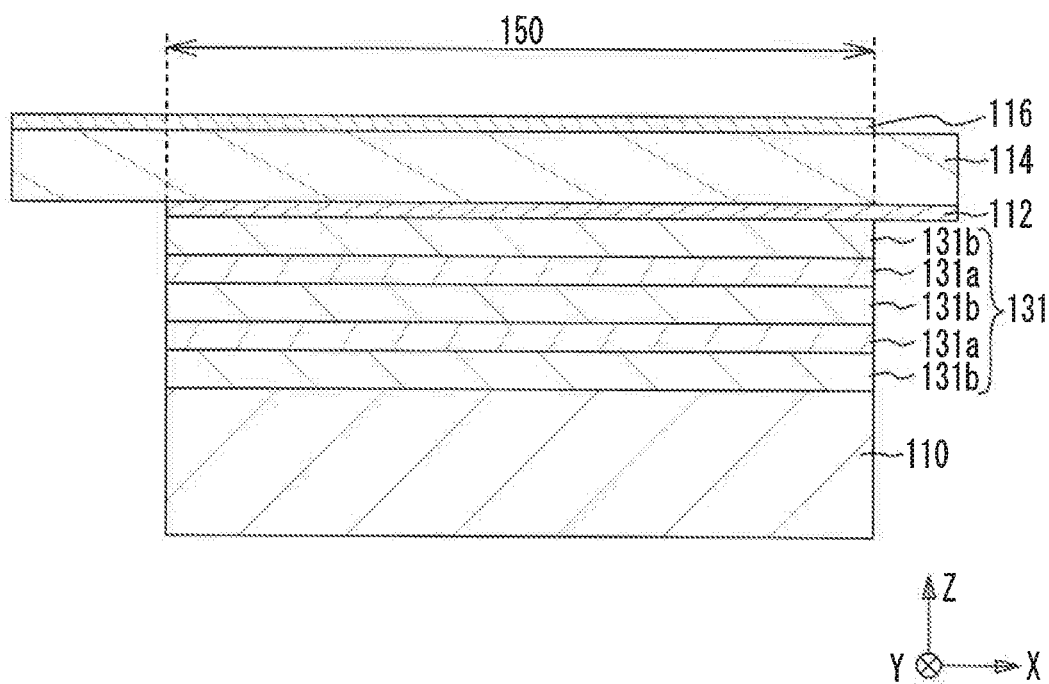

Samples A and B were subjected to simulation. FIG. 18A and FIG. 18B are a perspective view and a cross-sectional view of a piezoelectric thin film resonator in accordance with the sample A, respectively. The normal direction of a piezoelectric substrate 114 is defined as a Z direction, the extraction direction of a lower electrode 112 among plane directions of the piezoelectric substrate 114 is defined as an X direction, and the direction perpendicular to the X direction is defined as a Y direction. The X direction, the Y direction, and the Z direction do not necessarily correspond to the X-axis, the Y-axis, and the Z-axis of the crystal orientations of the piezoelectric substrate 114. The crystal orientations are described as the "X-axis orientation", the "Y-axis orientation", and the "Z-axis orientation" to be distinguished from the "X direction", the "Y direction", and the "Z direction".

As illustrated in FIG. 18A and FIG. 18B, an upper electrode 116 is located on the piezoelectric substrate 114, and the lower electrode 112 is located under the piezoelectric substrate 114. The region where the lower electrode 112 and the upper electrode 116 face each other across at least a part of the piezoelectric substrate 114 is a resonance region 150. The lower electrode 112 and the upper electrode 116 are drive electrodes. When high frequency power is applied between the lower electrode 112 and the upper electrode 116, the acoustic wave of which the displacement vibrates in the direction substantially perpendicular to the Z direction (i.e., in the shear direction with respect to the thickness) is excited in the piezoelectric substrate 114 within the resonance region 150. This vibration is called a thickness shear vibration. The direction in which the displacement of the thickness shear vibration is the largest (the displacement direction of the thickness shear vibration) is defined as a direction 160 of the thickness shear vibration. The Y direction is made to correspond to the direction 160 of the thickness shear vibration. The wavelength of the acoustic wave is approximately twice the thickness of the piezoelectric substrate 114. The planar shape of the resonance region 150 is substantially rectangular. The rectangle has four substantially straight sides. The extension directions of the four sides are the X direction and the Y direction.

The lower electrode 112 in the resonance region 150 is located over a substrate 110 through an acoustic mirror 131. The acoustic mirror 131 includes films 131b having low acoustic impedance and films 131a having high acoustic impedance that are alternately stacked. The film thickness of each of the films 131a and 131b is, for example, approximately $\lambda/4$ ($\lambda$ represents the wavelength of the acoustic wave). Accordingly, the acoustic mirror 131 reflects the acoustic wave.

Figure 19A:
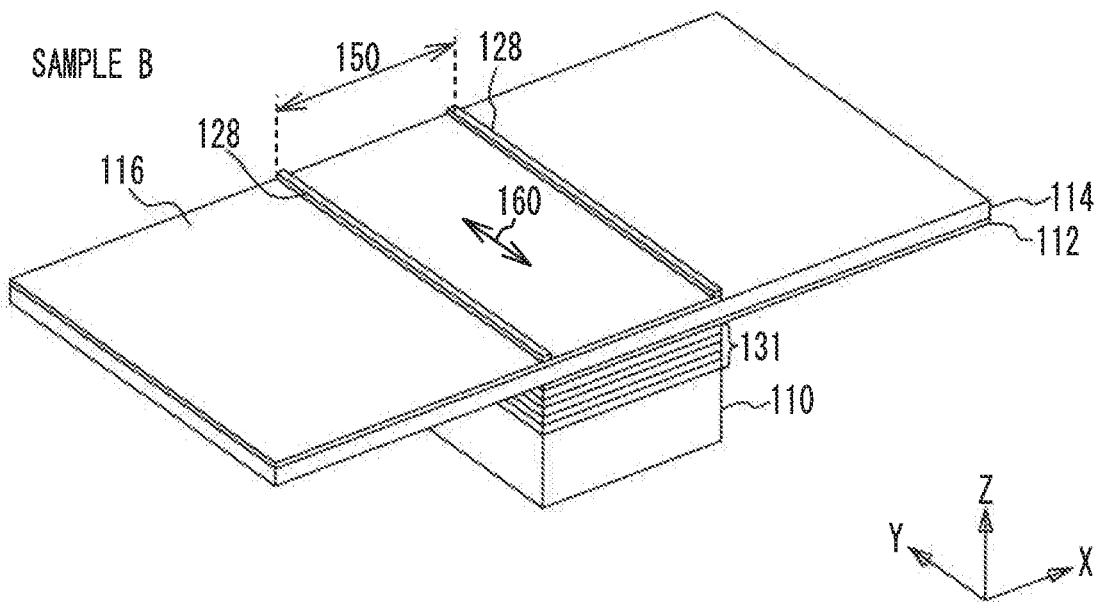
FIG. 19A and FIG. 19B are a perspective view and a cross-sectional view of a piezoelectric thin film resonator in accordance with a sample B, respectively.
Figure 19B:
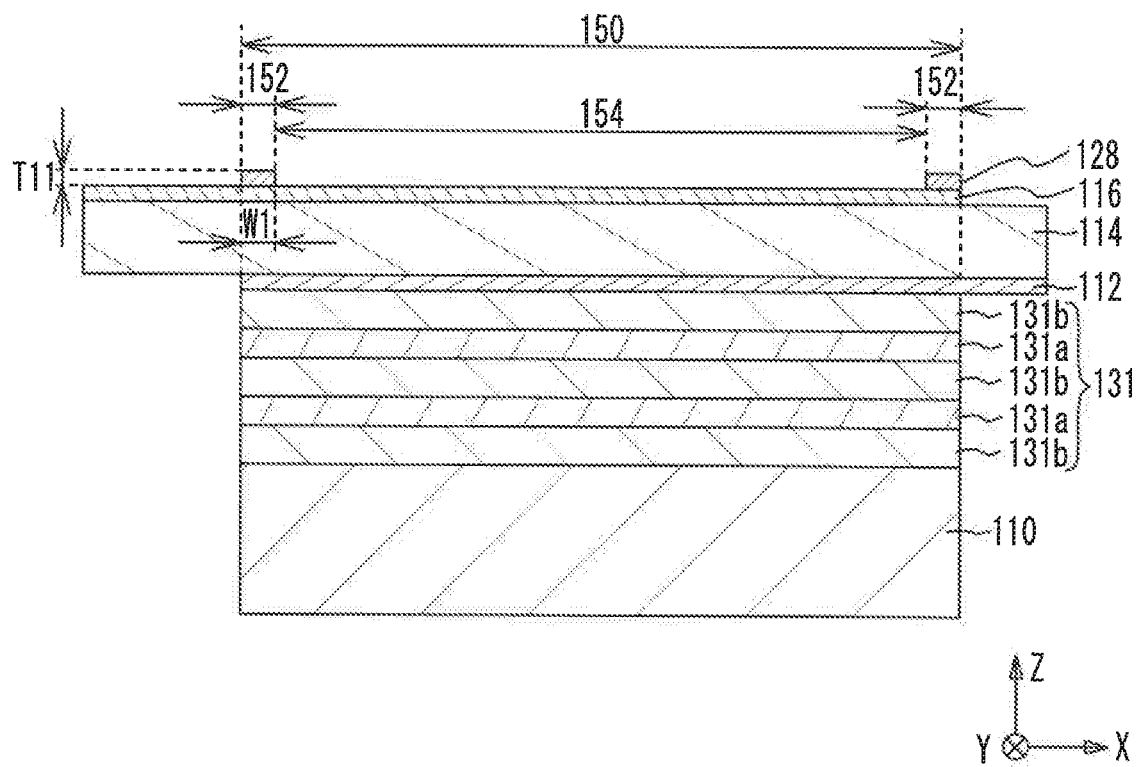

FIG. 19A and FIG. 19B are a perspective view and a cross-sectional view of a piezoelectric thin film resonator in accordance with the sample B, respectively. In the sample B, an additional film 128 is located on the upper electrode 116 in edge regions 152 located in both ends in the X direction of the resonance region 150. The additional film 128 is not located in a center region 154 in the X direction of the resonance region 150. The width in the X direction of the additional film 128 is represented by W1, and the thickness of the additional film 128 is represented by T11.

The simulation conditions for the sample A are as follows.
Wavelength λ of the acoustic wave: 1640 nm
Piezoelectric substrate 114: Lithium niobate substrate with a thickness of 0.5λ=820 nm in which the X direction is the X-axis orientation in the crystal orientation and the Z direction is the direction obtained by rotating the Z-axis orientation to the Y-axis orientation by 105° in the Y-axis Z-axis plane
Lower electrode 112: Aluminum (Al) film with a thickness of 100 nm
Upper electrode 116: Aluminum film with a thickness of 100 nm
Width in the X direction of the resonance region 150: 30λ=49.2 μm
Width in the Y direction of the piezoelectric substrate 114: 0.5λ=820 nm
Film 131a: Silicon oxide ($SiO_2$) film with a thickness of 438 nm
Film 131b: Tungsten (W) film with a thickness of 344 nm
It is assumed that the boundaries in the Y direction infinitely continue.

The simulation conditions for the sample B are as follows.
Additional film 128: Tantalum oxide ($Ta_2O_5$)
Width W1 of the additional film 128: 0.25λ (410 nm)
Thickness T11 of the additional film 128: 40 nm Other simulation conditions are the same as those of the sample A. The thickness T11=40 nm is a thickness obtained by optimizing the thickness T11 in the case of the width W1=0.25λ.

Figure 20A:
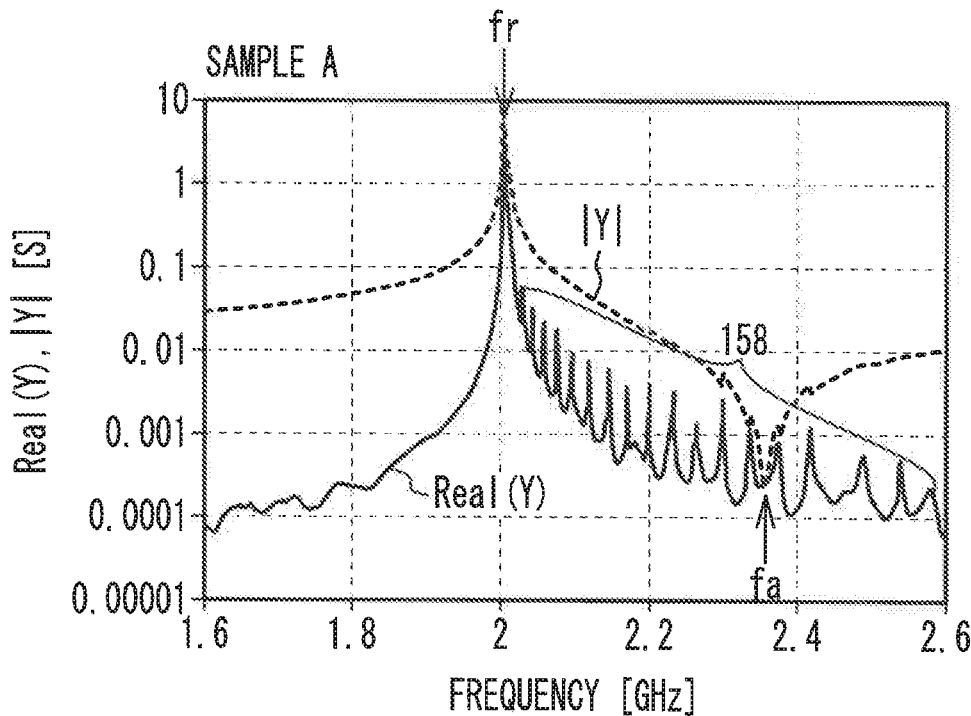
FIG. 20A and FIG. 20B are graphs of the real part Real(Y) and the absolute value |Y| of admittance versus frequency in the samples A and B, respectively.
Figure 20B:
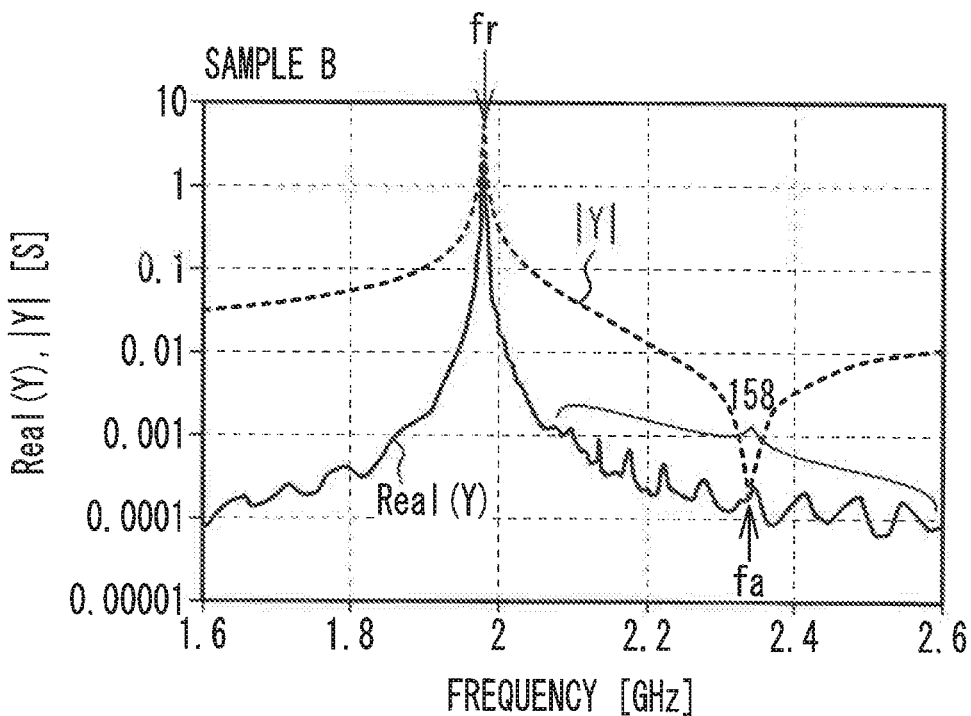

FIG. 20A and FIG. 20B are graphs of the real part Real(Y) and the absolute value |Y| of admittance versus frequency in the samples A and B, respectively. In the absolute value |Y| of admittance, the peaks of the resonant frequency and the antiresonant frequency are observed. In the real part Real(Y) of admittance, spurious is observed more clearly than that in the absolute value |Y|.

As illustrated in FIG. 20A, the resonant frequency fr is approximately 2 GHz, and the antiresonant frequency fa is approximately 2.35 GHz. In the sample A, spuriouses 158 are generated in a frequency band higher than the resonant frequency fr. The spuriouses 158 are due to the standing wave of the acoustic wave in the lateral mode mainly propagating in the X direction.

As illustrated in FIG. 20B, in the sample B, spuriouses are reduced. This is because the provision of the additional film 128 makes the acoustic velocity in the edge region 152 less than the acoustic velocity in the center region 154, and thereby, the piston mode is achieved.

As seen above, in the sample B, lateral-mode spurious is reduced. However, the width W1 of the additional film 128 is as small as 410 nm. Thus, when the additional film 128 is formed, a thin pattern needs to be formed, and thus, it is necessary to use an advanced photolithographic technique and an advanced processing technique. When the resonant frequency is 5 GHz to 6 GHz, the width W1 of the additional film 128 is approximately 100 nm, and a further advanced photolithographic technique and a further advanced processing technique are required. This leads to use of a costly manufacturing facility and increase in manufacturing cost.

Simulation 4

Samples C and D in which the width W1 of the additional film 128 is widened were subjected to simulation.

Figure 21A:
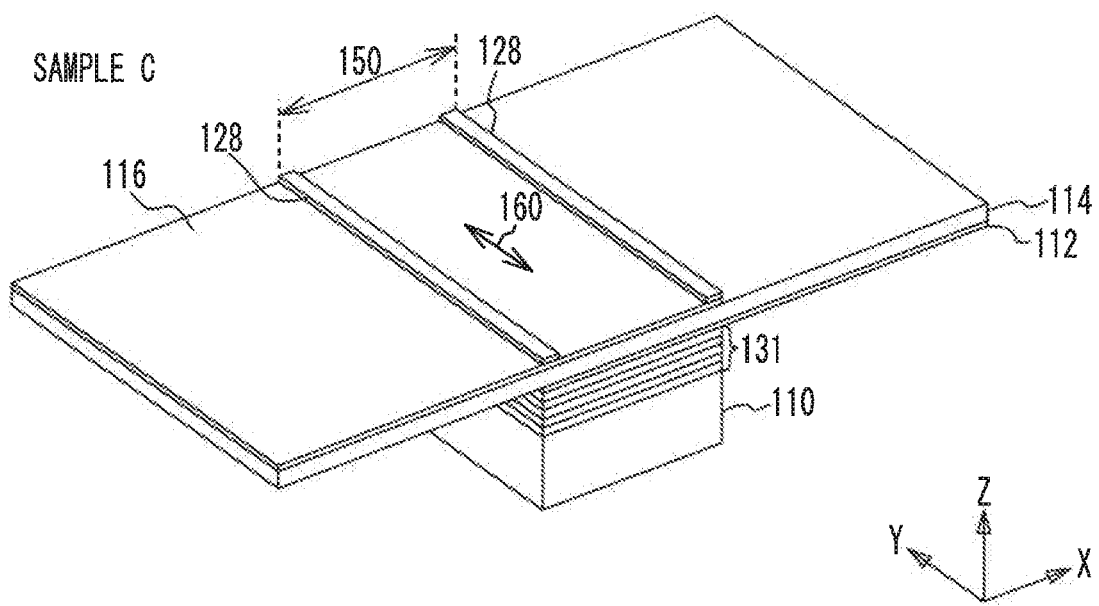
FIG. 21A and FIG. 21B are a perspective view and a cross-sectional view of a piezoelectric thin film resonator in accordance with a sample C, respectively.
Figure 21B:
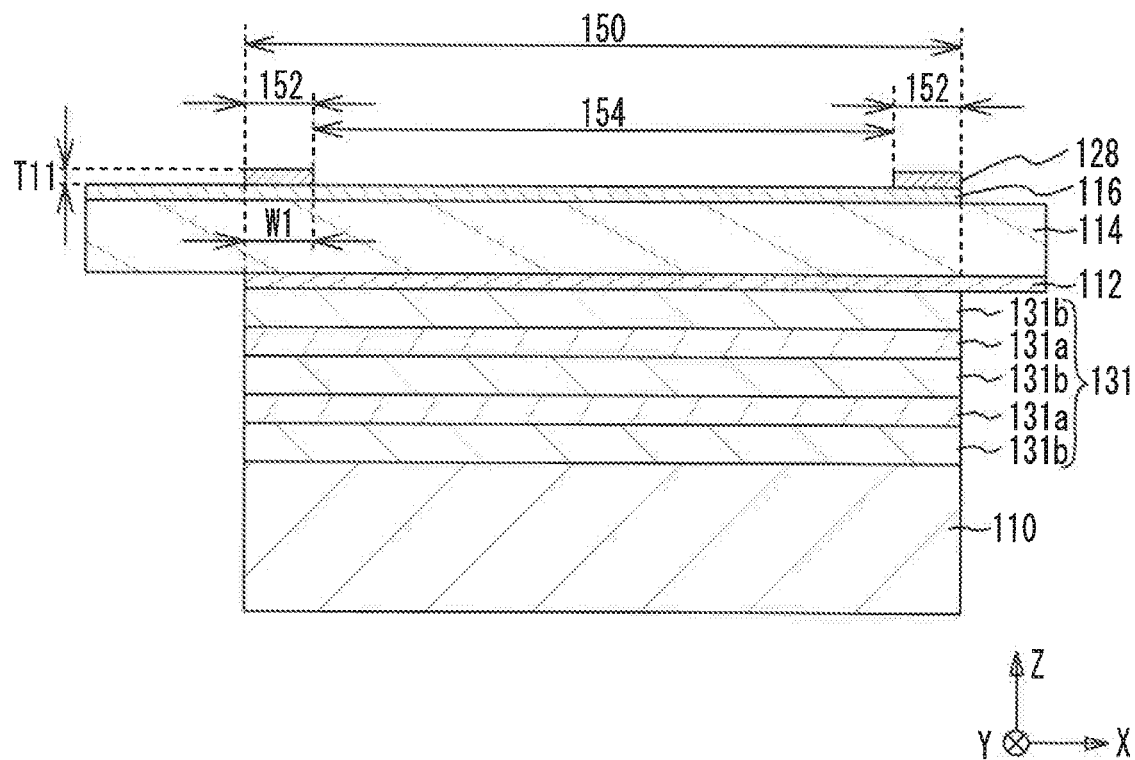

FIG. 21A and FIG. 21B are a perspective view and a cross-sectional view of a piezoelectric thin film resonator in accordance with the sample C, respectively. As illustrated in FIG. 21A and FIG. 21B, in the sample C, the width W1 of the additional film 128 is made to be greater than the width of the additional film of the sample B. Other structures are the same as those of the sample B.

Samples C1 and C2 having different widths W1 of the additional film 128 were subjected to simulation. Simulation conditions are as follows.
Sample C1
Width W1 of the additional film 128: 0.75λ (1230 nm)
Thickness T11 of the additional film 128: 10 nm
Sample C2
Width W1 of the additional film 128: 1.25λ (2050 nm)
Thickness T11 of the additional film 128: 5 nm Other simulation conditions are the same as those of the sample B. The thickness T11=10 nm is the thickness obtained by optimizing the thickness T11 in the case of the width W1=0.75λ, and the thickness T11=5 nm is the thickness obtained by optimizing the thickness T11 in the case of the width W1=1.25λ. When the width W1 of the additional film 128 is widened, spurious becomes smaller as the thickness T11 of the additional film 128 is reduced.

Figure 22A:
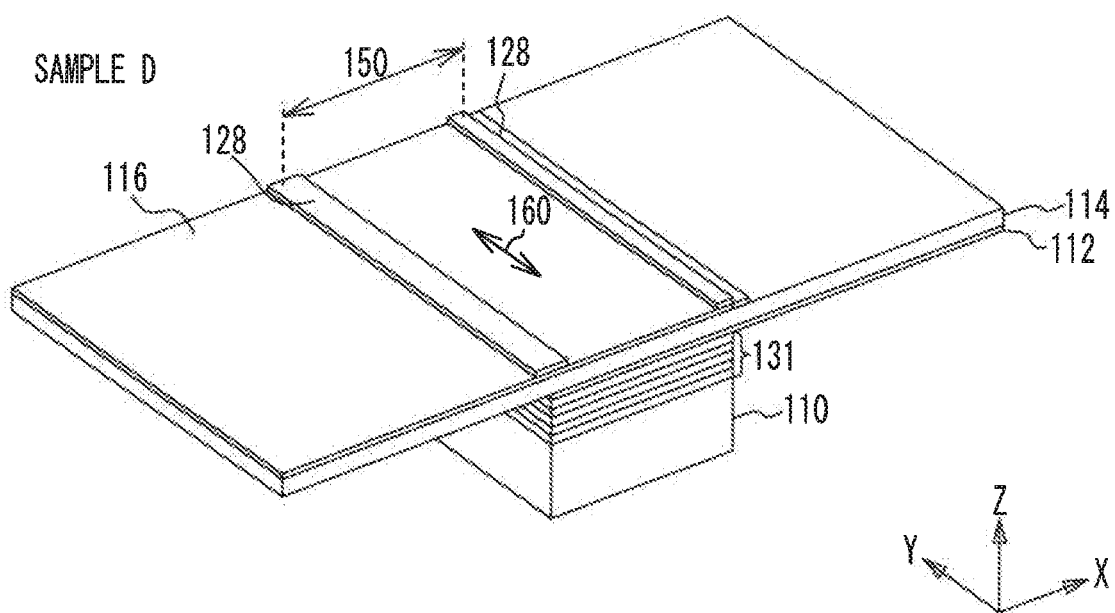
FIG. 22A and FIG. 22B are a perspective view and a cross-sectional view of a piezoelectric thin film resonator in accordance with a sample D, respectively.
Figure 22B:
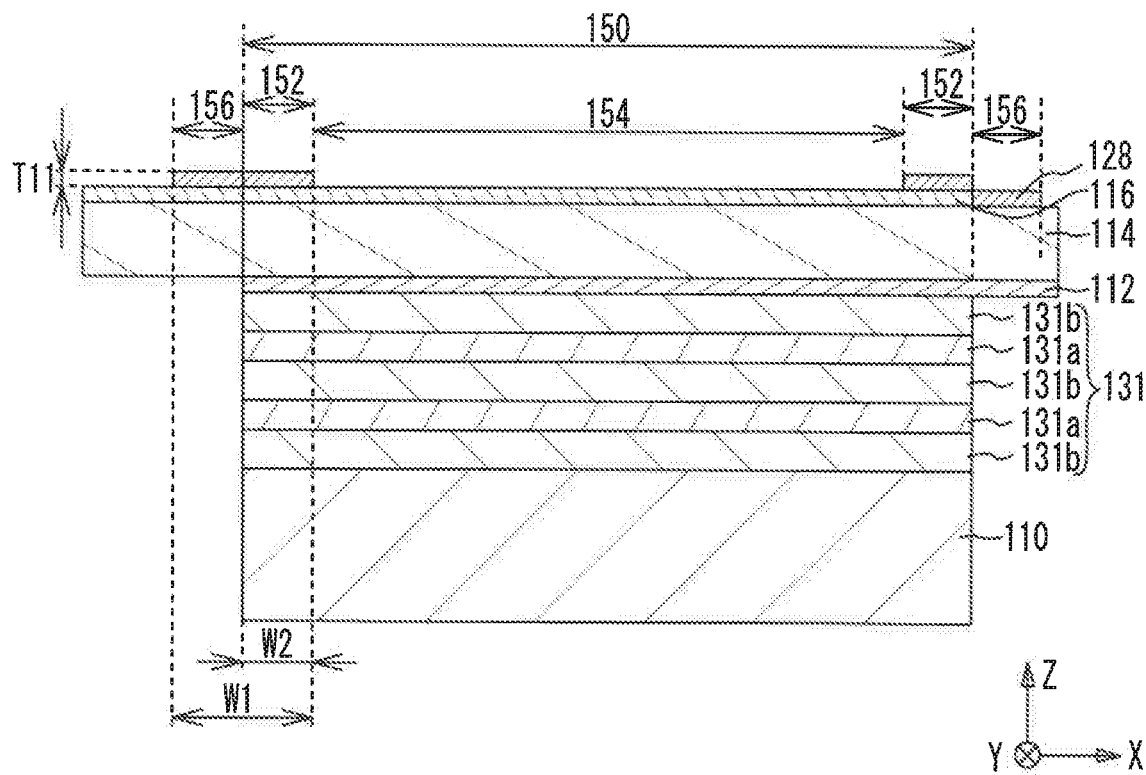

FIG. 22A and FIG. 22B are a perspective view and a cross-sectional view of a piezoelectric thin film resonator in accordance with the sample D, respectively. As illustrated in FIG. 22A and FIG. 22B, in the sample D, the additional film 128 is formed from the edge region 152 of the resonance region 150 to a region 156 outside the resonance region 150. The width of the additional film 128 within the resonance region 150 in the width W1 of the additional film 128 is represented by W2. Other structures are the same as those of the sample C.

Samples D1 and D2 having different widths W1 of the additional film 128 were subjected to simulation. Simulation conditions are as follows.
Sample D1
Width W1 of the additional film 128: 0.75λ (1230 nm)
Width W2 of the edge region 152: 0.25λ (410 nm)
Thickness T11 of the additional film 128: 35 nm
Sample D2
Width W1 of the additional film 128: 1.25λ (2050 nm)
Width W2 of the edge region 152: 0.25λ (410 nm)
Thickness T11 of the additional film 128: 35 nm
Other simulation conditions are the same as those of the sample C. The thickness T11=35 nm is the thickness obtained by optimizing the thickness T11 in the cases of the width W1=0.75λ and 1.25λ.

Figure 23A:
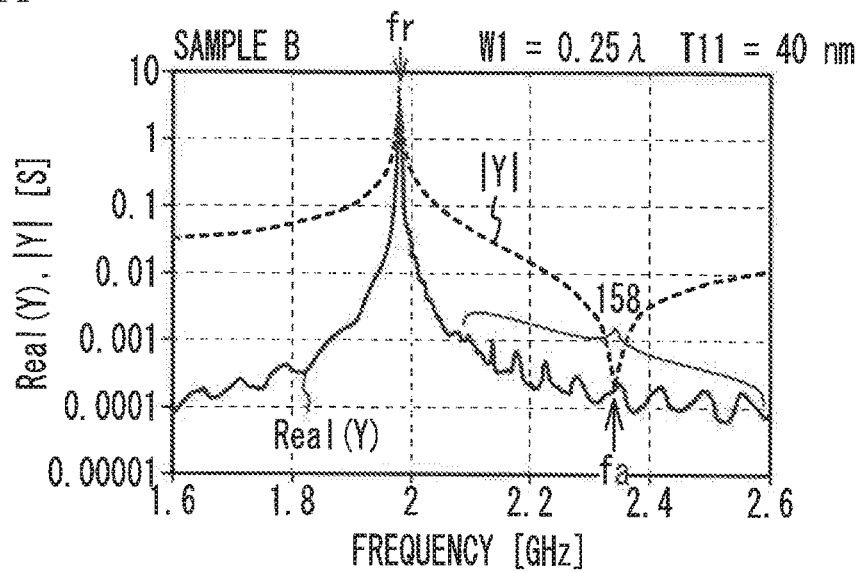
FIG. 23A through FIG. 23C are graphs of the real part Real(Y) and the absolute value |Y| of admittance versus frequency in samples B, C1, and C2, respectively.
Figure 23B:
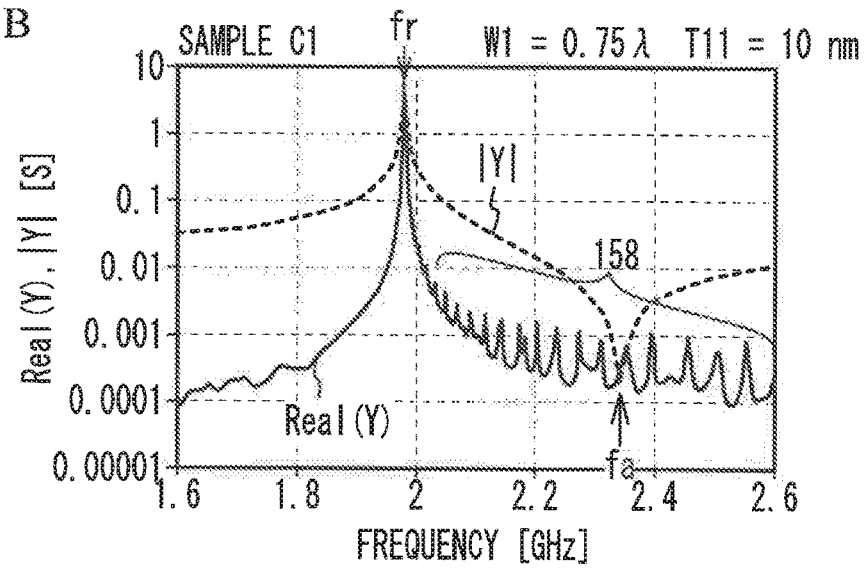
Figure 23C:
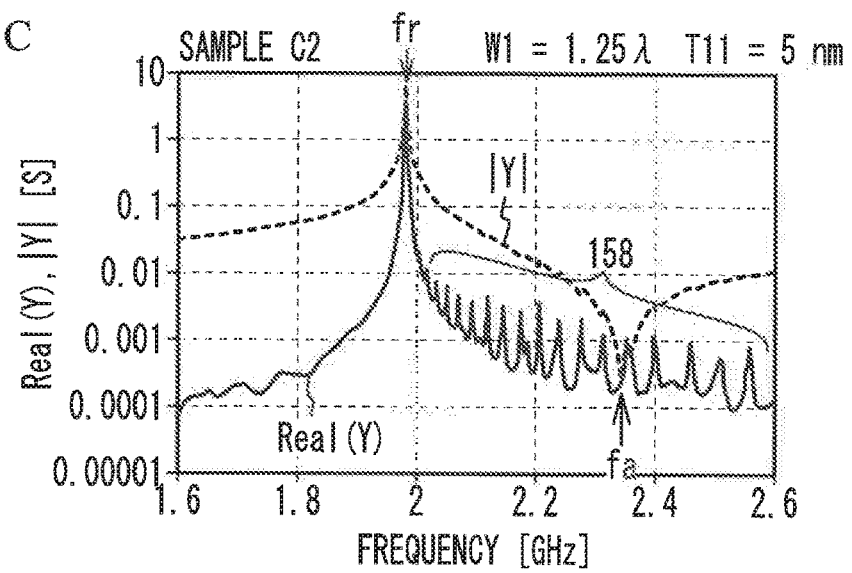

FIG. 23A through FIG. 23C are graphs of the real part Real(Y) and the absolute value |Y| of admittance versus frequency in the samples B, C1, and C2, respectively. FIG. 23A is substantially the same as FIG. 20B.

As illustrated in FIG. 23B and FIG. 23C, in the samples C1 and C2, the spurious 158 is larger than that in the sample B. As seen above, when the width W1 of the additional film 128 is widened, the spurious 158 becomes larger than that in the sample B even when the thickness T11 is optimized.

Figure 24A:
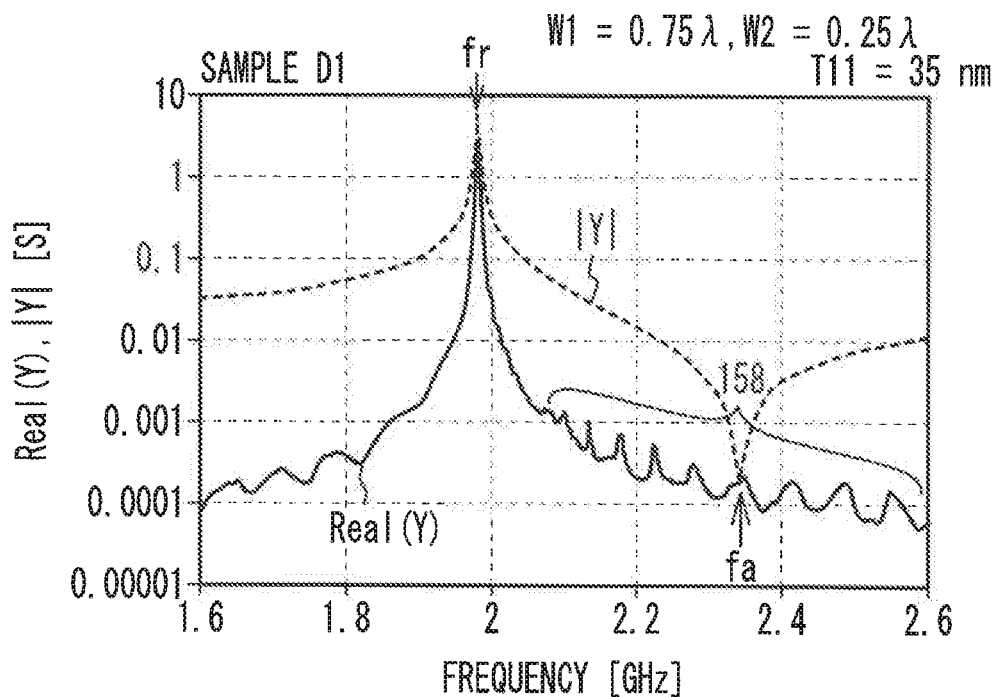
FIG. 24A and FIG. 24B are graphs of the real part Real(Y) and the absolute value |Y| of admittance versus frequency in samples D1 and D2, respectively.
Figure 24B:
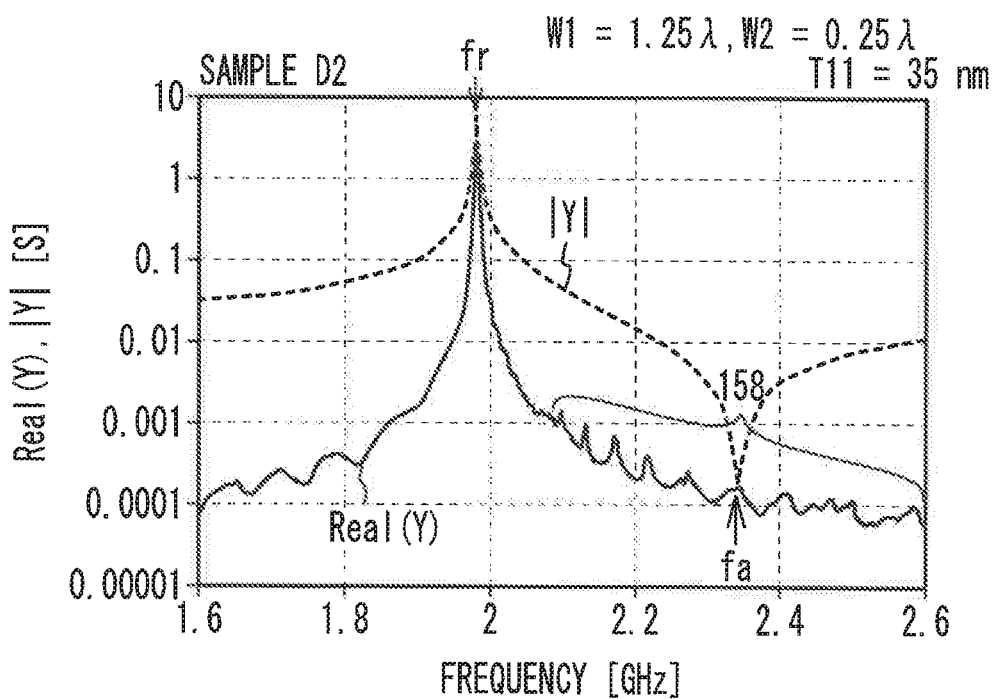

FIG. 24A and FIG. 24B are graphs of the real part Real(Y) and the absolute value |Y| of admittance versus frequency in the samples D1 and D2, respectively.

As illustrated in FIG. 24A and FIG. 24B, in the samples D1 and D2, the spurious 158 is substantially the same as that in the sample B. As seen above, even when the width W1 of the additional film 128 is widened, the additional film 128 is provided from the edge region 152 to the region 156 outside the resonance region 150 to make the width W2 of the additional film 128 within the edge region 152 substantially the same as the width W1 of the additional film 128 of the sample B. This structure allows the spurious 158 to be substantially the same as that in the sample B.

Since the width W1 of the additional film 128 is wide, advanced photolithographic technique and processing technique are not required, and the additional film 128 can be formed with use of an inexpensive manufacturing device. Thus, the manufacturing cost is reduced.

Simulation 5

A sample D3 was subjected to simulation. Simulation conditions are as follows.

Sample D3

Width W1 of the additional film 128: 0.75λ (1230 nm)
Width W2 of the edge region 152: 0.25λ (410 nm)
Thickness T11 of the additional film 128: 40 nm Unlike the sample D1, the thickness T11 of the additional film 128 of the sample D3 is the same as that of the sample B.

Figure 25A:
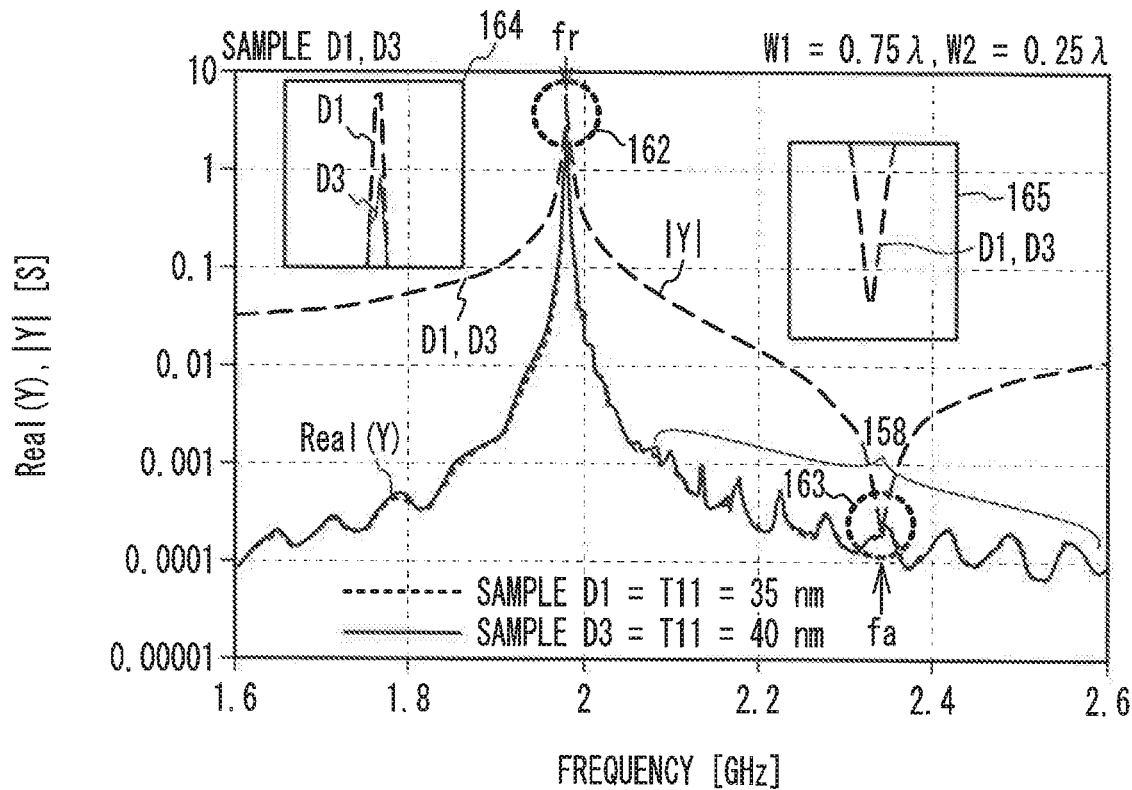
FIG. 25A is a graph of the real part Real(Y) and the absolute value |Y| of admittance versus frequency in samples D1 and D3.
Figure 25B:
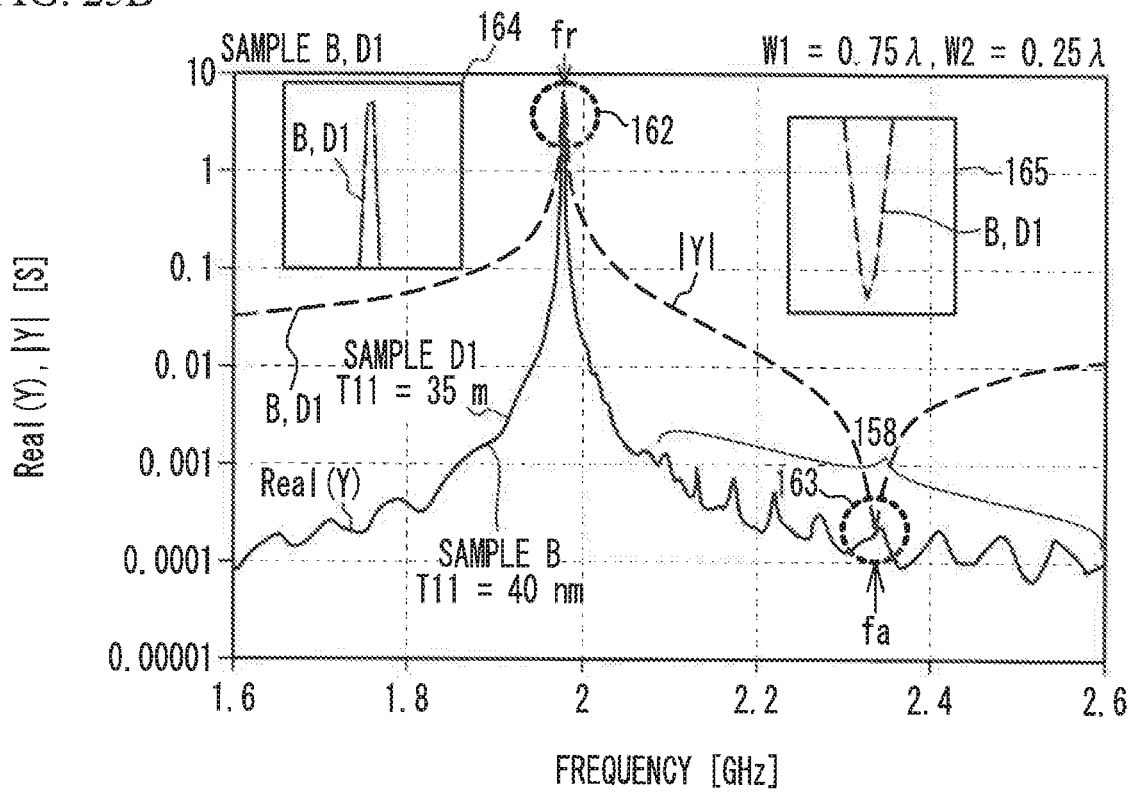
FIG. 25B is a graph of the real part Real(Y) and the absolute value |Y| of admittance versus frequency in the samples B and D1.

FIG. 25A is a graph of the real part Real(Y) and the absolute value |Y| of admittance versus frequency in the samples D1 and D3, and FIG. 25B is a graph of the real part Real(Y) and the absolute value |Y| of admittance versus frequency in the samples B and D1. An inset 164 is an enlarged view of |Y| in the vicinity 162 of the resonant frequency fr, and an inset 165 is an enlarged view of |Y| in the vicinity 163 of the antiresonant frequency fa.

As illustrated in FIG. 25A, between the samples D1 and D3, the admittance characteristics are substantially the same, and the magnitude of the spurious 158 is substantially the same. As presented in the inset 164, around the resonant frequency fr, |Y| of the sample D1 is greater than |Y| of the sample D3. As presented in the inset 165, around the antiresonant frequency fa, |Y| is substantially the same between the samples D1 and D3.

As illustrated in FIG. 25B, between the samples B and D1, the admittance characteristics are substantially the same, and the magnitude of the spurious 158 is also substantially the same. As clear from the insets 164 and 165, |Y| is substantially the same between the samples B and D1 around the resonant frequency fr and the antiresonant frequency fa.

As described above, in the sample D, when the thickness T11 of the additional film 128 is made to be the optimal thickness T11 of the additional film 128 of the sample B as in the sample D3, the steepness of the peak of |Y| around the resonant frequency fr becomes small. When the thickness T11 of the additional film 128 is made to be less than the optimal thickness T11 of the additional film 128 of the sample B as in the sample D1, the steepness of the peak of |Y| around the resonant frequency fr is approximately equal to that of the sample B. As described above, the optimal thickness T11 of the additional film 128 in the sample D is less than the optimal thickness T11 in the sample B.

As clear from the above simulations, in the sample D, spurious is reduced to the same level as the sample B, and the width W1 of the additional film 128 can be increased. Hereinafter, an embodiment based on the above finding will be described.

Second Embodiment

Figure 26A:
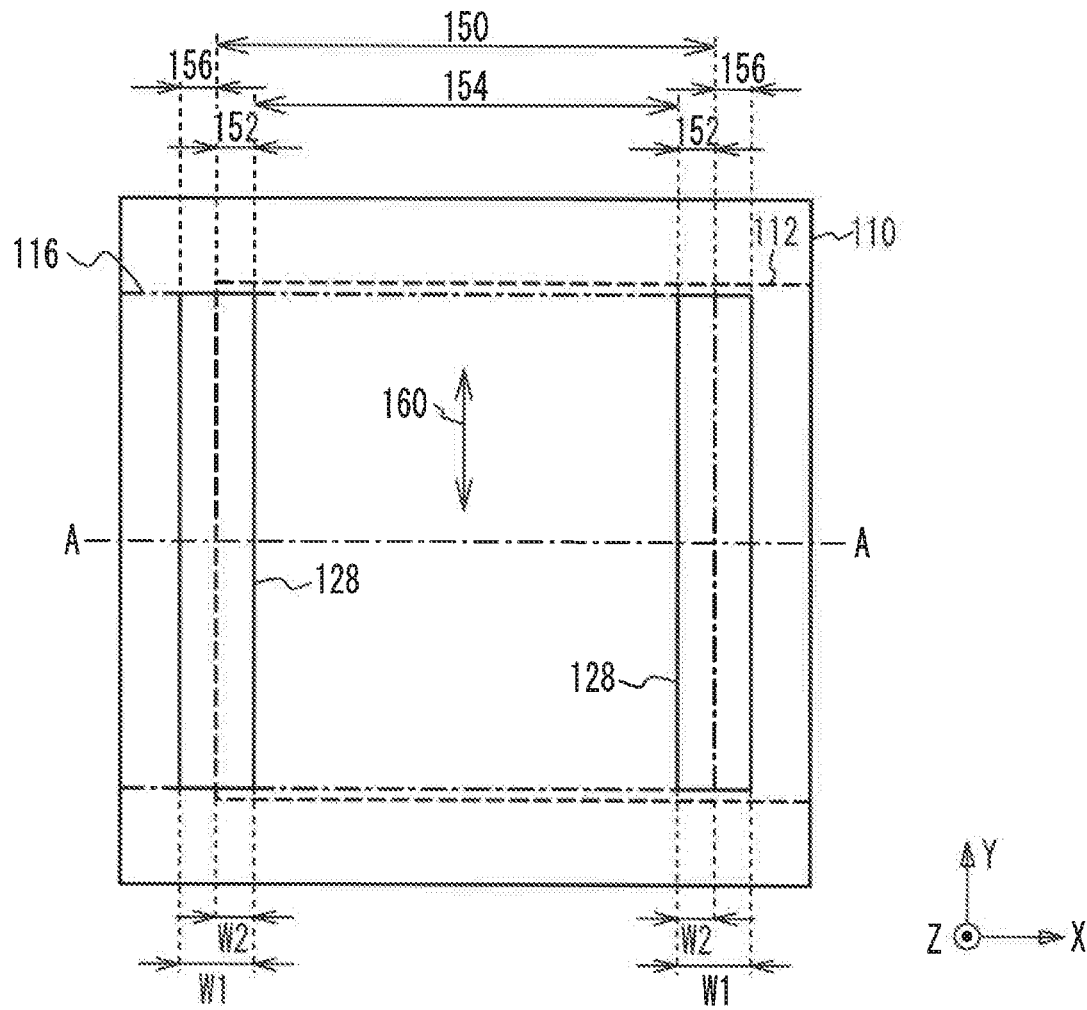
FIG. 26A is a plan view of a piezoelectric thin film resonator in accordance with a second embodiment.
Figure 26B:
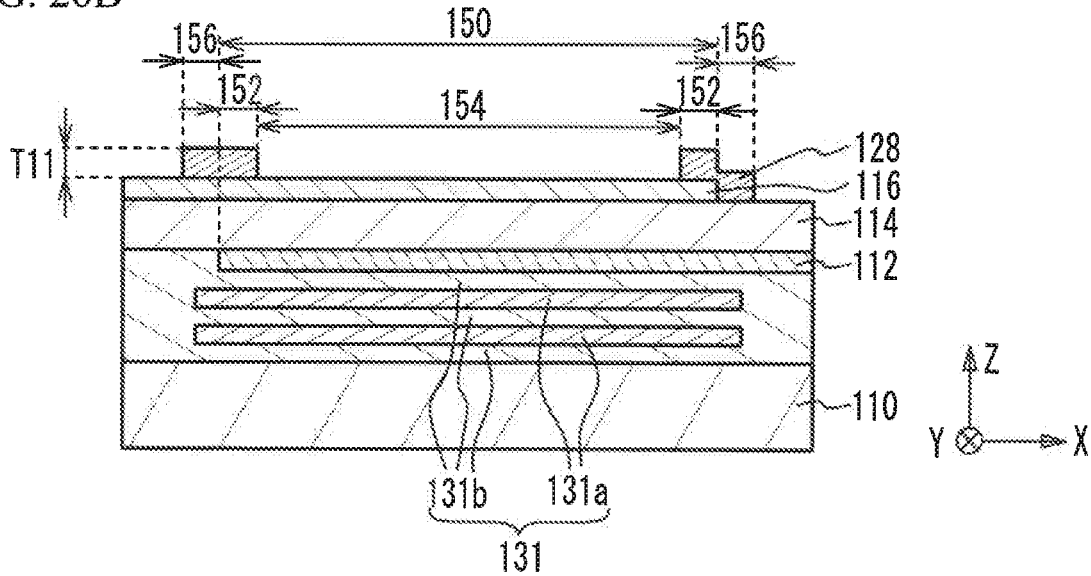
FIG. 26B is a cross-sectional view taken along line A-A in FIG. 26A.

FIG. 26A is a plan view of a piezoelectric thin film resonator in accordance with a second embodiment, and FIG. 26B is a cross-sectional view taken along line A-A in FIG. 26A. As illustrated in FIG. 26A and FIG. 26B, the acoustic mirror 131 is located on the substrate 110. The number of the films 131a and the films 131b that are stacked is freely selected. It is sufficient if the acoustic mirror 131 has a structure in which at least two layers with different acoustic characteristics are stacked at an interval. The substrate 110 may be one of the two layers having different acoustic characteristics of the acoustic mirror 131. For example, the acoustic mirror 131 may have a structure in which a film having acoustic impedance different from that of the substrate 110 is provided in the substrate 110.

The lower electrode 112 is located on the acoustic mirror 131. The piezoelectric substrate 114 is located on the lower electrode 112. The upper electrode 116 is located on the piezoelectric substrate 114. The resonance region 150 overlaps with the acoustic mirror 131 in plan view, and the acoustic mirror 131 is the same as the resonance region 150 in size or is larger than the resonance region 150.

The planar shape of the resonance region 150 is rectangular. A pair of sides among the four sides of the rectangle extends substantially in the Y direction, and another pair of sides extends in the X direction. The edge regions 152 are located on both sides in the X direction of the center region 154 of the resonance region 150. The edge region 152 extends substantially in the Y direction. The width W2 in the X direction of the edge region 152 is substantially constant in the Y direction. The regions 156 adjacent to the edge regions 152 are located outside the resonance region 150. The width of the region 156 is substantially constant in the Y direction. The additional film 128 having a thickness T11 is located on the upper electrode 116 in the edge regions 152 and on the upper electrode 116 and the piezoelectric substrate 114 in the regions 156. No additional film 128 is located in the center region 154 sandwiched between the edge regions 152 of the resonance region 150.

The substrate 110 is, for example, a silicon substrate, a sapphire substrate, an alumina substrate, a spinel substrate, a quartz substrate, a crystal substrate, a glass substrate, a ceramic substrate, or a GaAs substrate. The lower electrode 112 and the upper electrode 116 are formed of a single-layer film made of, for example, ruthenium, chrome (Cr), aluminum (Al), Ti, copper (Cu), molybdenum (Mo), tungsten (W), tantalum (Ta), platinum (Pt), rhodium (Rh), or iridium (Ir) or a multilayered film including at least two of them that are stacked. The additional film 128 is preferably made of a material having a high density, and is mainly composed of, for example, tantalum oxide ($TaO_x$), niobium oxide ($NbO_x$), or tungsten oxide ($WO_x$). The additional film 128 may be a metal film listed as an example of the material forming the lower electrode 112 and the upper electrode 116, or an insulating film such as a silicon oxide film, a silicon nitride film, or an aluminum oxide film. The material of the additional film 128 may be the same as the materials of the lower electrode 112 and the upper electrode 116, or may be different from the materials of the lower electrode 112 and the upper electrode 116.

Figure 27A:
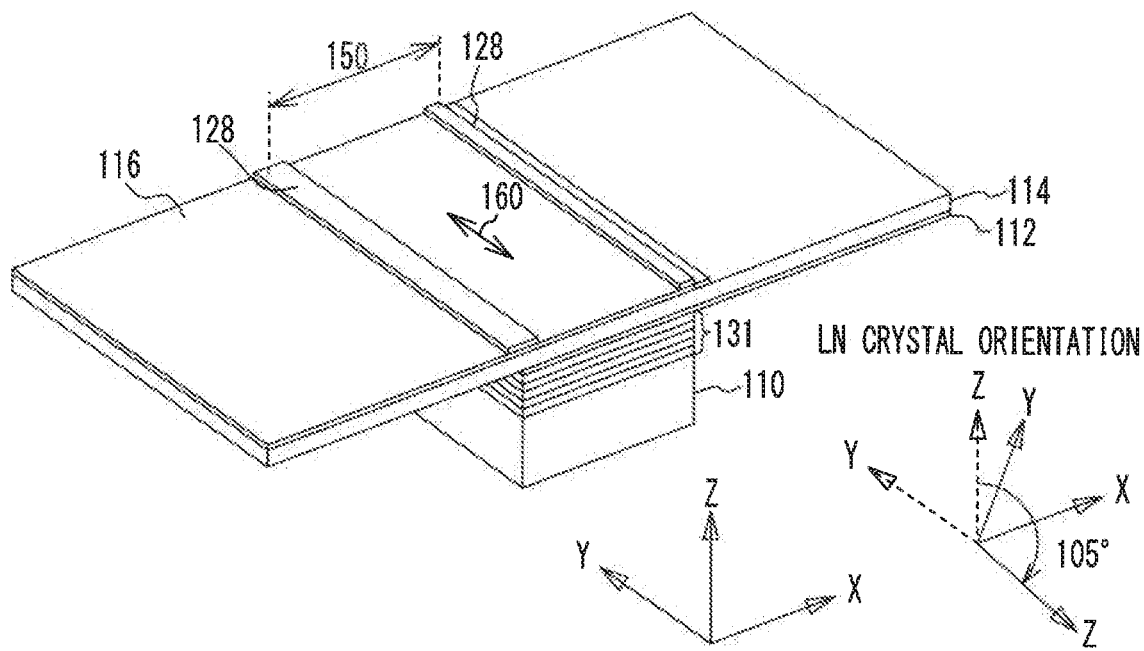
FIG. 27A and FIG. 27B are perspective views illustrating the crystal orientations of a piezoelectric substrate in the second embodiment.
Figure 27B:
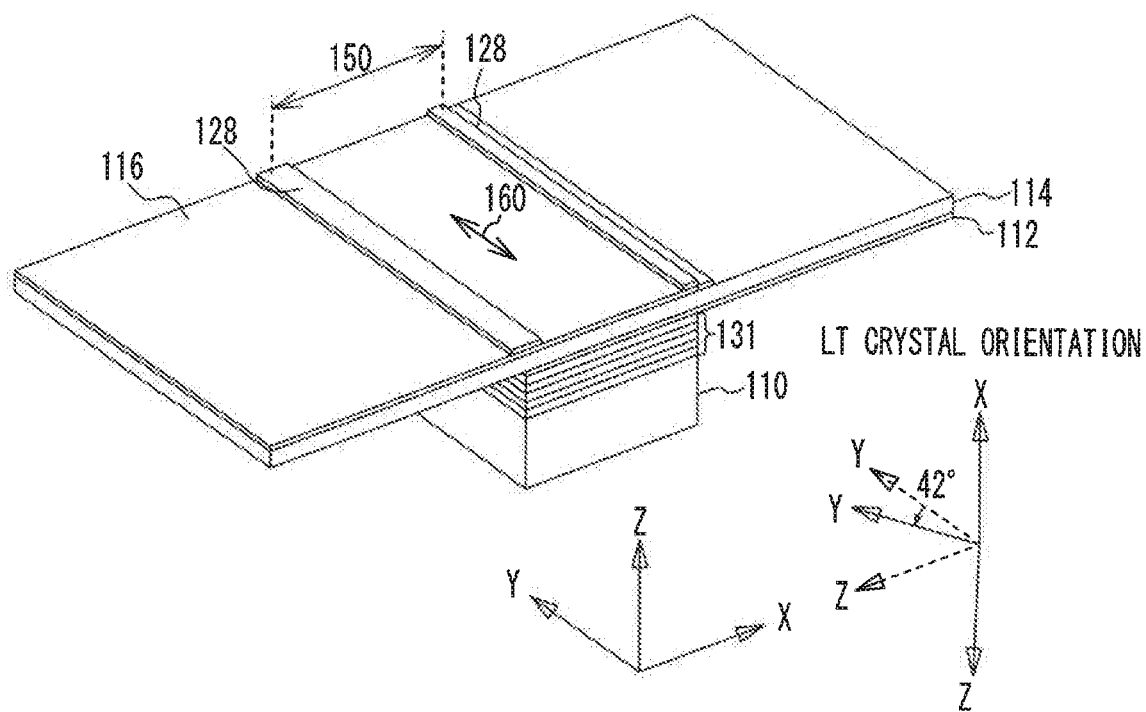

FIG. 27A and FIG. 27B are perspective views illustrating the crystal orientations of the piezoelectric substrate 114 in the second embodiment. FIG. 27A is a perspective view illustrating a case where the piezoelectric substrate 114 is a monocrystalline lithium niobate substrate. As illustrated in FIG. 27A, when the piezoelectric substrate 114 is made of lithium niobate (LN), as indicated by dashed line arrows of the crystal orientations, the X direction, the Y direction, and the Z direction are made to be the positive X-axis orientation, the positive Y-axis orientation, and the positive Z-axis orientation of the crystal orientations, respectively. Then, the positive Y-axis orientation and the positive Z-axis orientation are rotated around the X-axis orientation from the positive Y-axis orientation to the positive Z-axis orientation by 105° in the Y-axis Z-axis plane. The Y-axis orientation and the Z-axis orientation after rotation are indicated by solid line arrows. Such rotation causes the Z direction to be the direction obtained by rotating the positive Z-axis orientation to the positive Y-axis orientation by 105°. In this case, the Y direction corresponds to the direction 160 of the thickness shear vibration.

FIG. 27B is a perspective view illustrating a case where the piezoelectric substrate 114 is a monocrystalline lithium tantalate substrate. As illustrated in FIG. 27B, when the piezoelectric substrate 114 is made of lithium tantalate (LT), as indicated by dashed line arrows of the crystal orientations, the X direction, the Y direction, and the Z direction are made to be the negative Z-axis orientation, the positive Y-axis orientation, and the positive X-axis orientation of the crystal orientations, respectively. Then, the positive Y-axis orientation and the positive Z-axis orientation are rotated around the X-axis orientation from the positive Y-axis orientation to the positive Z-axis orientation by 42° in the Y-axis Z-axis plane. The Y-axis orientation and the Z-axis orientation after rotation are indicated by solid line arrows. Such rotation causes the Y direction to be the direction obtained by rotating the positive Y-axis orientation to the negative Z-axis orientation by 42°. In this case, the Y direction corresponds to the direction 160 of the thickness shear vibration.

In the second embodiment, as with the sample D, spurious is reduced, and the width W1 of the additional film 128 can be made to be wide.

First Variation of the Second Embodiment

Figure 28:
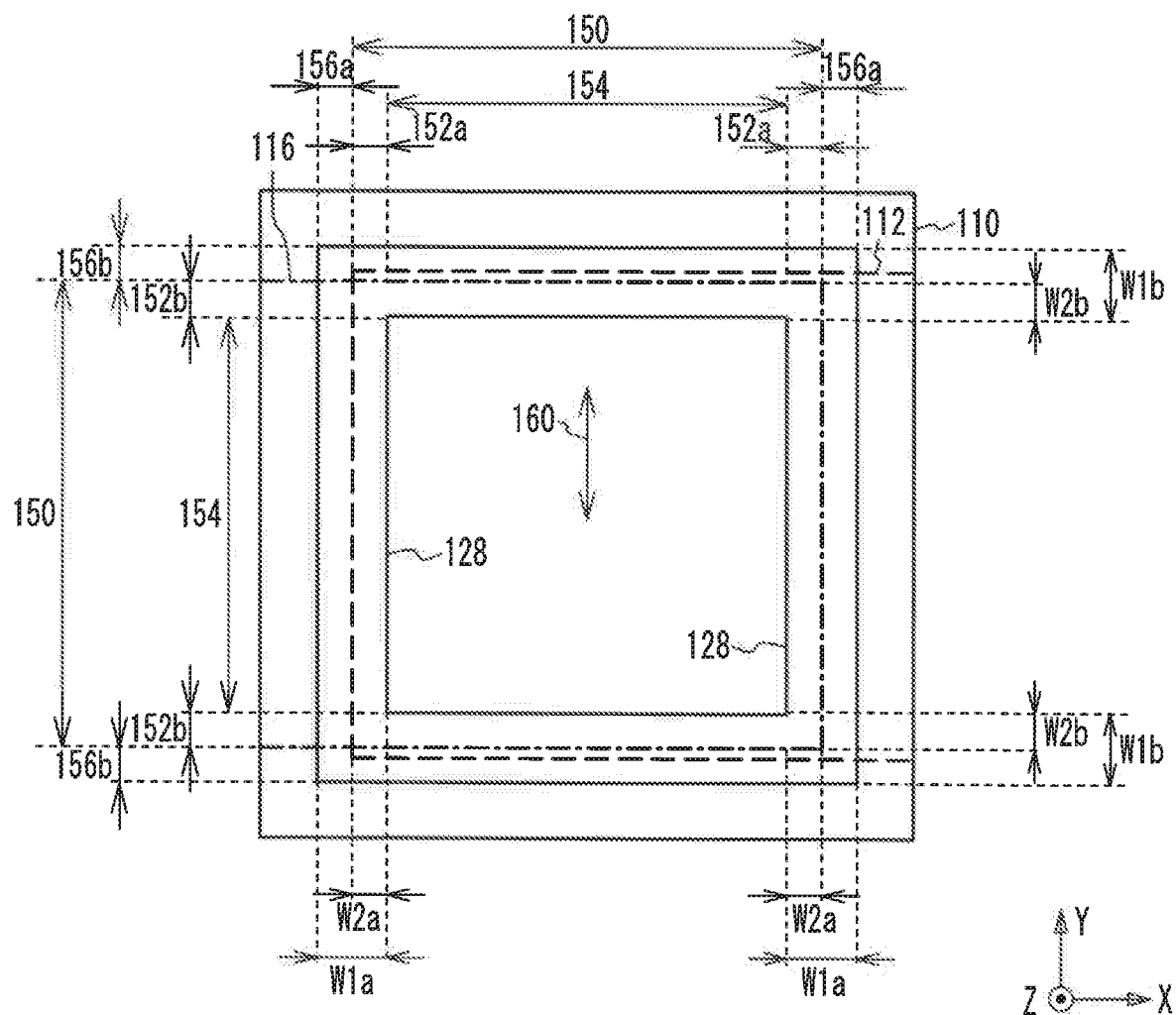
FIG. 28 is a plan view of a piezoelectric thin film resonator in accordance with a first variation of the second embodiment.

FIG. 28 is a plan view of a piezoelectric thin film resonator in accordance with a first variation of the second embodiment. As illustrated in FIG. 28, in the first variation of the second embodiment, the additional film 128 is located in edge regions 152a located in both ends in the X direction of the resonance region 150 and in regions 156a located further out than the edge regions 152a. Furthermore, the additional film 128 is located in edge regions 152b located in both ends in the Y direction of the resonance region 150, and in regions 156b located further out than the edge region 152b. Accordingly, the additional film 128 is located in the edge regions 152a and 152b surrounding the center region 154 and in the regions 156a and 156b. The width W1a in the X direction of the additional film 128 may be substantially equal to the width W1b in the Y direction of the additional film 128, or may be different from the width W1b in the Y direction of the additional film 128. The width W2a of the edge region 152a may be substantially equal to the width W2b of the edge region 152b, or may be different from the width W2b of the edge region 152b. Other structures are the same as those of the second embodiment, and the description thereof is thus omitted. In the first variation of the second embodiment, lateral-mode spurious due to the acoustic wave propagating in the X direction and the Y direction is reduced.

Second Variation of the Second Embodiment

Figure 29:
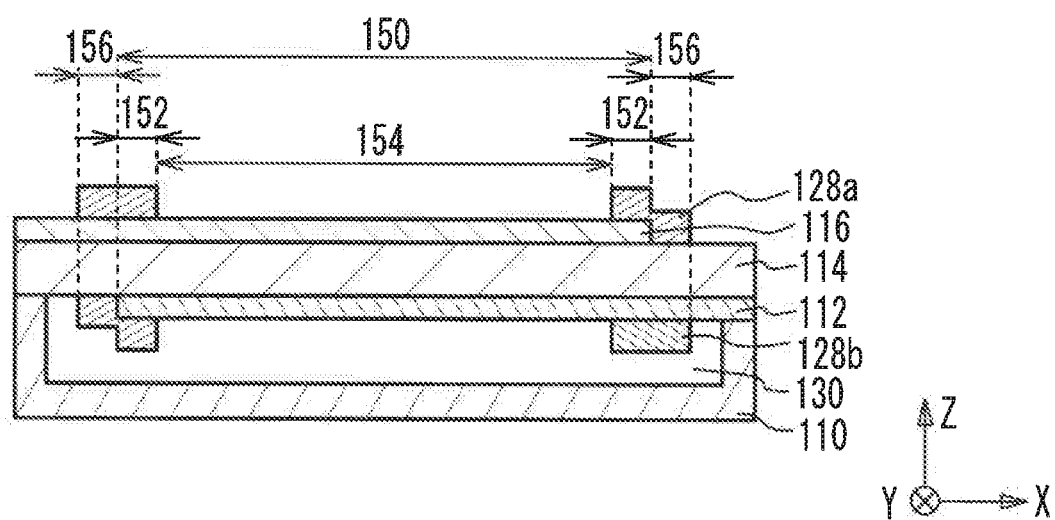
FIG. 29 is a cross-sectional view of a piezoelectric thin film resonator in accordance with a second variation of the second embodiment.

FIG. 29 is a cross-sectional view of a piezoelectric thin film resonator in accordance with a second variation of the second embodiment. As illustrated in FIG. 29, in the second variation of the second embodiment, an air gap 130 is provided instead of the acoustic mirror 131. An additional film 128a is located on the upper electrode 116 in the edge regions 152 and on the upper electrode 116 and the piezoelectric substrate 114 in the regions 156, and an additional film 128b is located under the lower electrode 112 in the edge regions 152 and under the lower electrode 112 and the piezoelectric substrate 114 in the regions 156. The additional film 128a and the additional film 128b may have substantially the same width, or may have different widths. The additional film 128a and the additional film 128b may have substantially the same thickness, or may have different thicknesses. The main components of the additional film 128a and the additional film 128b may be the same or may be different. Other structures are the same as those of the first variation of the second embodiment, and the description thereof is thus omitted.

In the second embodiment and the first variation thereof, when the acoustic mirror 131 is provided under the lower electrode 112, the additional film 128 may be provided under the lower electrode 112 and the piezoelectric substrate 114 or both under the lower electrode 112 and the piezoelectric substrate 114 and on the upper electrode 116 and the piezoelectric substrate 114. In the second variation of the second embodiment, when the air gap 130 is provided under the lower electrode 112, the additional film 128 may be provided in one of the following locations: under the lower electrode 112 and the piezoelectric substrate 114 and on the upper electrode 116 and the piezoelectric substrate 114, and may not be necessarily provided in the other of the above locations.

A case where the planar shape of the resonance region 150 is substantially rectangular has been described, but the planar shape of the resonance region 150 may be substantially elliptical, substantially circular, or substantially polygonal. It is sufficient if the additional film 128 is located in a part of the region surrounding the center region 154. The center region 154 is a region including the center (for example, the center of gravity) of the resonance region 150.

In the second embodiment and the variations thereof, the lower electrode 112 and the upper electrode 116 (a pair of electrodes) sandwich the piezoelectric substrate 114, and excites the thickness shear vibration in the piezoelectric substrate 114. The additional film 128 is not provided in the center region 154 of the resonance region 150 where the lower electrode 112 and the upper electrode 116 overlap in plan view while sandwiching at least a part of the piezoelectric substrate 114, and is provided from at least a part of the edge region 152 surrounding the center region 154 to the region 156 outside the resonance region 150. This structure reduces spurious to the same level as the sample B as in the sample D of the simulation 4, and decreases the width W1 of the additional film 128. Thus, the production cost is reduced.

The additional film 128 is provided to the opposite side of at least one of the lower electrode 112 and the upper electrode 116 from the piezoelectric substrate 114. This structure reduces spurious.

The additional film 128 is in contact with at least one of the lower electrode 112 and the upper electrode 116 in the resonance region 150, and is in contact with at least one of the lower electrode 112 and the upper electrode 116 or the piezoelectric substrate 114 in the outside of the resonance region 150. This structure reduces spurious.

As clear from the comparison between the samples D1 and D3 of the simulation 5, the thickness T11 of the additional film 128 is less than the thickness (the thickness of the additional film of the sample B) of a virtual film (the additional film of the sample B) that most reduces lateral-mode spurious under the assumption that the virtual film made of the same material as the additional film 128 is provided in the edge region 152 and is not provided in the center region 154 or the region 156 outside the resonance region 150. This structure makes the resonance characteristics substantially the same as those of the sample B as illustrated in FIG. 25A.

The additional film 128 is provided from the edge regions 152 located in both ends of the resonance region 150 in the direction perpendicular to the direction 160 of the thickness shear vibration to the outside of the resonance region 150. This structure reduces spurious.

In the second embodiment, the additional film 128 is provided from the edge regions 152 located in both ends of the resonance region 150 in the X direction (a first direction) of the planar directions of the piezoelectric substrate 114 to the regions 156 outside the resonance region 150, and is not provided in the edge regions located in both ends of the resonance region 150 in the Y direction (a second direction intersecting with the first direction) of the planar directions. As described above, the additional film 128 is provided in the direction in which the standing wave of the acoustic wave in the lateral mode becomes a problem, and may not be necessarily provided in other directions. In the second embodiment, the additional film 128 is located in both ends of the resonance region 150 in the direction perpendicular to the direction 160 of the thickness shear vibration, but the additional film 128 may be located in both ends of the resonance region 150 in a desired direction. Since spurious is likely to occur in the direction 160 of the thickness shear vibration and the direction perpendicular to the direction 160, the additional film 128 is preferably provided in both ends of the resonance region 150 in the direction 160 of the thickness shear vibration and/or the direction perpendicular to the direction 160.

As in the first variation of the second embodiment, the additional film 128 preferably overlaps with the entire boundary between the edge region 152 surrounding the center region 154 and the outside of the resonance region 150 in plan view. This structure further reduces spurious. It is preferable that the planar shape of the resonance region 150 is made to be substantially rectangular, and the four sides of the rectangle extend in the direction 160 and the direction perpendicular to the direction 160, and the additional film 128 is provided to the four sides. This structure further reduces spurious.

When the piezoelectric substrate 114 is a monocrystalline lithium niobate substrate, the piezoelectric substrate 114 is a rotated Y-cut lithium niobate substrate. In this case, the normal direction of the upper surface of the piezoelectric substrate 114 (the Z direction) is the direction in the Y-axis Z-axis plane. Thus, the thickness shear vibration is generated in the planar direction of the piezoelectric substrate 114. The angle between the X-axis orientation and the planar direction of the piezoelectric substrate 114 is preferably within a range of ±5°, more preferably within a range of ±1°.

The normal direction of the upper surface of the piezoelectric substrate 114 (the Z direction) is made to be the direction obtained by rotating the positive Z-axis orientation to the positive Y-axis orientation of the crystal orientations by 105°, This configuration makes the direction 160 of the thickness shear vibration and the direction perpendicular to the direction 160 correspond to the planar directions of the piezoelectric substrate 114. The angle between the Z direction and the direction obtained by rotating the positive Z-axis orientation to the positive Y-axis orientation by 105° is preferably within a range of ±5°, more preferably within a range of ±1

When the piezoelectric substrate 114 is a monocrystalline lithium tantalate substrate, the piezoelectric substrate 114 is an X-cut lithium tantalate substrate. In this case, the normal direction of the upper surface of the piezoelectric substrate 114 (the Z direction) is the X-axis orientation. Accordingly, the thickness shear vibration is generated in the planar direction of the piezoelectric substrate 114. The angle between the X-axis orientation and the normal direction of the piezoelectric substrate 114 is preferably within a range of ±5°, more preferably within a range of ±1°.

The direction obtained by rotating the positive Y-axis orientation to the negative Z-axis orientation of the crystal orientations by 42° is made to be the Y direction of the piezoelectric substrate 114. This configuration makes the direction obtained by rotating the positive Y-axis orientation to the negative Z-axis orientation by 42° among the planar directions of the piezoelectric substrate 114 correspond to the direction 160 of the thickness shear vibration.

Third Embodiment

Figure 30A:
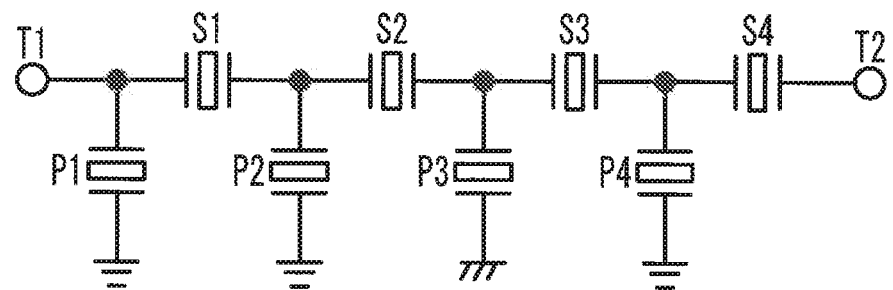
FIG. 30A is a circuit diagram of a filter in accordance with a third embodiment.

A third embodiment is an exemplary filter and an exemplary duplexer including the piezoelectric thin film resonator according to any one of the first and second embodiments and the variations thereof, FIG. 30A is a circuit diagram of a filter in accordance with a third embodiment. As illustrated in FIG. 30A, one or more series resonators S1 through S4 are connected in series between an input terminal T1 and an output terminal T2. One or more parallel resonators P1 through P4 are connected in parallel between the input terminal T1 and the output terminal T2. At least one of the one or more series resonators S1 through S4 and the one or more parallel resonators P1 through P4 may be the piezoelectric thin film resonator according to any one of the first and second embodiments and the variations thereof. The number of resonators in the ladder-type filter can be freely selected.

Figure 30B:
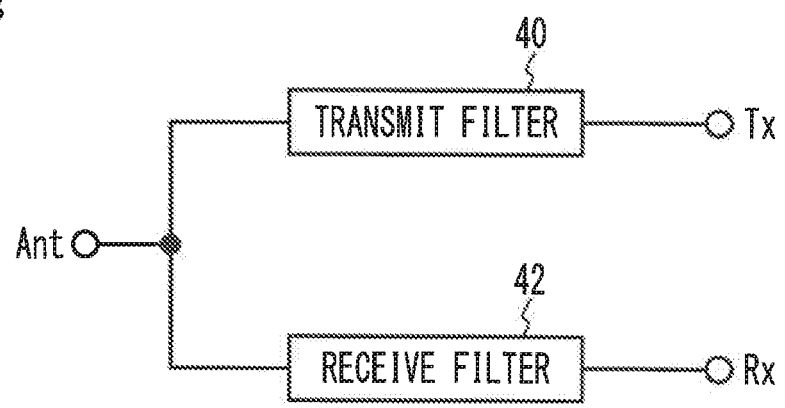
FIG. 30B is a circuit diagram of a duplexer in accordance with a first variation of the third embodiment.

FIG. 30B is a circuit diagram of a duplexer in accordance with a first variation of the third embodiment. As illustrated in FIG. 30B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. At least one of the transmit filter 40 and the receive filter 42 may be the filter of the third embodiment.

The duplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:
1. An acoustic wave device comprising:
a piezoelectric substrate;
a pair of electrodes sandwiching the piezoelectric substrate and exciting a thickness shear vibration in the piezoelectric substrate;
an edge region that is a region surrounding a center region of a resonance region and is in an edge portion of the resonance region, the resonance region being a region where the pair of electrodes faces each other across at least a part of the piezoelectric substrate;
a first region that is a part of the edge region and is located on both sides of the center region in a first direction that is substantially parallel to a displacement direction of a thickness shear vibration that is a primary mode in the piezoelectric substrate, an acoustic velocity of an acoustic wave in the piezoelectric substrate in the first region being less than an acoustic velocity of an acoustic wave in the piezoelectric substrate in the center region; and
a second region that is a part of the edge region and is located on both sides of the center region in a second direction substantially perpendicular to the first direction, a width in the second direction of the second region being different from a width in the first direction of the first region, an acoustic velocity of an acoustic wave in the piezoelectric substrate in the second region being less than the acoustic velocity of the acoustic wave in the piezoelectric substrate in the center region.

2. The acoustic wave device according to claim 1, wherein the width in the second direction of the second region is less than the width in the first direction of the first region.

3. The acoustic wave device according to claim 1, wherein the acoustic velocity of the acoustic wave in the piezoelectric substrate in the first region is substantially equal to the acoustic velocity of the acoustic wave in the piezoelectric substrate in the second region.

4. A filter comprising:
the acoustic wave device according to claim 1.

5. A multiplexer comprising:
the filter according to claim 4.

6. The acoustic wave device according to claim 1, wherein the piezoelectric substrate is a rotated Y-cut lithium niobate substrate.

7. The acoustic wave device according to claim 1, further comprising:
a first additional film provided in the first region; and
a second additional film provided in the second region.

8. The acoustic wave device according to claim 1, wherein the piezoelectric substrate is an X-cut lithium tantalate substrate.

9. An acoustic wave device comprising:
a piezoelectric substrate that is a rotated Y-cut lithium niobate substrate;
a pair of electrodes sandwiching the piezoelectric substrate and exciting a thickness shear vibration in the piezoelectric substrate;
an additional film that surrounds a center region of a resonance region and is located in an edge portion of the resonance region, the resonance region being a region where the pair of electrodes faces each other across at least a part of the piezoelectric substrate;
a first region that is a part of the additional film and is located on both sides of the center region in a first direction that is an X direction that is obtained when Euler angles are (0°±5°, 75°±5°, 0°±5°); and
a second region that is a part of the additional film and is located on both sides of the center region in a second direction that is an X direction that is obtained when Euler angles are (90°±5°, 75°±5°, 0°±5°), a width in the second direction of the second region being less than a width in the first direction of the first region.

10. An acoustic wave device comprising:
a piezoelectric substrate that is an X-cut lithium tantalate substrate;
a pair of electrodes sandwiching the piezoelectric substrate and exciting a thickness shear vibration in the piezoelectric substrate;
an additional film that surrounds a center region of a resonance region and is located in an edge portion of the resonance region, the resonance region being a region where the pair of electrodes faces each other across at least a part of the piezoelectric substrate;
a first region that is a part of the additional film and is located on both sides of the center region in a first direction that is an X direction that is obtained when Euler angles are (90°±5°, 90°±5°, 132°±5°); and
a second region that is a part of the additional film and is located on both sides of the center region in a second direction that is an X direction that is obtained when Euler angles are (90°±5°, 90°±5°, 42°±5°), a width in the second direction of the second region being less than a width in the first direction of the first region.

11. An acoustic wave device comprising:
a piezoelectric substrate;
a pair of electrodes sandwiching the piezoelectric substrate and exciting a thickness shear vibration in the piezoelectric substrate;
an edge region that is a region surrounding a center region of a resonance region and is in an edge portion of the resonance region, the resonance region being a region where the pair of electrodes faces each other across at least a part of the piezoelectric substrate;
a first region that is a part of the edge region and is located on both sides of the center region in a first direction that is substantially parallel to a displacement direction of a thickness shear vibration that is a primary mode in the piezoelectric substrate, an acoustic velocity of an acoustic wave in the piezoelectric substrate in the first region being less than an acoustic velocity of an acoustic wave in the piezoelectric substrate in the center region; and
a second region that is a part of the edge region and is located on both sides of the center region in a second direction substantially perpendicular to the first direction, an acoustic velocity of an acoustic wave in the piezoelectric substrate in the second region being less than the acoustic velocity of the acoustic wave in the piezoelectric substrate in the center region and being different from the acoustic velocity of the acoustic wave in the piezoelectric substrate in the first region.

12. The acoustic wave device according to claim 11, wherein
the acoustic velocity of the acoustic wave in the piezoelectric substrate in the second region is greater than the acoustic velocity of the acoustic wave in the piezoelectric substrate in the first region.

13. The acoustic wave device according to claim 11, wherein
a width in the first direction of the first region is substantially equal to a width in the second direction of the second region.

14. An acoustic wave device comprising:
a piezoelectric substrate;
a pair of electrodes sandwiching the piezoelectric substrate and exciting a thickness shear vibration in the piezoelectric substrate; and
an additional film that is not provided in a center region of a resonance region and is provided from at least a part of an edge region surrounding the center region to an outside of the resonance region, the resonance region being a region where the pair of electrodes overlaps in plan view while sandwiching at least a part of the piezoelectric substrate,
wherein the additional film is provided from edge regions located in both ends of the resonance region in a first direction of planar directions of the piezoelectric substrate to the outside of the resonance region, and is not located in edge regions located in both ends of the resonance region in a second direction intersecting with the first direction among the planar directions.

15. The acoustic wave device according to claim 14, wherein
the additional film is provided on an opposite side of at least one of the pair of electrodes from the piezoelectric substrate.

16. The acoustic wave device according to claim 15, wherein
the additional film includes a first additional film provided in one of the both ends and a second additional film provided in another of the both ends,
the first additional film is in contact with the at least one of the pair of electrodes in the resonance region, and is in contact with the piezoelectric substrate in the outside of the resonance region, and
the second additional film is located in contact with the at least one of the pair of electrodes in the resonance region, and is in contact with the at least one of the pair of electrodes in the outside of the resonance region.

17. The acoustic wave device according to claim 14, wherein
a thickness of the additional film is less than a thickness of a virtual film that most reduces lateral-mode spurious under an assumption that the virtual film having a width identical to a width of the additional film in the resonance region and being made of a material identical to a material of the additional film is provided in the edge region and is not provided in the center region or the outside of the resonance region.

18. The acoustic wave device according to claim 14, wherein
a planar shape of the resonance region is rectangular,
a first side and a second side among four sides of the rectangular resonance region extend substantially in a direction of the thickness shear vibration,
the additional film includes a first additional film and a second additional film, the first additional films is provided from a first edge region located adjacent to the first side to the outside of the resonance region, and the second additional film is provided from a second edge region located adjacent to the second side to the outside of the resonance region.

19. The acoustic wave device according to claim 14, wherein
the additional film overlaps in plan view with an entire boundary between an edge region surrounding the center region and the outside of the resonance region.

* * * * *